United States Patent
Shigematsu et al.

(10) Patent No.: US 8,298,746 B2
(45) Date of Patent: Oct. 30, 2012

(54) CHEMICALLY AMPLIFIED POSITIVE RESIST COMPOSITION

(75) Inventors: Junji Shigematsu, Ibaraki (JP); Kunishige Edamatsu, Toyonaka (JP); Takayuki Miyagawa, Toyonaka (JP); Akira Kamabuchi, Kobe (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 12/490,828

(22) Filed: Jun. 24, 2009

(65) Prior Publication Data

US 2010/0010129 A1   Jan. 14, 2010

(30) Foreign Application Priority Data

Jun. 27, 2008  (JP) ................. 2008-169019

(51) Int. Cl.
*G03C 1/00* (2006.01)
*G03F 7/00* (2006.01)
*G03F 7/039* (2006.01)

(52) U.S. Cl. ............ 430/270.1; 430/326; 430/907; 430/910; 430/921; 430/925; 524/158

(58) Field of Classification Search ............ 524/158; 430/270.1, 326, 907, 910, 921, 925
See application file for complete search history.

(56) References Cited

U.S. PATENT DOCUMENTS

| | | |
|---|---|---|
| 2006/0246373 A1 | 11/2006 | Wang |
| 2007/0218401 A1* | 9/2007 | Ando et al. ............ 430/270.1 |
| 2007/0254235 A1 | 11/2007 | Allen et al. |
| 2009/0263742 A1 | 10/2009 | Fuji et al. |
| 2009/0269695 A1 | 10/2009 | Fuji et al. |

* cited by examiner

*Primary Examiner* — James J Seidleck
*Assistant Examiner* — Deve E Valdez
(74) *Attorney, Agent, or Firm* — Birch, Stewart, Kolasch & Birch, LLP

(57) ABSTRACT

The present invention provides a chemically amplified resist composition comprising:
a resin (A) which itself is insoluble or poorly soluble in an aqueous alkali solution but becomes soluble in an aqueous alkali solution by the action of an acid and which comprises a structural unit having an acid-labile group in a side chain and a structural unit represented by the formula (I):

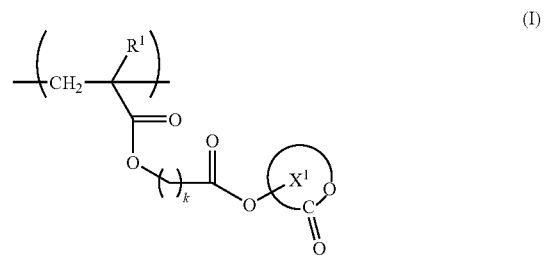

wherein $R^1$ represents a hydrogen atom or a methyl group, ring $X^1$ represents an unsubstituted or substituted C3-C30 cyclic hydrocarbon group having —COO— and k represents an integer of 1 to 4,
a resin (B) which comprises a structural unit represented by the formula (II):

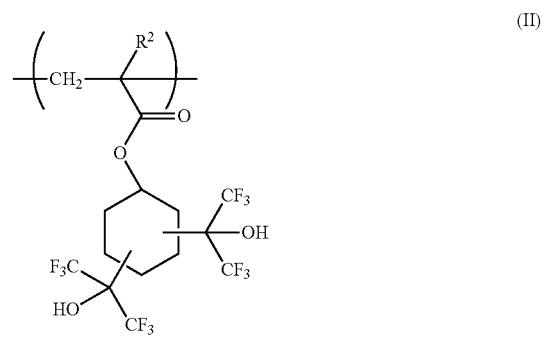

wherein $R^2$ represents a hydrogen atom, a methyl group or a trifluoromethyl group, and
an acid generator.

3 Claims, No Drawings

CHEMICALLY AMPLIFIED POSITIVE RESIST COMPOSITION

This nonprovisional application claims priority under 35 U.S.C. §119(a) on Patent Application No. 2008-169019 filed in JAPAN on Jun. 27, 2008, the entire contents of which are hereby incorporated by reference.

FIELD OF THE INVENTION

The present invention relates to a chemically amplified positive resist composition.

BACKGROUND OF THE INVENTION

A chemically amplified positive resist composition is used for semiconductor microfabrication.

US 2007/0218401 A1 discloses a resist composition comprising two resins and an acid generator wherein one resin has a structural unit having an acid-labile group and a structural unit having a fluorine-containing group in a side chain, and other resin has a structural unit having a fluorine-containing group in a side chain in addition to at least one structural unit selected from the group consisting of a structural unit having an acid-labile group, a structural unit having a hydroxyl group in a side chain and a structural unit having a lactone structure in a side chain.

US 2007/0254235 A1 discloses a resist composition comprising a resin, an acid-generator and a polymer having a structural unit having a fluoroalkyl group.

SUMMARY OF THE INVENTION

The present invention is to provide a novel chemically amplified positive resist composition.

The present invention relates to the followings:

<1> A chemically amplified positive resist composition comprising: a resin (A) which itself is insoluble or poorly soluble in an aqueous alkali solution but becomes soluble in an aqueous alkali solution by the action of an acid and which comprises a structural unit having an acid-labile group in a side chain and a structural unit represented by the formula (I):

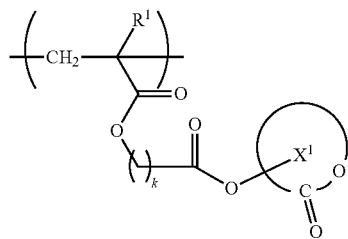

wherein $R^1$ represents a hydrogen atom or a methyl group, ring $X^1$ represents an unsubstituted or substituted C3-C30 cyclic hydrocarbon group having —COO— and k represents an integer of 1 to 4, a resin (B) which comprises a structural unit represented by the formula (II):

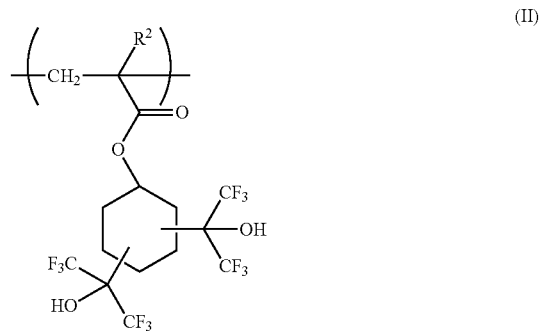

wherein $R^2$ represents a hydrogen atom, a methyl group or a trifluoromethyl group, and an acid generator;

<2> The chemically amplified positive resist composition according to <1>, wherein the resin (B) further contains at least one structural unit selected from the group consisting of a structural unit represented by the formula (VIII):

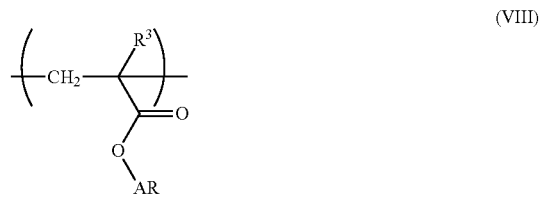

wherein $R^3$ represents a hydrogen atom, a methyl group or a trifluoromethyl group, and AR represents a fluorine-containing C1-C30 hydrocarbon group which may have one or more hydroxyl groups and one or more methylene group in the hydrocarbon group may be replaced by a heteroatom selected from the group consisting of a oxygen atom, a nitrogen atom and a sulfur atom, with the proviso that the above-mentioned structural unit represented by the formula (VIII) is not the same as the structural unit represented by the formula (II), a structural unit represented by the formula (IX):

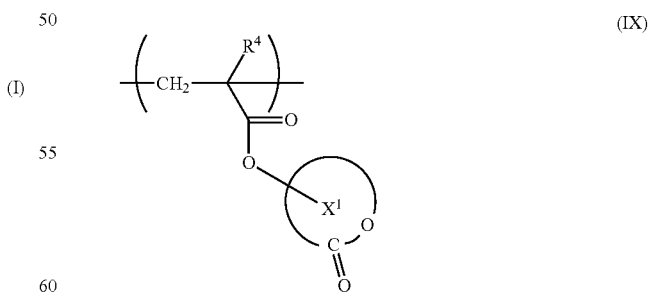

wherein $R^4$ represents a hydrogen atom or a methyl group, ring $X^2$ represents an unsubstituted or substituted C3-C30 cyclic hydrocarbon group having —COO—, and a structural unit represented by the formula (I) described in <1>;

<3> The chemically amplified positive resist composition according to <1> or <2>, wherein the amount of the resin (B) is 0.1 to 20 parts by weight relative to 100 parts by weight of the resin (A);

<4> The chemically amplified positive resist composition according to <1>, <2> or <3>, wherein the acid generator is a salt represented by the formula (V):

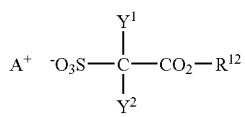
(V)

wherein $R^{12}$ represents a C1-C30 hydrocarbon group which may be substituted with at least one group consisting of a C1-C6 alkoxy group, a C1-C4 perfluoroalkyl group, a C1-C6 hydroxyalkyl group, a hydroxyl group and a cyano group, and at least one methylene group may be replaced by —CO— or —O—, $A^+$ represents an organic counter ion, and $Y^1$ and $Y^2$ each independently represents a fluorine atom or a C1-C6 perfluoroalkyl group.

DESCRIPTION OF PREFERRED EMBODIMENTS

The resin (A) itself is insoluble or poorly soluble in an aqueous alkali solution but becomes soluble in an aqueous alkali solution by the action of an acid.

The resin (A) contains a structural unit having an acid-labile group in a side chain.

The resin (A) may contain two or more kinds of the structural unit having an acid-labile group in a side chain.

The acid-labile group in the structural unit cleaves by an acid generated from the acid generator.

In the present specification, "ester group" means "a structure having ester of carboxylic acid". Specifically, "tert-butyl ester group" is "a structure having tert-butyl ester of carboxylic acid", and may be described as "—COOC(CH$_3$)$_3$".

Examples of the acid-labile group include a structure having ester of carboxylic acid such as an alkyl ester group in which a carbon atom adjacent to the oxygen atom is quaternary carbon atom, an alicyclic ester group in which a carbon atom adjacent to the oxygen atom is quaternary carbon atom, and a lactone ester group in which a carbon atom adjacent to the oxygen atom is quaternary carbon atom. The "quaternary carbon atom" means a "carbon atom joined to four substituents other than hydrogen atom".

Examples of the acid-labile group include an alkyl ester group in which a carbon atom adjacent to the oxygen atom is quaternary carbon atom such as a tert-butyl ester group; an acetal type ester group such as a methoxymethyl ester, an ethoxymethyl ester, a 1-ethoxyethyl ester, a 1-isobutoxyethyl ester, a 1-isopropoxyethyl ester, a 1-ethoxypropoxy ester, a 1-(2-methoxyethoxy)ethyl ester, a 1-(2-acetoxyethoxy)ethyl ester, a 1-[2-(1-adamantyloxy)ethoxy]ethyl ester, a 1-[2-(1-adamantanecarbonyloxy)ethoxy]ethyl ester, a tetrahydro-2-furyl ester and a tetrahydro-2-pyranyl ester group; an alicyclic ester group in which a carbon atom adjacent to the oxygen atom is quaternary carbon atom such as an isobornyl ester, a 1-alkylcycloalkyl ester, a 2-alkyl-2-adamantyl ester, and a 1-(1-adamantyl)-1-alkylalkyl ester group.

As the structural unit having an acid-labile group, a structural unit derived from an optionally substituted acrylic compound is preferable.

In the present specification, "an optionally substituted acrylic compound" means an acrylate, an acrylate of which α-carbon is substituted with a substituent. Examples of the substituent include a C1-C4 alkyl group.

Examples of the optionally substituted acrylic compound include an acrylate, a methacrylate, a 2-ethylpropenoate, a 2-n-propylpropenoate, and a 2-n-butylpropenoate.

Examples of the structural unit having an acid-labile group include a structural unit derived from tert-butyl acrylate, tert-butyl methacrylate, methoxymethyl acrylate, methoxymethyl methacrylate, ethoxymethyl acrylate, ethoxymethyl methacrylate, 1-ethoxyethyl acrylate, 1-ethoxyethyl methacrylate, 1-isobutoxyethyl acrylate, 1-isobutoxyethyl methacrylate, 1-isopropoxyethyl acrylate, 1-isopropoxyethyl methacrylate, 1-ethoxypropoxy acrylate, 1-ethoxypropoxy methacrylate, 1-(2-methoxyethoxy)ethyl acrylate, 1-(2-methoxyethoxy)ethyl methacrylate, 1-(2-acetoxyethoxy)ethyl acrylate, 1-(2-acetoxyethoxy)ethyl methacrylate, 1-[2-(1-adamantyloxy)ethoxy]ethyl acrylate, 1-[2-(1-adamantyloxy)ethoxy]ethyl methacrylate, 1-[2-(1-adamantanecarbonyloxy)ethoxy]ethyl acrylate, 1-[2-(1-adamantanecarbonyloxy)ethoxy]ethyl methacrylate, tetrahydro-2-furyl acrylate, tetrahydro-2-furyl methacrylate, tetrahydro-2-pyranyl acrylate, tetrahydro-2-pyranyl methacrylate, isobornyl acrylate, isobornyl methacrylate, 1-alkylcycloalkyl acrylate, 1-alkylcycloalkyl methacrylate, 2-alkyl-2-adamantyl acrylate, 2-alkyl-2-adamantyl methacrylate, 1-(1-adamantyl)-1-alkylalkyl acrylate and 1-(1-adamantyl)-1-alkylalkyl methacrylate.

Preferable examples of the structural unit having an acid-labile group include a structural unit represented by the formula (IIIa):

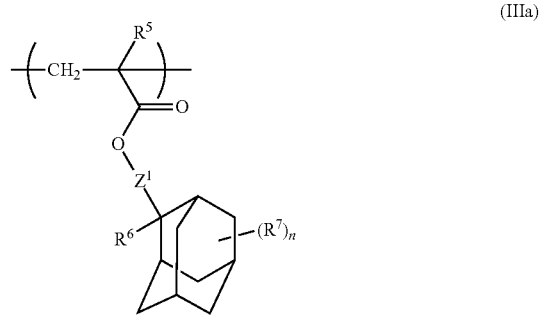
(IIIa)

wherein $R^5$ represents a hydrogen atom or a methyl group, $R^6$ represents a C1-C8 linear or branched chain alkyl group or a C3-C8 cyclic alkyl group, $R^7$ represents a methyl group, n represents an integer of 0 to 14, $Z^1$ represents a single bond or a —(CH$_2$)$_{k'}$—COO— group, and k' represents an integer of 1 to 4 (hereinafter, simply referred to as the structural unit (IIIa)), and a structural unit represented by the formula (IIIb):

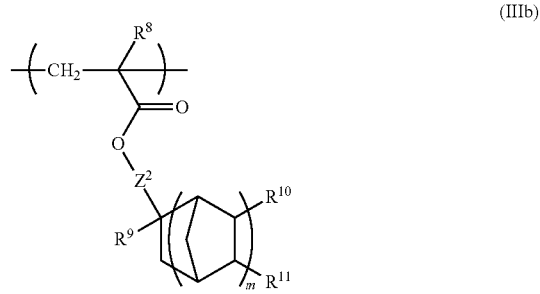
(IIIb)

wherein $R^8$ represents a hydrogen atom or a methyl group, $R^9$ represents a C1-C8 linear or branched chain alkyl group or a C3-C8 cyclic alkyl group, $R^{10}$ and $R^{11}$ each independently represents a hydrogen atom or a monovalent C1-C8 hydrocarbon group which may contain one or more heteroatoms, $R^{10}$ and $R^{11}$ may be bonded each other to form a ring together with the carbon atom to which $R^{10}$ is bonded and the carbon atom to which $R^{11}$ is bonded, or $R^{10}$ and $R^{11}$ may be bonded each other to form a double bond between the carbon atom to which $R^{10}$ is bonded and the carbon atom to which $R^{11}$ is bonded, m represents an integer of 1 to 3, $Z^2$ represents a single bond or a —$(CH_2)_{k''}$—COO— group, and k" represents an integer of 1 to 4 (hereinafter, simply referred to as the structural unit (IIIb)).

Examples of the C1-C8 linear or branched chain alkyl group include a methyl group, an ethyl group, a 1-propyl group, a 1-methylethyl group, a 1-butyl group, a 2-butyl group, a 2-methyl-1-propyl group, a 1-pentyl group, a 2-pentyl group, a 2-methyl-1-butyl group, a 3-pentyl group, a 2,2-dimethyl-1-propyl group, a 3-methyl-1-butyl group, a 1-hexyl group, a 2-hexyl group, a 1-heptyl group, a 4-heptyl group, a 1-octyl group, a 2-octyl group and a 5-methyl-2-heptyl group. Examples of the C3-C8 cyclic alkyl group include a cyclopentyl group, a 2-methylcyclopentyl group, a cyclohexyl group, a 3-methylcyclohexyl group, a 4-methylcyclohexyl group, a 2,3-dimethylcyclohexyl group, a 4,4-dimethylcyclohexyl group and a 5-methyl-bicyclo[2.2.1]hept-2-yl group. Among them, a C1-C3 linear or branched chain alkyl group such as a methyl group, an ethyl group, a 1-propyl group and a 1-methylethyl group is preferable.

Examples of the monovalent C1-C8 hydrocarbon group include a methyl group, an ethyl group, a 1-propyl group, a 1-methylethyl group, a 1-butyl group, a 2-butyl group, a 2-methyl-1-propyl group, a 1-pentyl group, a 2-pentyl group, a 2-methyl-1-butyl group, a 3-pentyl group, a 2,2-dimethyl-1-propyl group, a 3-methyl-1-butyl group, a 1-hexyl group, a 2-hexyl group, a 1-heptyl group, a 4-heptyl group, a 1-octyl group, a 2-octyl group, a 5-methyl-2-heptyl group, a cyclopentyl group, a 2-methylcyclopentyl group, a cyclohexyl group, a 3-methylcyclohexyl group, a 4-methylcyclohexyl group, a 2,3-dimethylcyclohexyl group and a 4,4-dimethylcyclohexyl group.

Examples of the heteroatom include an oxygen atom, a nitrogen atom and a sulfur atom.

Examples of the ring formed by bonding $R^{10}$ and $R^{11}$ each other together with the carbon atom to which $R^{10}$ is bonded and the carbon atom to which $R^{11}$ is bonded include a cyclobutane ring, a cyclopentane ring and a cyclohexane ring.

The structural unit (IIIa) is preferable.

The structural unit (IIIa) is derived from a monomer represented by the following formula:

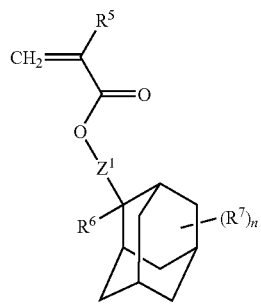

wherein $R^5$, $R^6$, $R^7$, n, and $Z^1$ are the same as defined above.

The structural unit (IIIb) is derived from a monomer represented by the following formula:

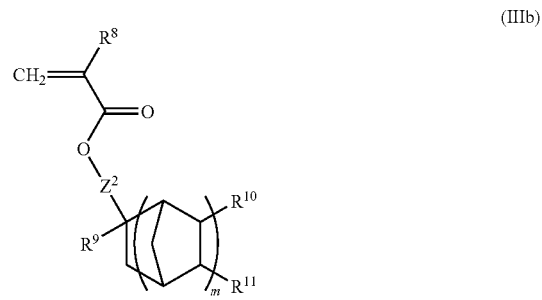

(IIIb)

wherein $R^8$, $R^9$, $R^{10}$, $R^{11}$, m, and $Z^2$ are the same as defined above.

Examples of the monomer represented by the above-mentioned formulae include the followings:

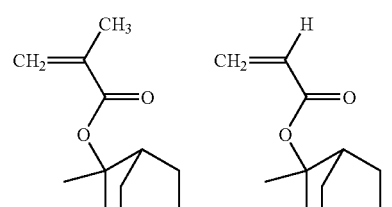

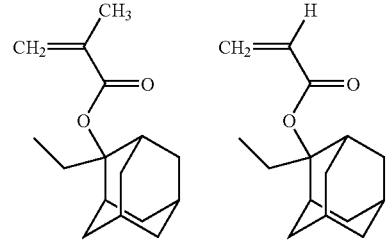

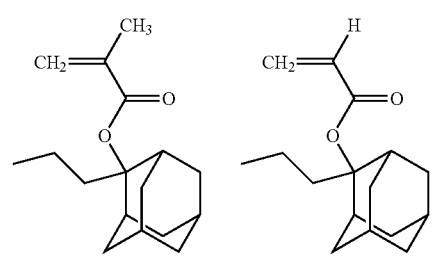

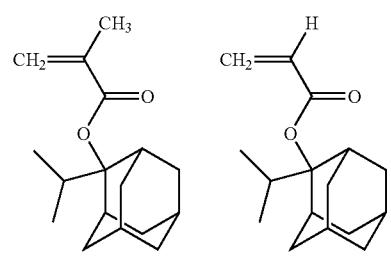

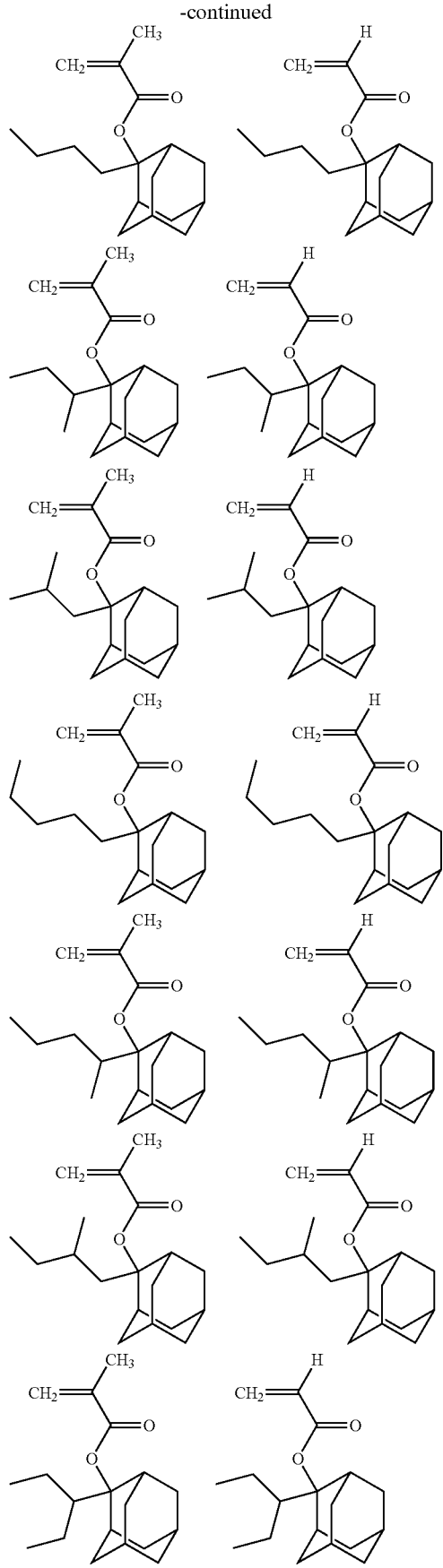
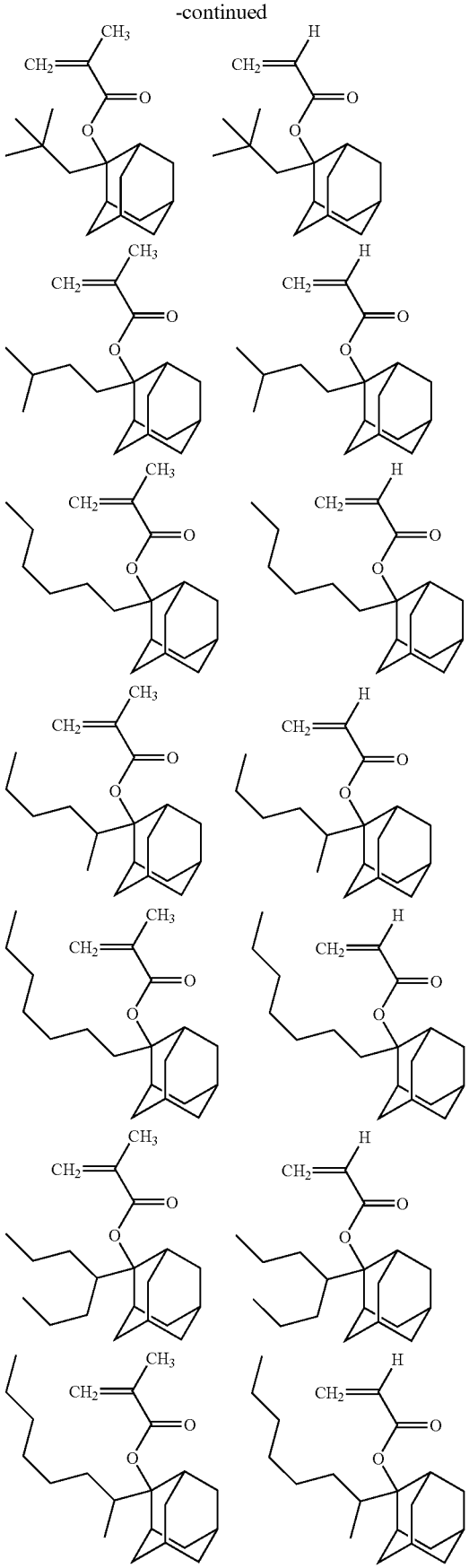

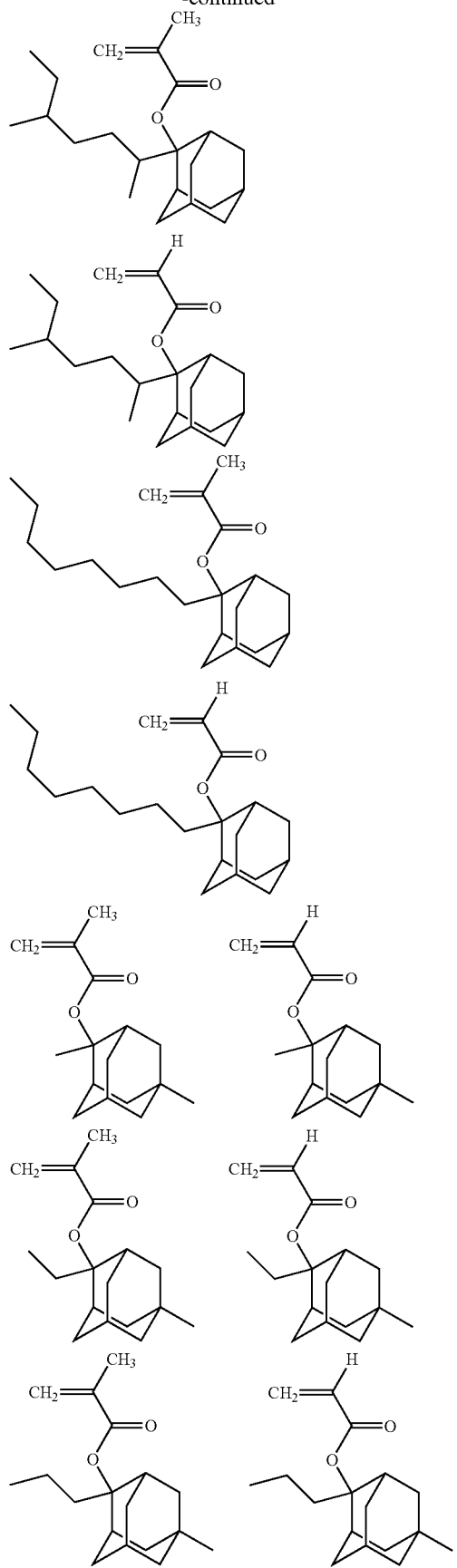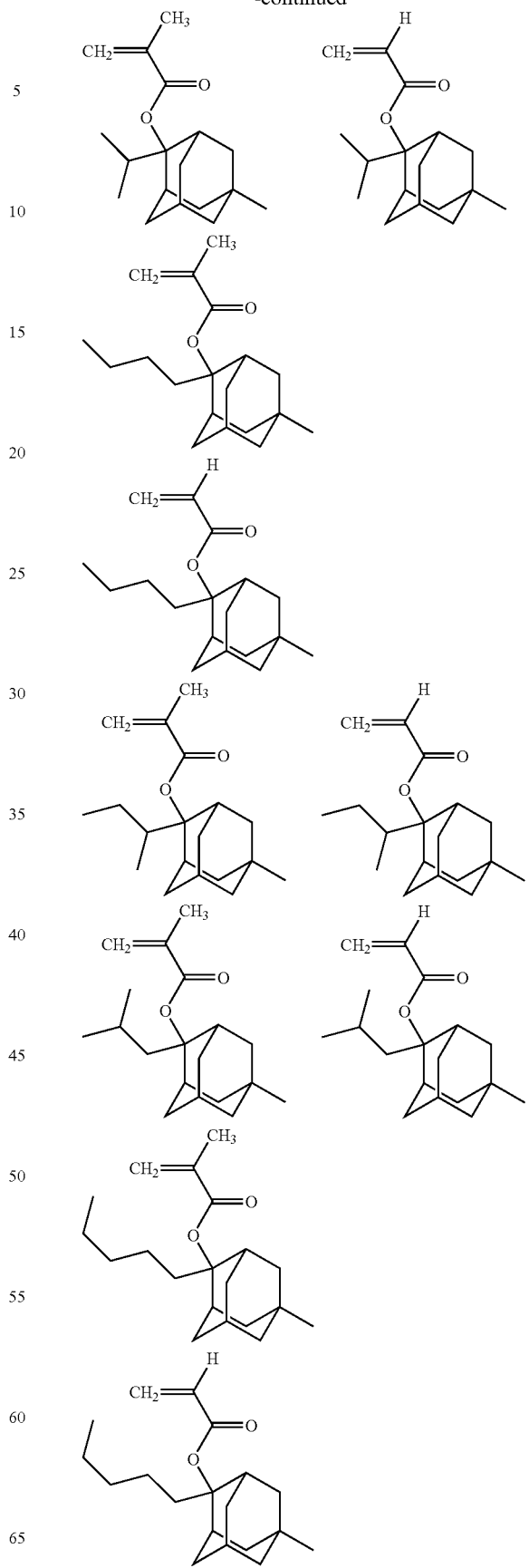

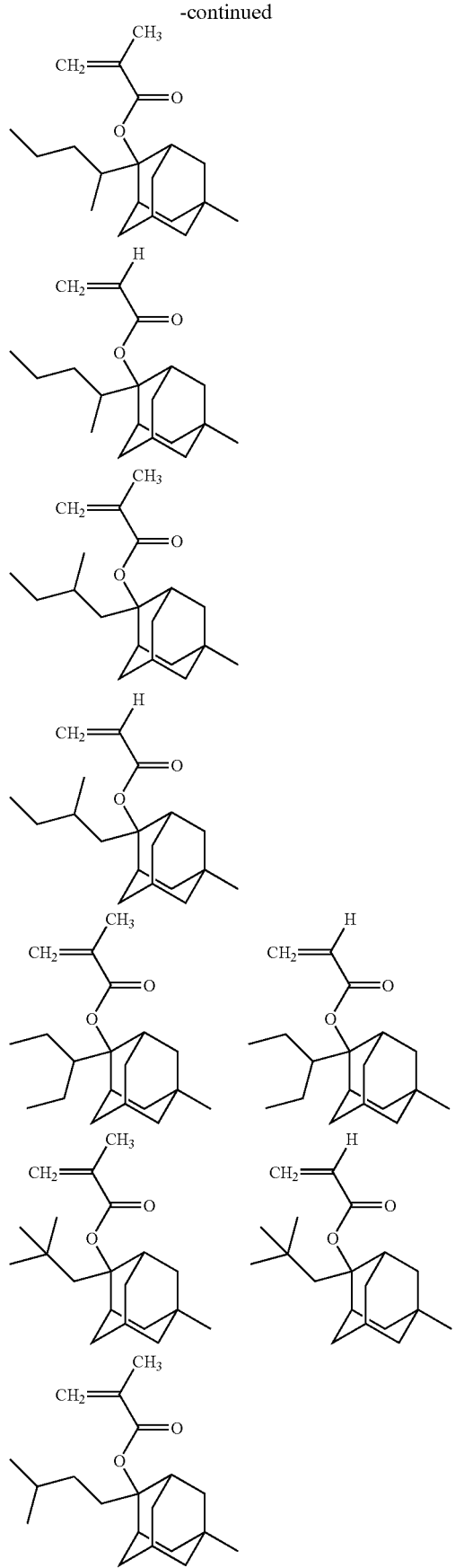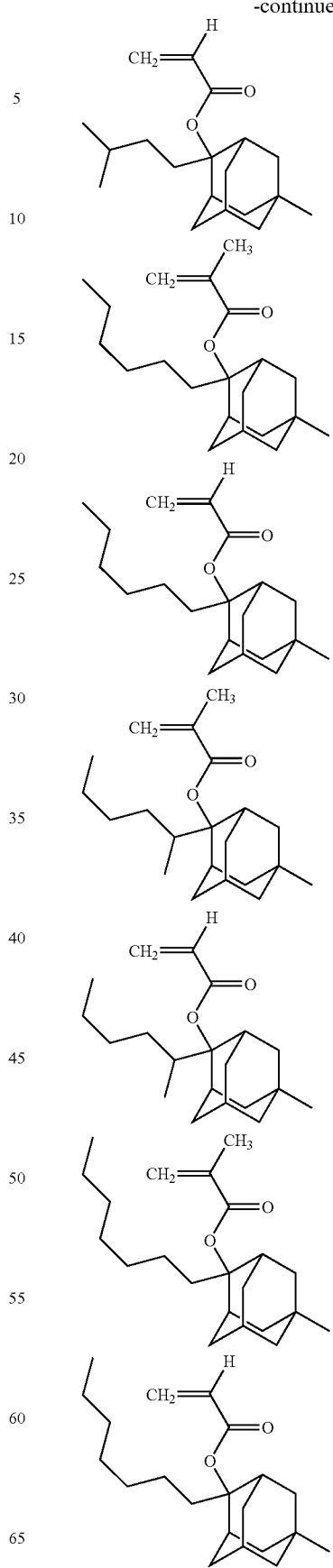

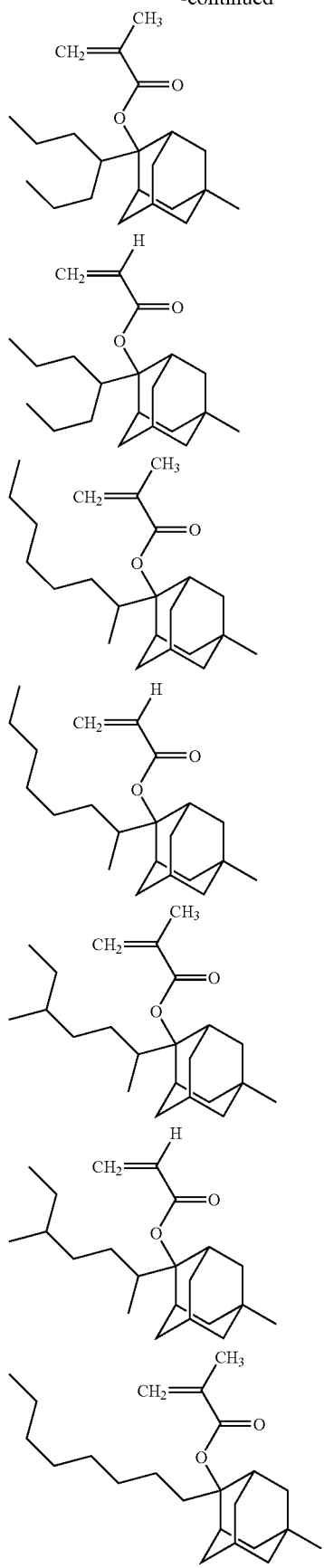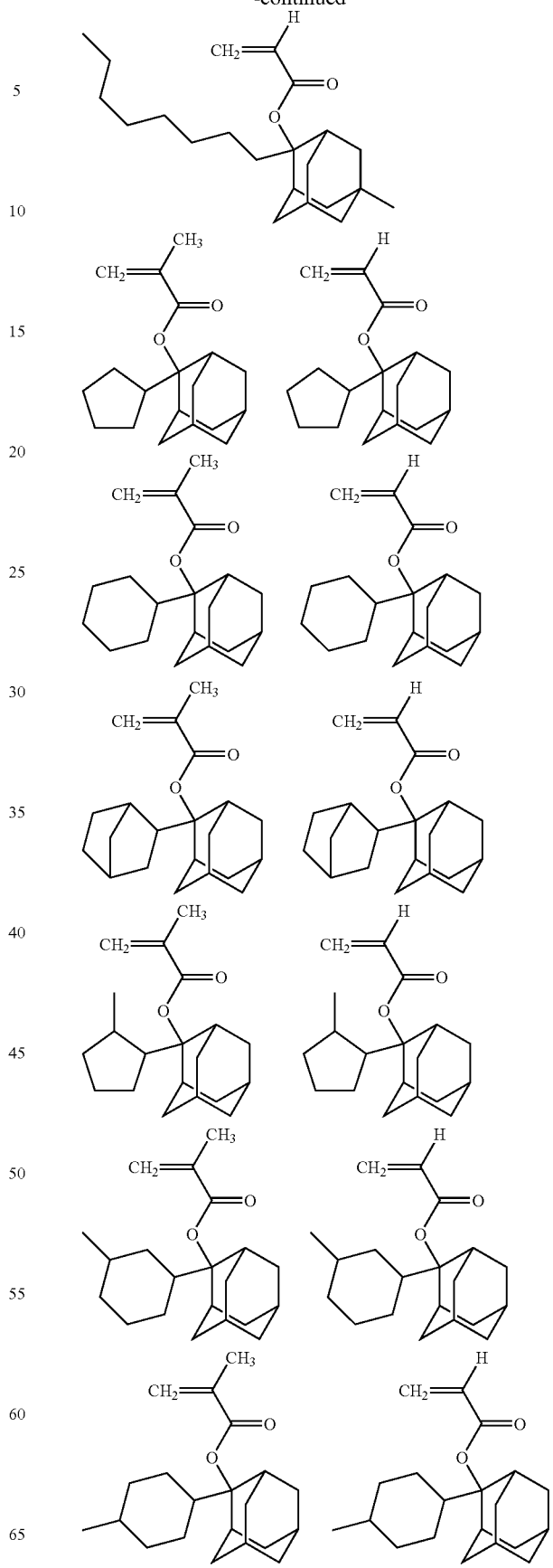

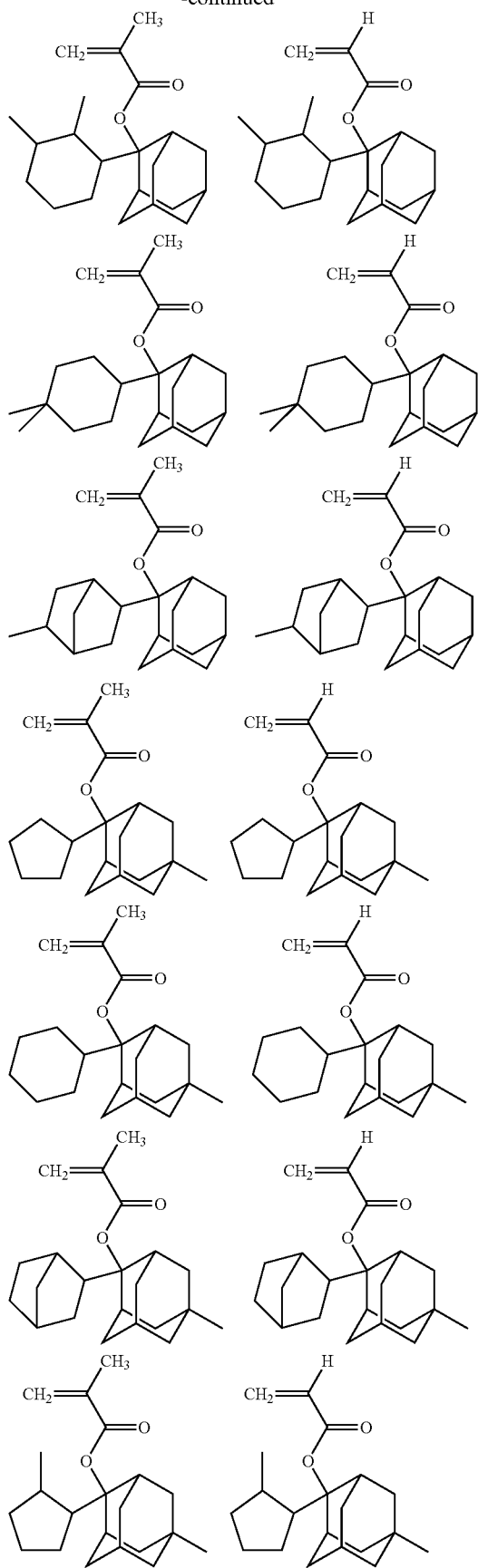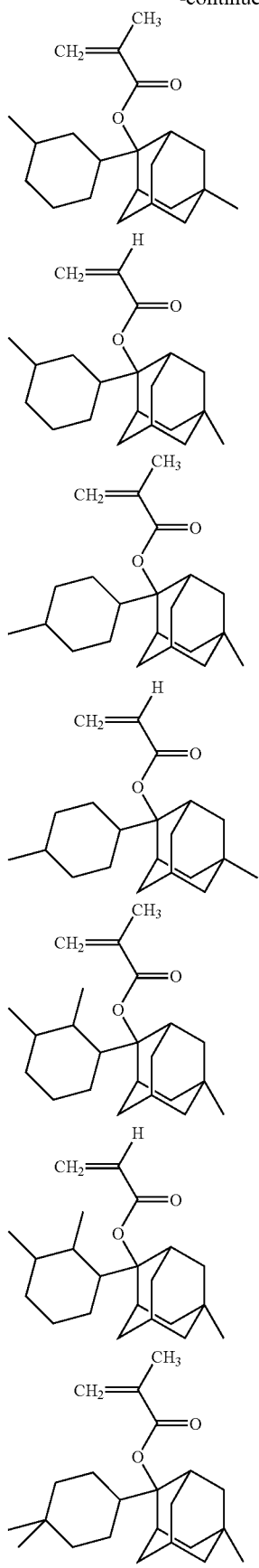

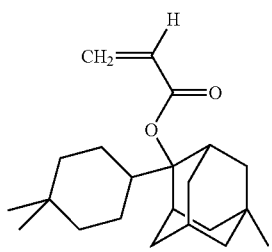
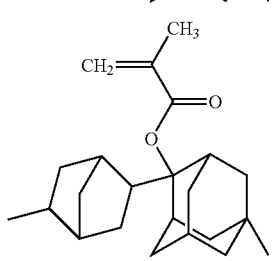
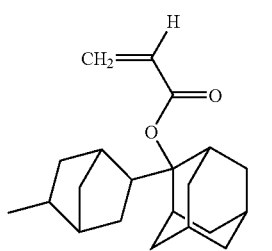
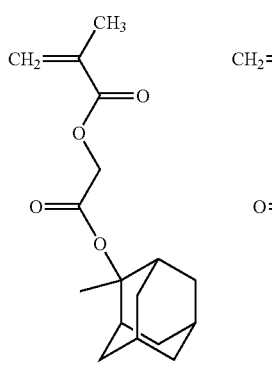
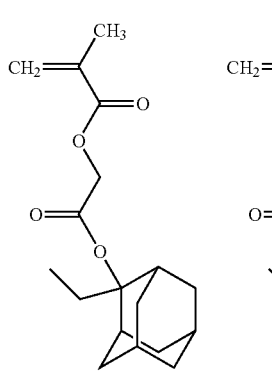
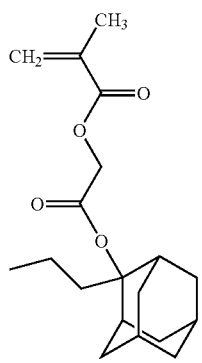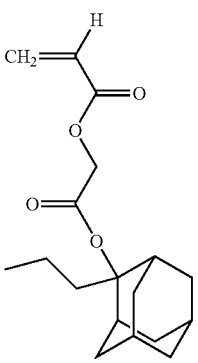
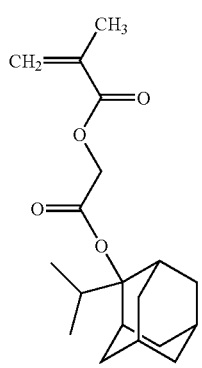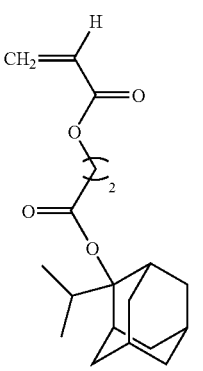
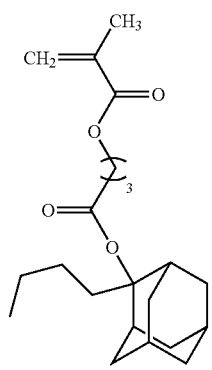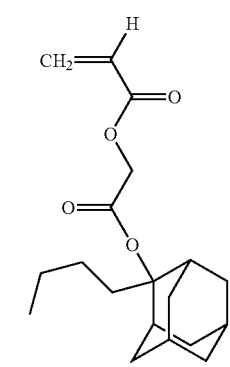
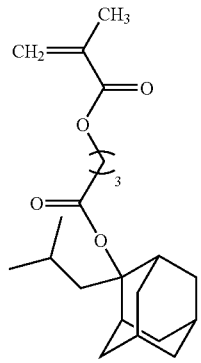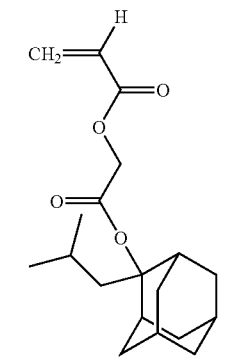

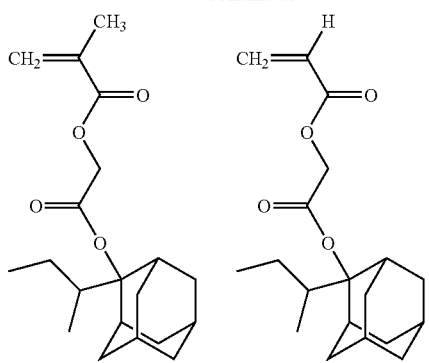
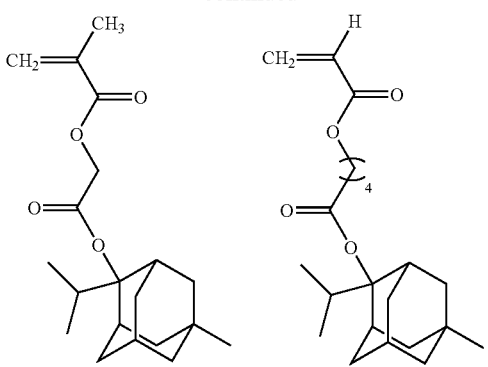
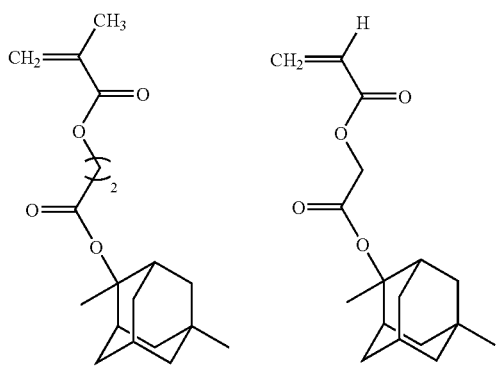
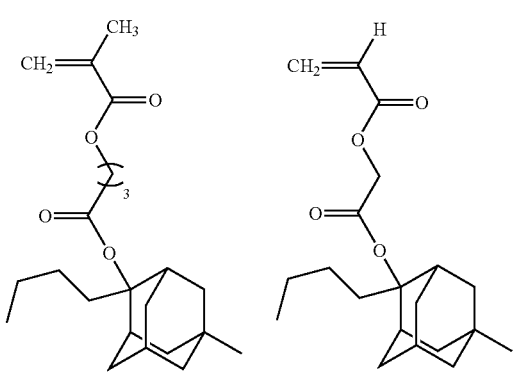
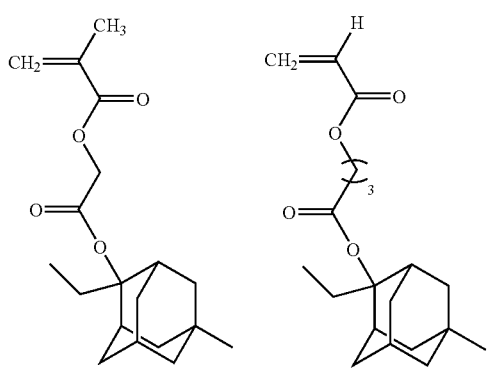
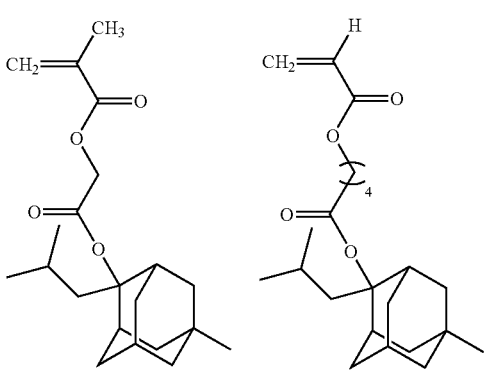

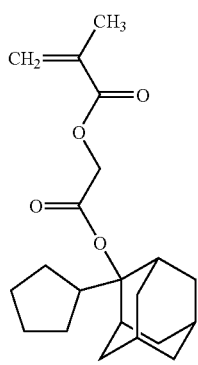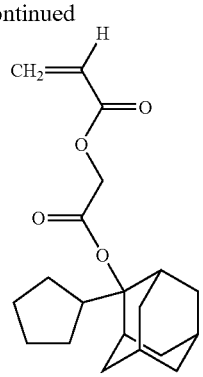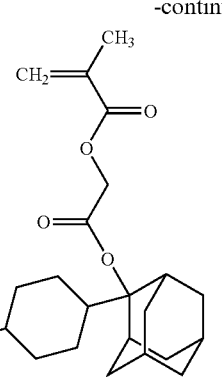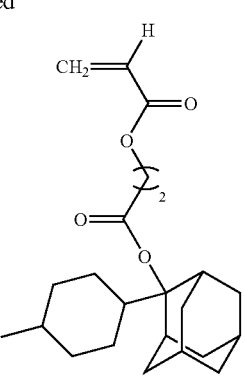
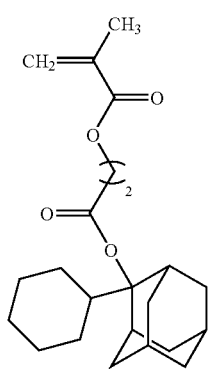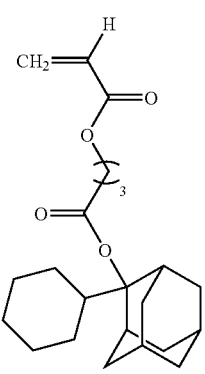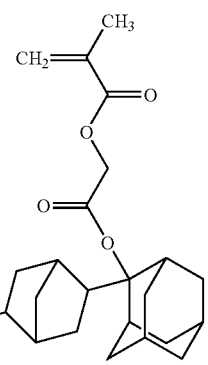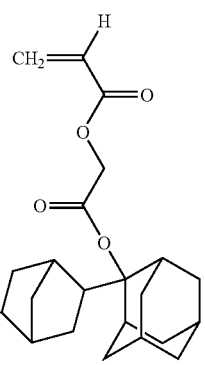
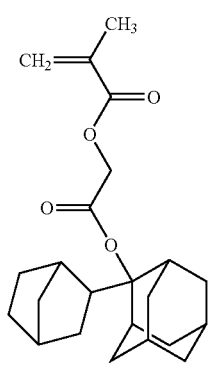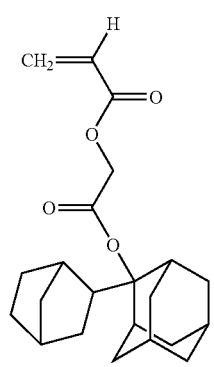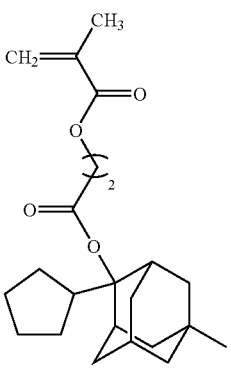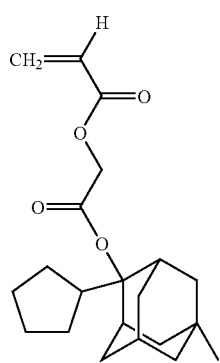
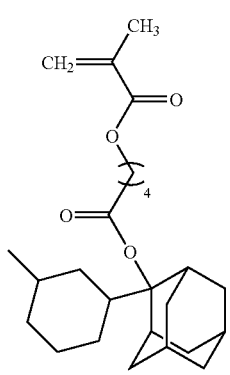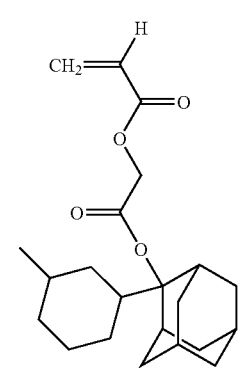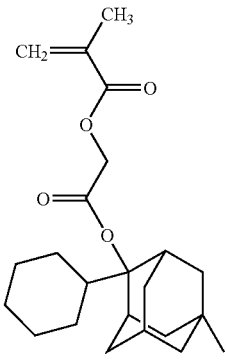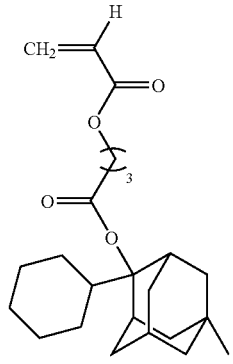

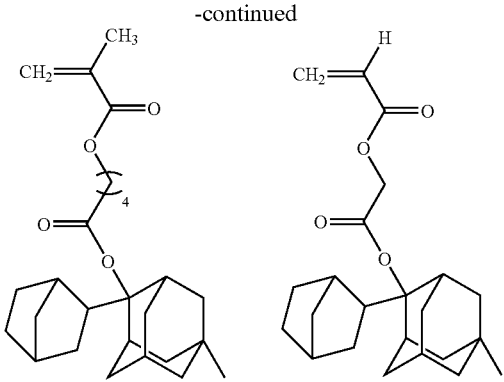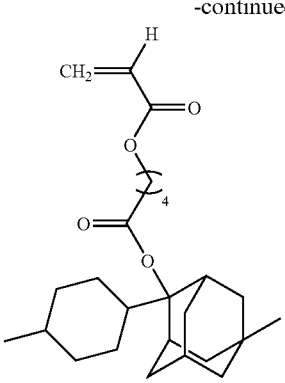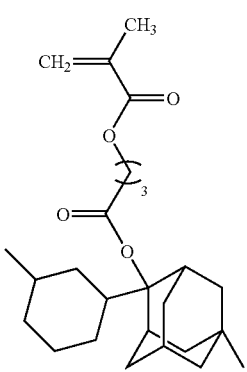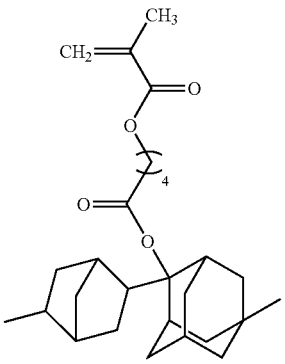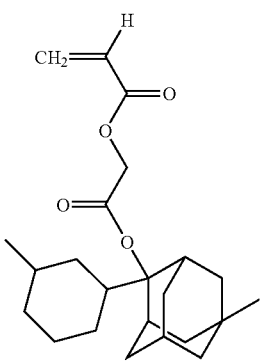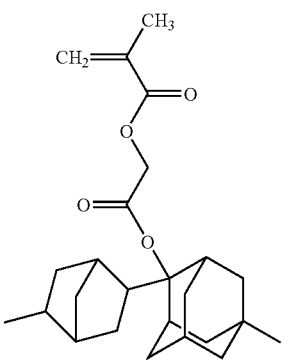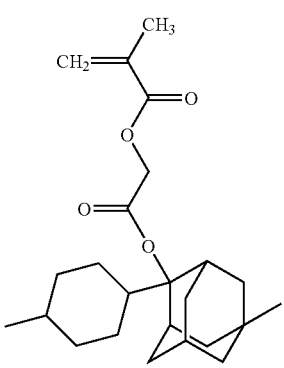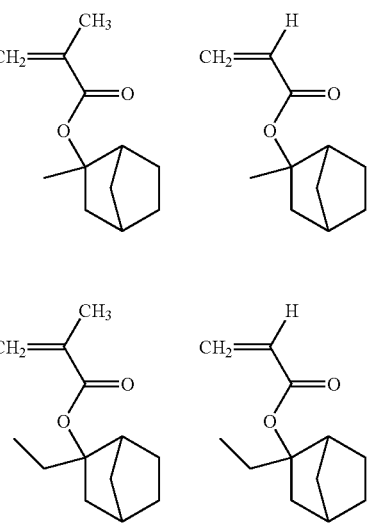

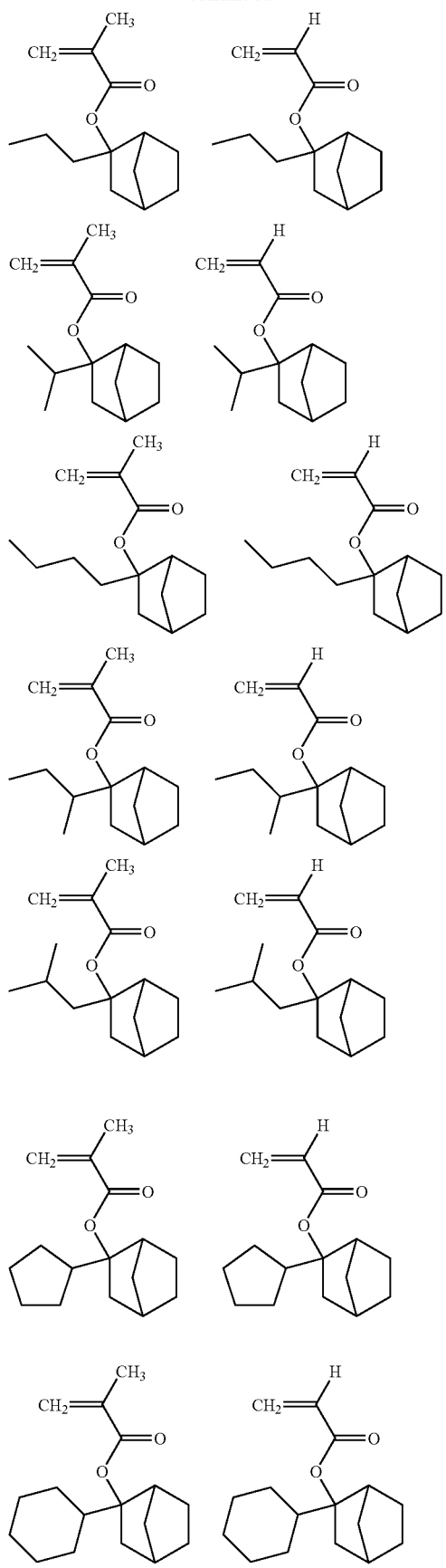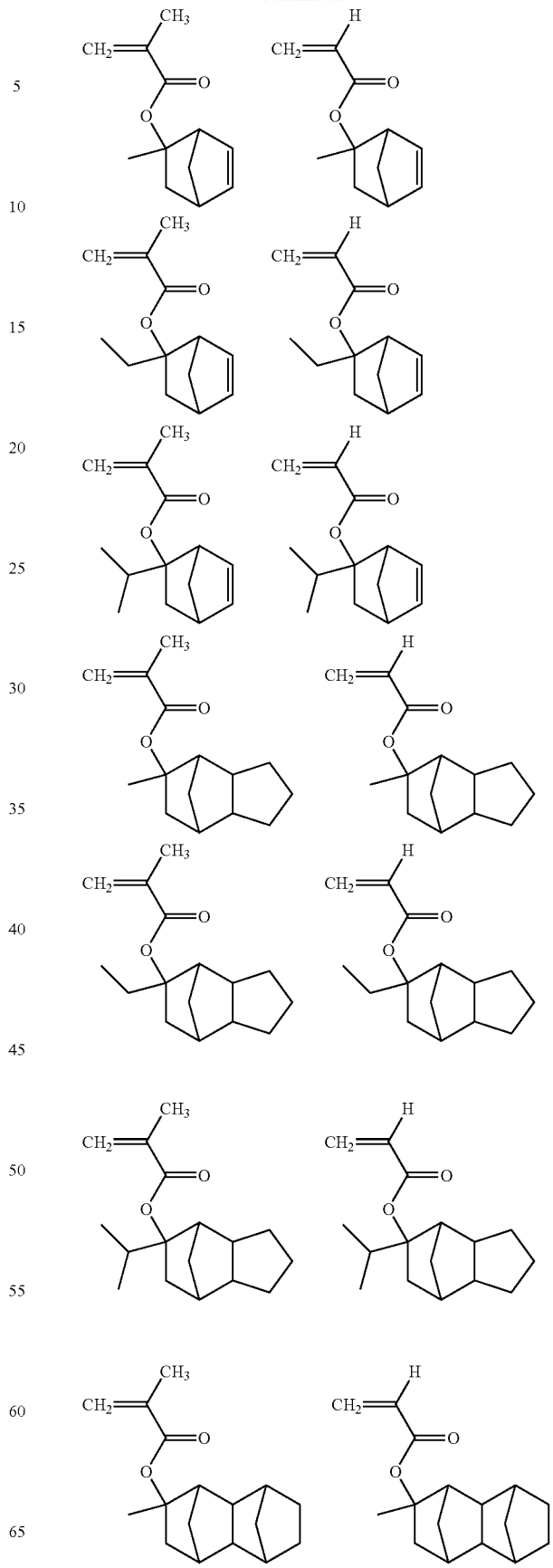

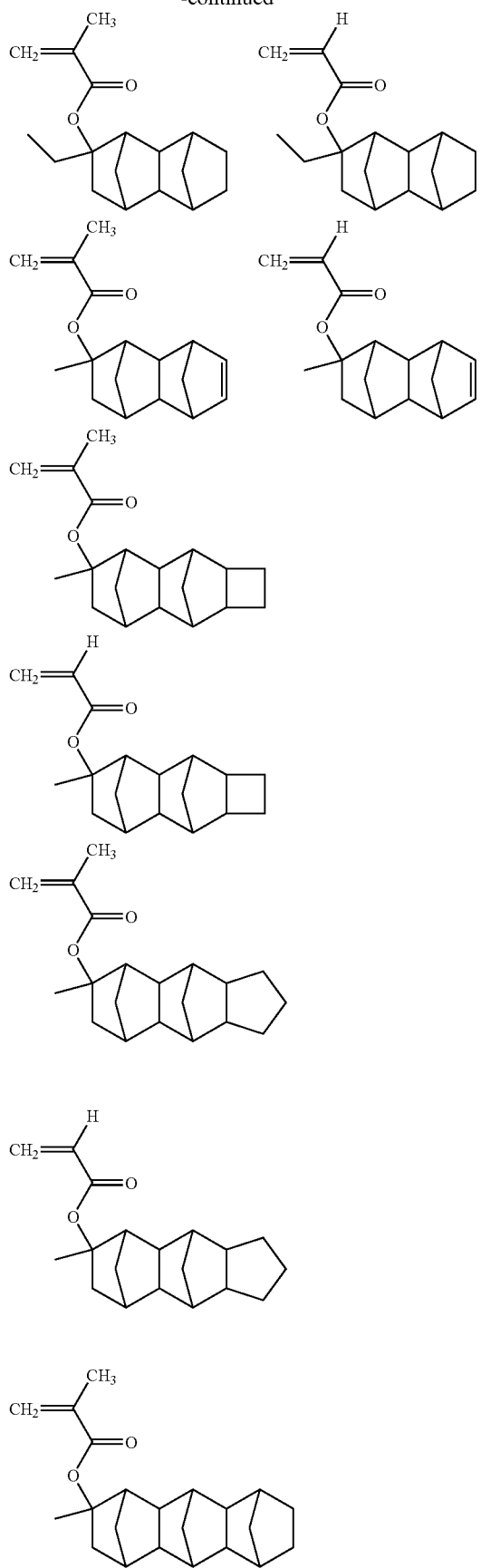
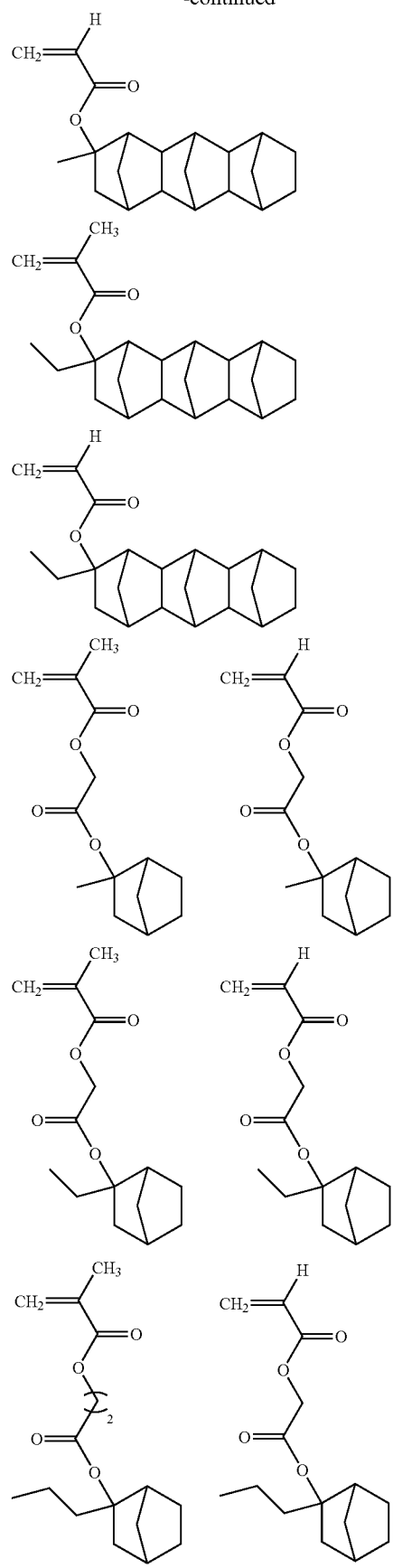

-continued
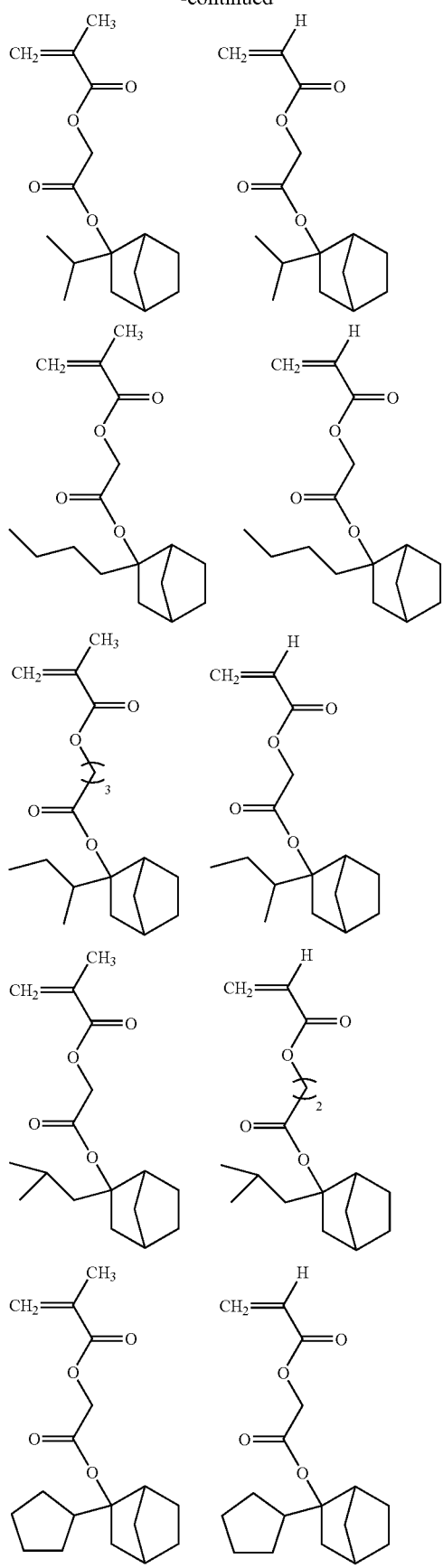
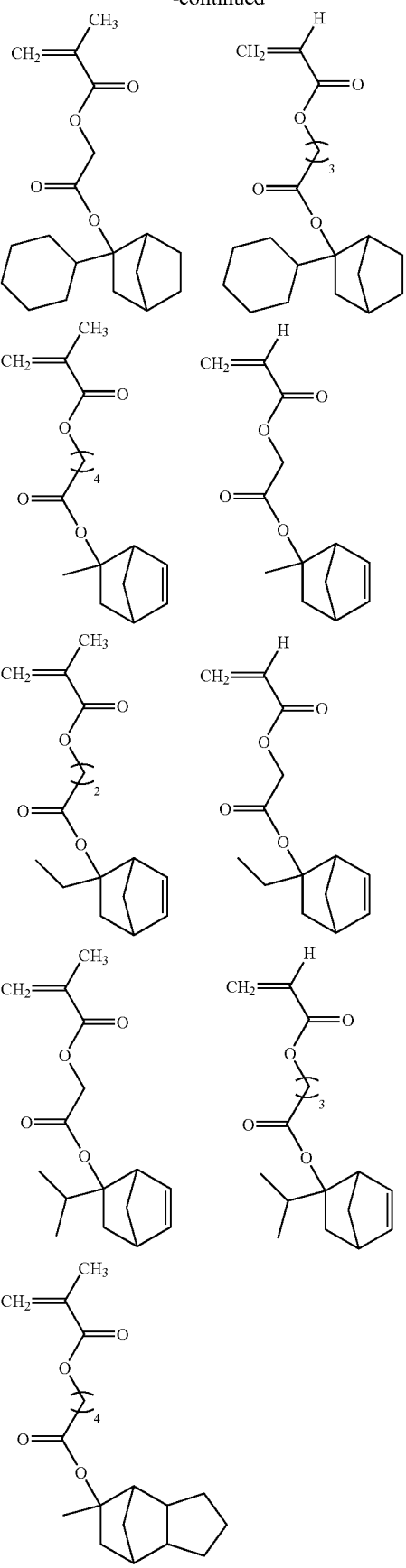

-continued

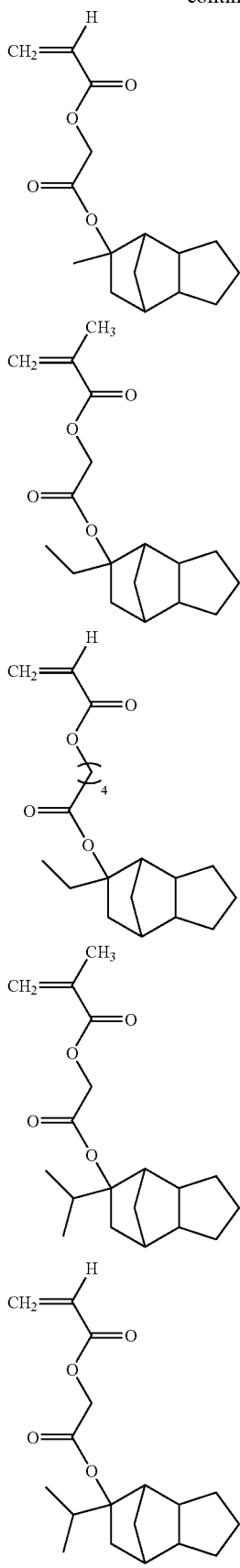

Among these monomers, 2-alkyl-2-adamantyl acrylate, 2-alkyl-2-adamantyl methacrylate, 1-(2-alkyl-2-adamantyloxycarbonyl)alkyl acrylate and 1-(2-alkyl-2-adamantyloxycarbonyl)alkyl methacrylate are preferable since the resin (A) has a strong structure and shows a property that dry etching resistance is excellent. Further, 2-ethyl-2-adamantyl acrylate, 2-ethyl-2-adamantyl methacrylate, 2-isopropyl-2-adamantyl acrylate, 2-isopropyl-2-adamantyl methacrylate and 1-(2-methyl-2-adamantyloxycarbonyl)methyl methacrylate are more preferable since excellent sensitivity and heat resistance are obtained when the resin containing such structural unit is used in the present resist composition.

2-Alkyl-2-adamantyl acrylate can be produced, for example, by reacting 2-alkyl-2-adamantanol or metal salt thereof with an acryloyl halide, and 2-alkyl-2-adamantyl methacrylate can be produced, for example, by reacting 2-alkyl-2-adamantanol or metal salt thereof with a methacryloyl halide.

As the structural unit having an acid-labile group, a structural unit represented by the formula (IIIc):

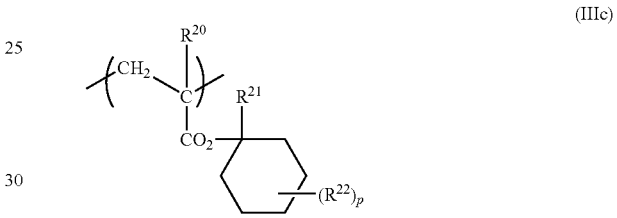

(IIIc)

wherein $R^{20}$ represents a hydrogen atom or a methyl group, $R^{21}$ represents a C1-C8 alkyl group, $R^{22}$ is independently in each occurrence a C1-C8 alkyl group or a C1-C8 alkoxy group and p represents an integer of 0 to 10, and a structural unit represented by the formula (IIId):

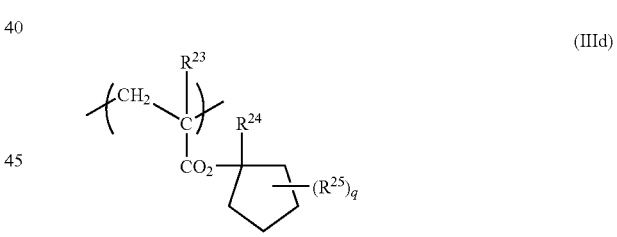

(IIId)

wherein $R^{23}$ represents a hydrogen atom or a methyl group, $R^{24}$ represents a C1-C8 alkyl group, $R^{25}$ is independently in each occurrence a C1-C8 alkyl group or a C1-C8 alkoxy group and q represents an integer of 0 to 8, are listed.

Examples of the C1-C8 alkyl group include a methyl group, an ethyl group, an n-propyl group, an isopropyl group, an n-butyl group, an isobutyl group, a sec-butyl group, a tert-butyl group, an n-pentyl group, an n-hexyl group, an n-heptyl group and an n-octyl group. Examples of the C1-C8 alkoxy group include a methoxy group, an ethoxy group, an n-propoxy group, an isopropoxy group, an n-butoxy group, an isobutoxy group, a sec-butoxy group and a tert-butoxy group.

$R^{21}$ is preferably a C3-C5 alkyl group, and $R^{24}$ is preferably a C3-C5 alkyl group.

Examples of monomers from which the structural units represented by the formulae (IIIc) and (IIId) are derived include the followings.

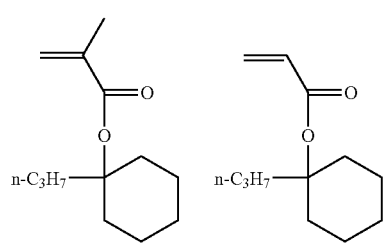
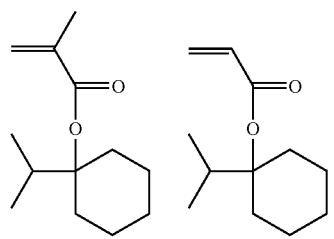
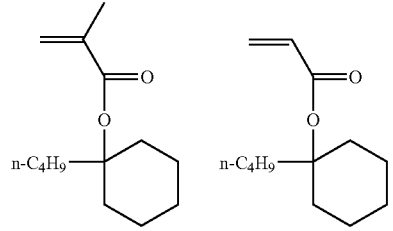
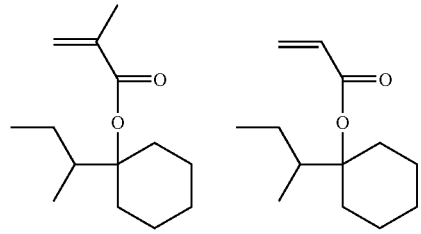
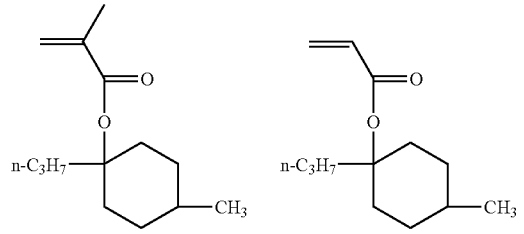
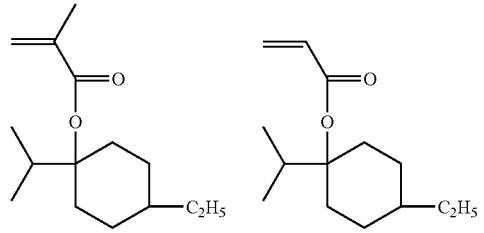
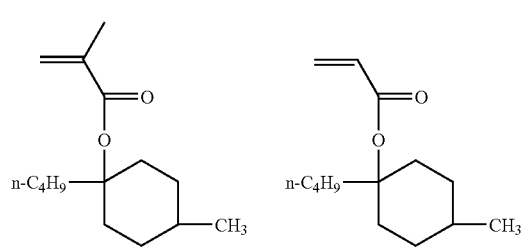
-continued
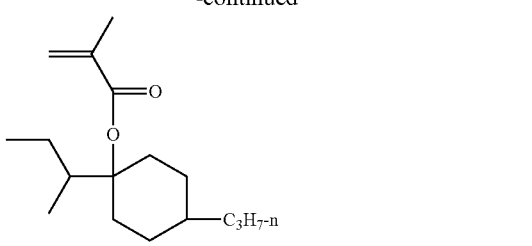
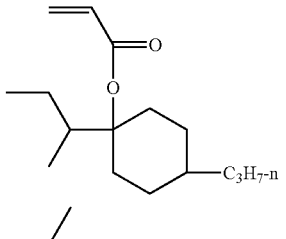
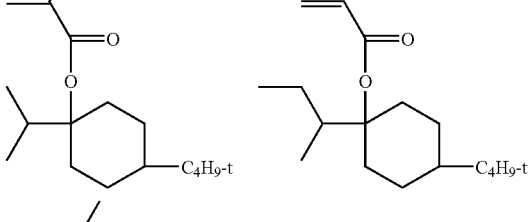
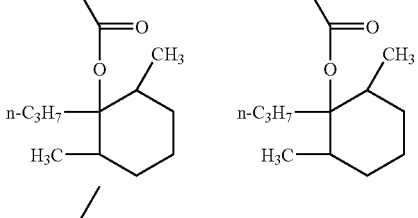
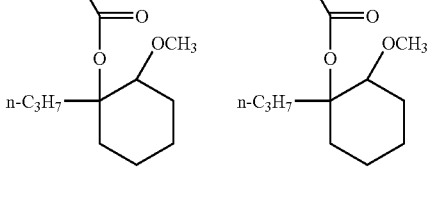
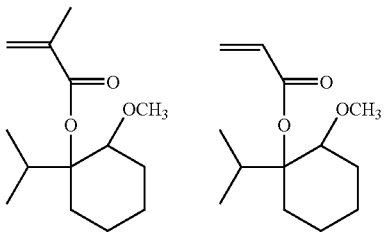
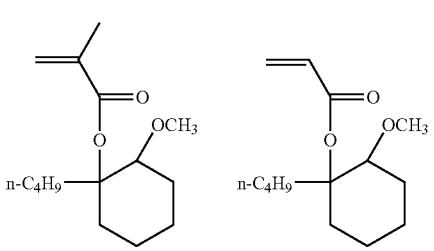

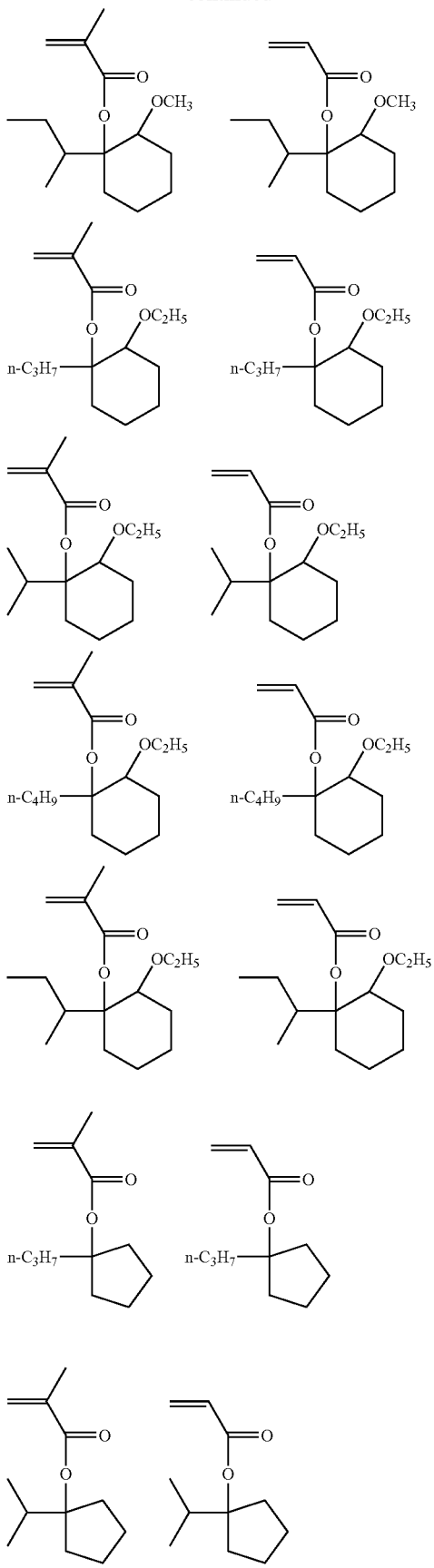
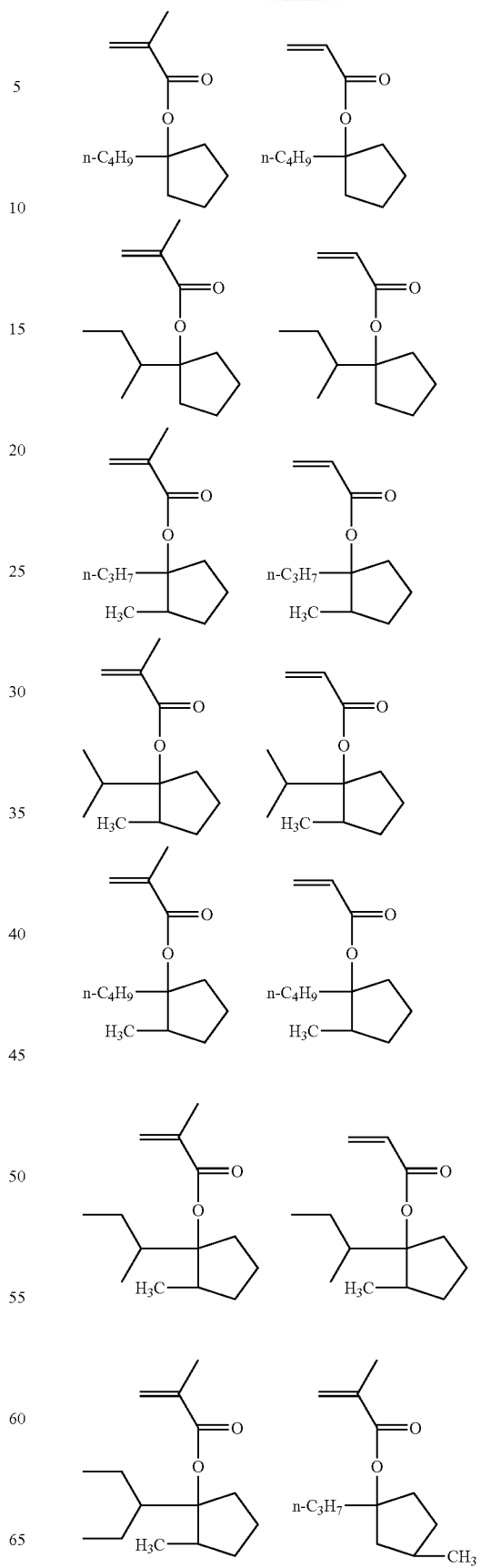

-continued

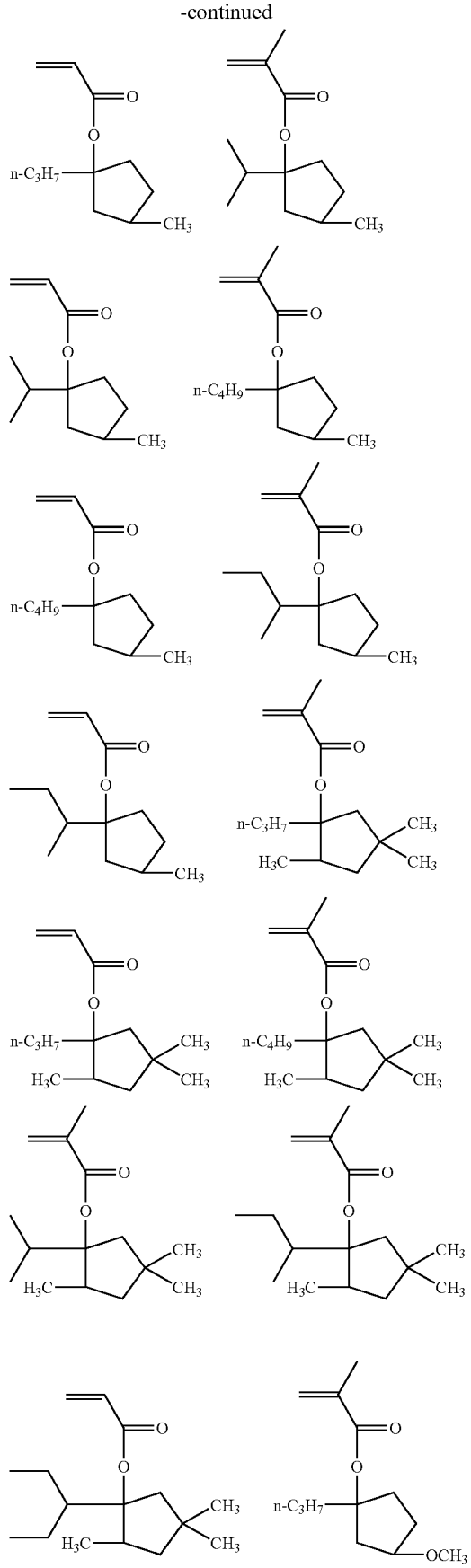

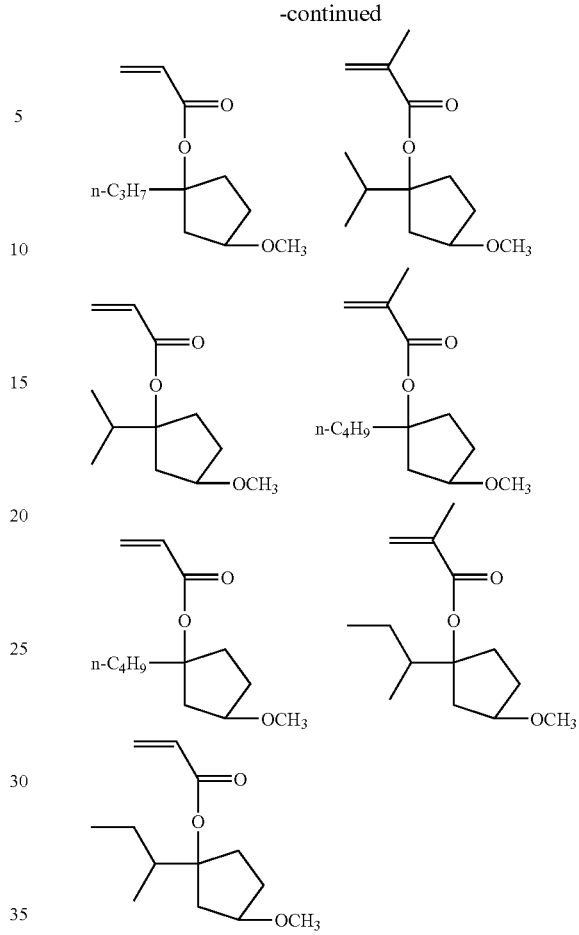

The resin (A) contains a structural unit represented by the formula (I):

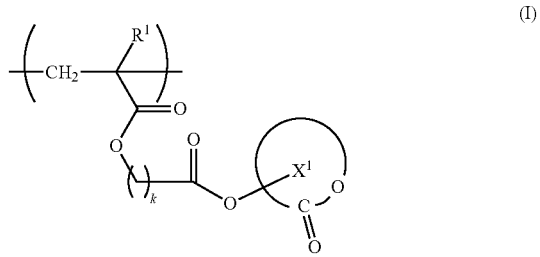

(I)

wherein $R^1$ represents a hydrogen atom or a methyl group, ring $X^1$ represents an unsubstituted or substituted C3-C30 cyclic hydrocarbon group having —COO— and k represents an integer of 1 to 4 (hereinafter, simply referred to as the structural unit (I)) in addition to the structural unit having an acid-labile group.

The cyclic hydrocarbon group having —COO— may be a monocyclic hydrocarbon group and a polycyclic hydrocarbon group. Examples of the substituents of the cyclic hydrocarbon group include a C1-C4 hydrocarbon group, a carboxyl group and a cyano group.

The resin (A) may contain two or more kinds of the structural unit (I).

Examples of the structural unit (I) include structural units represented by the formulae (Ia), (Ib) and (Ic):

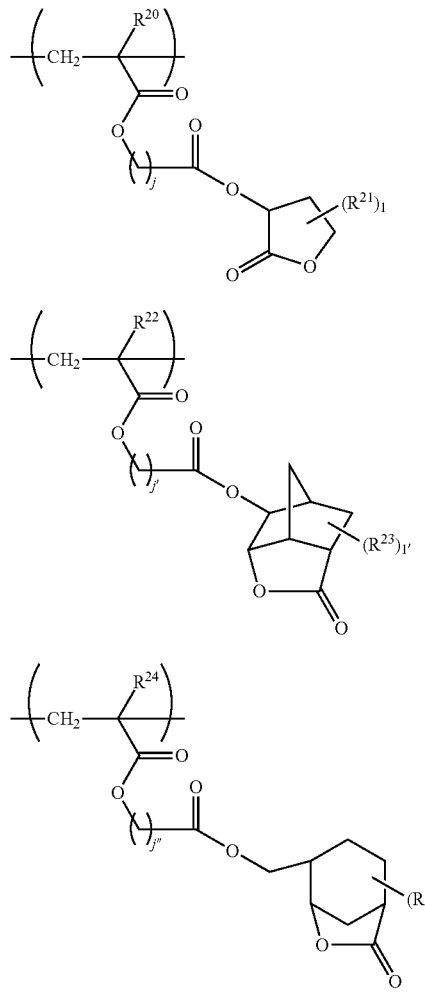

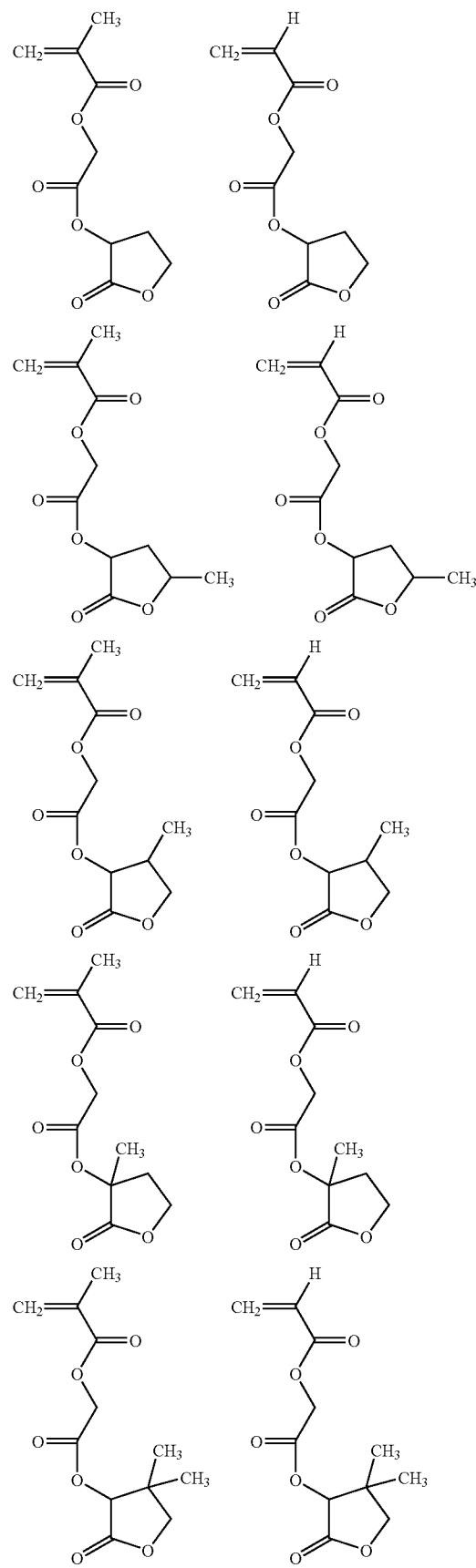

wherein $R^{20}$ represents a hydrogen atom or a methyl group, $R^{21}$ represents a methyl group, j represents an integer of 1 to 4, l represents an integer of 0 to 5, $R^{22}$ represents a hydrogen atom or a methyl group, $R^{23}$ is independently in each occurrence a carboxyl group, a cyano group or a C1-C4 hydrocarbon group, j' represents an integer of 1 to 4, l' represents an integer of 0 to 9, $R^{24}$ represents a hydrogen atom or a methyl group, $R^{25}$ is independently in each occurrence a carboxyl group, a cyano group or a C1-C4 hydrocarbon group, j" represents an integer of 1 to 4, and l" represents an integer of 0 to 9.

Examples of the C1-C4 hydrocarbon group include a C1-C4 alkyl group such as a methyl group, an ethyl group, an n-propyl group, an isopropyl group, an n-butyl group, an isobutyl group, a sec-butyl group and a tert-butyl group, and a methyl group is preferable.

The structural units represented by the formulae (Ia), (Ib) and (Ic) are respectively derived from the corresponding monomers.

Specific examples of the monomer used to give the structural units represented by the formulae (Ia) include the followings:

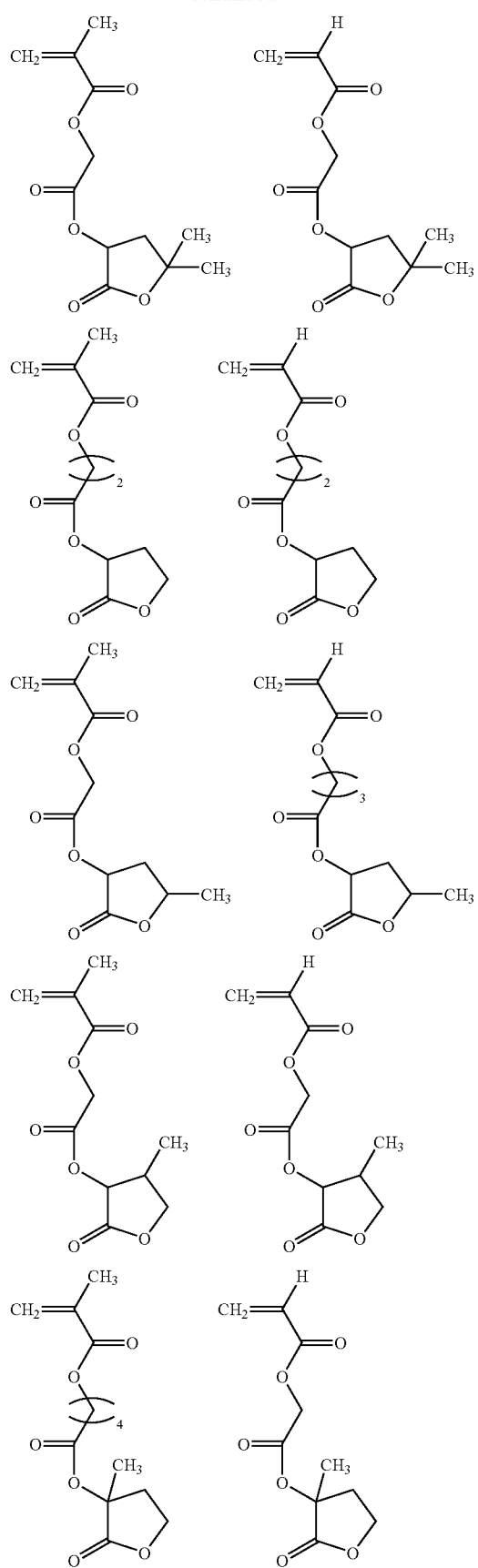
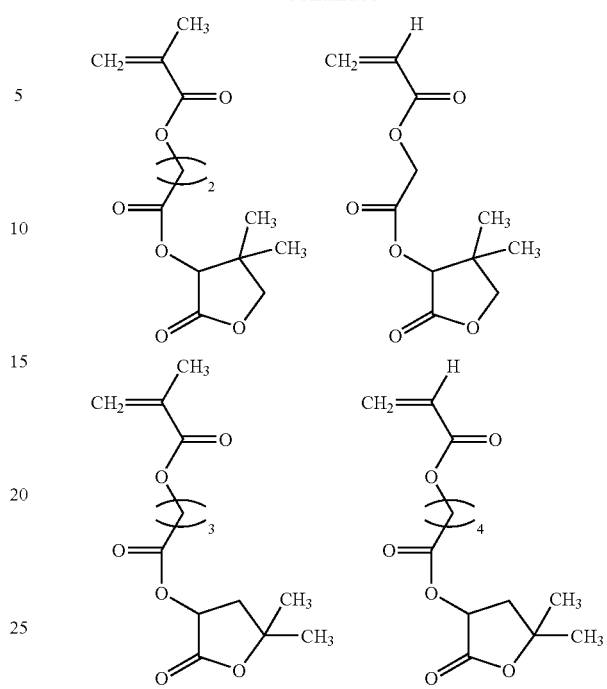
Specific examples of the monomer used to give the structural units represented by the formulae (Ib) include the followings:
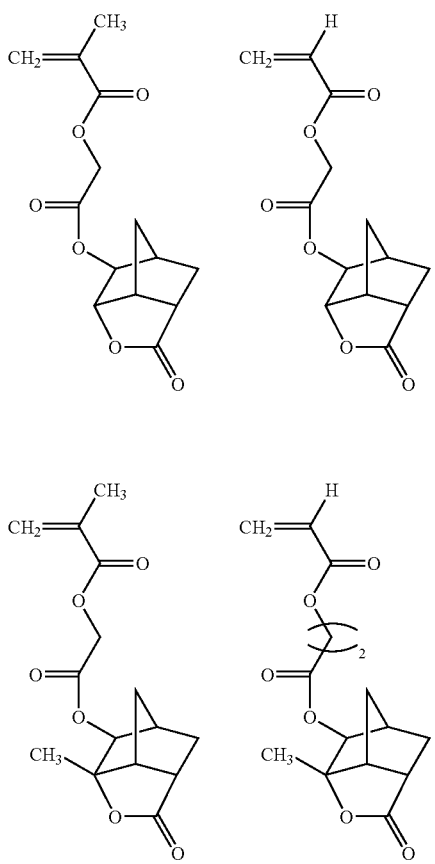

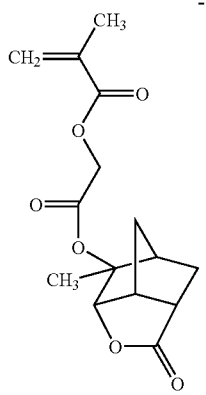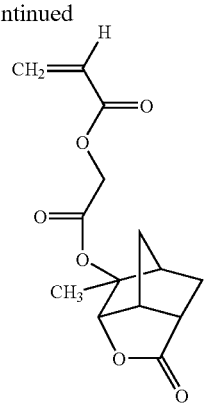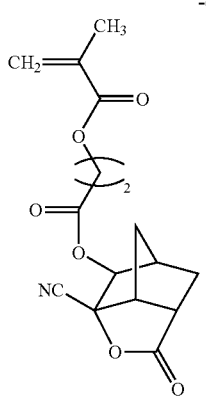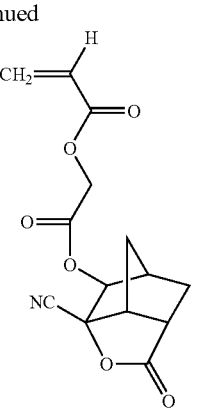
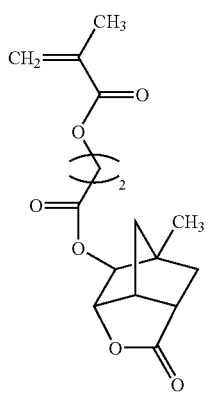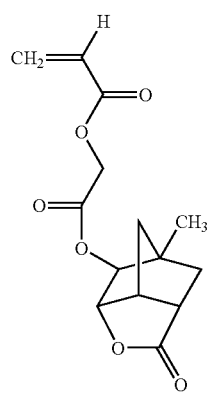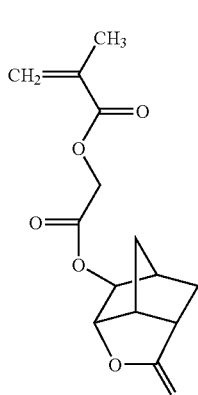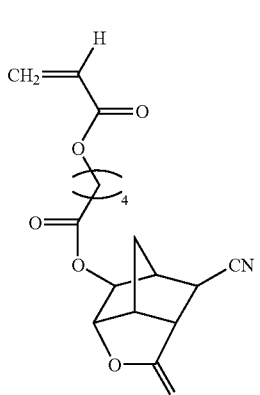
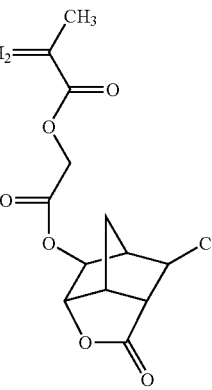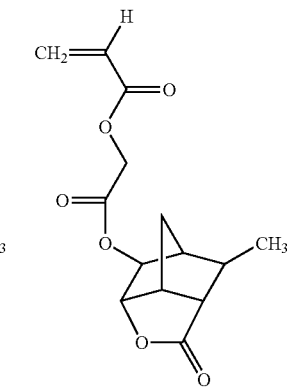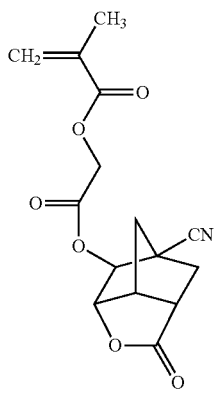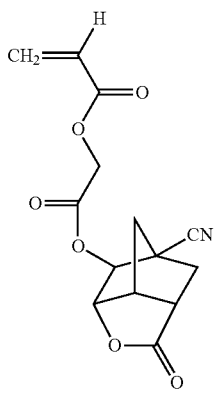
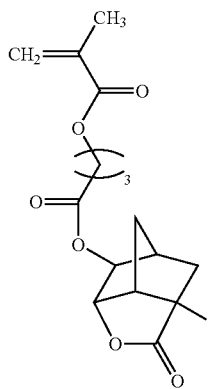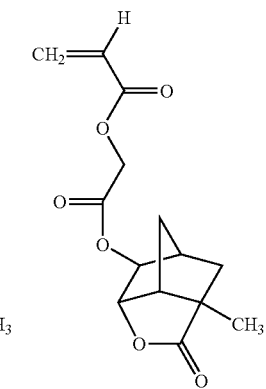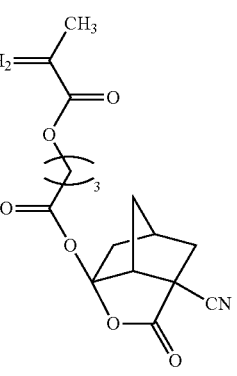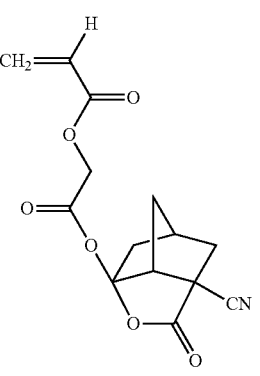

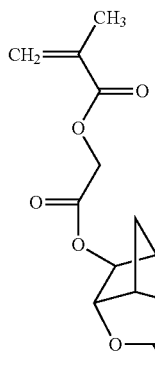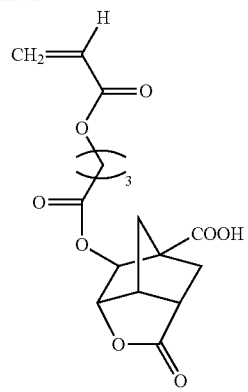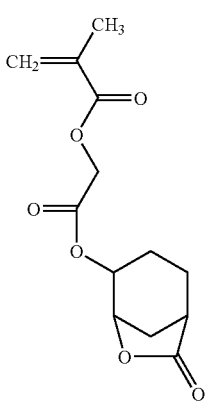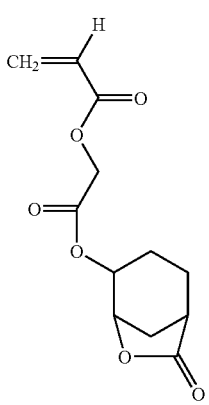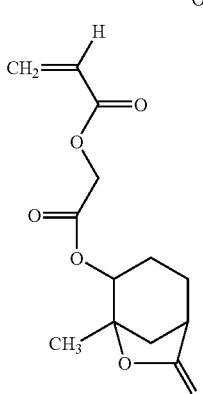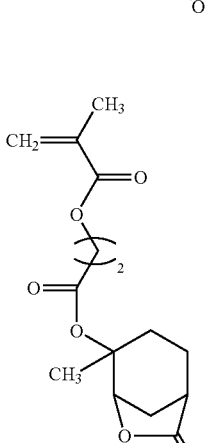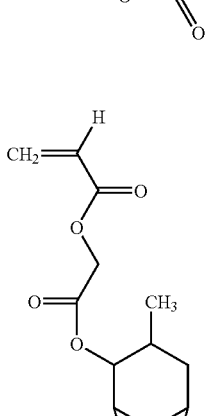
Specific examples of the monomer used to give the structural units represented by the formulae (Ic) include the followings:

-continued

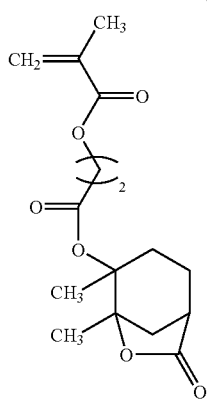 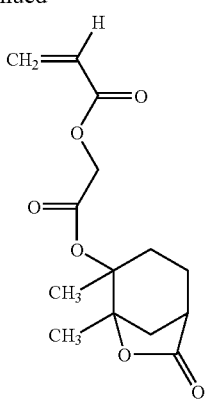

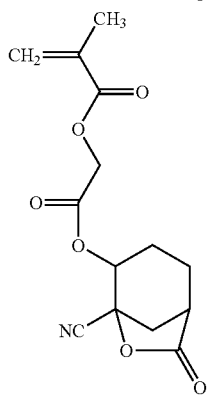 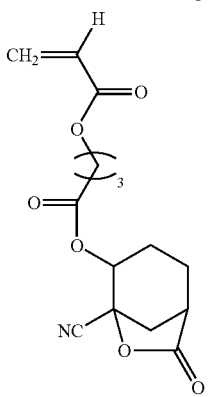

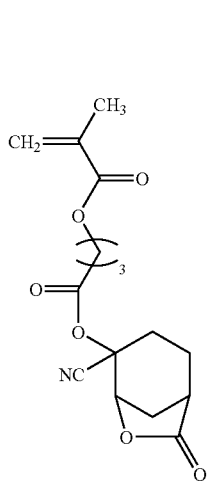 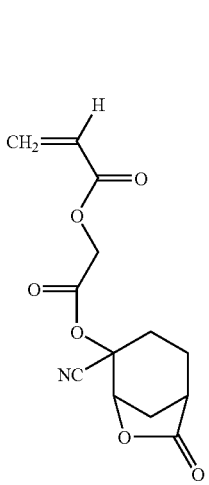

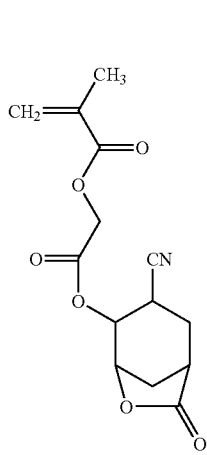 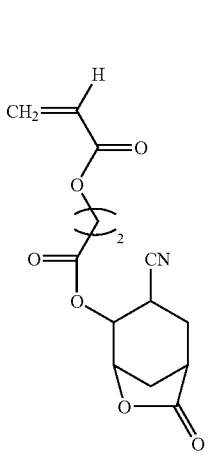

-continued

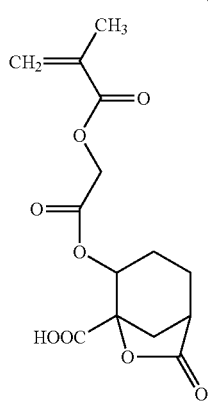 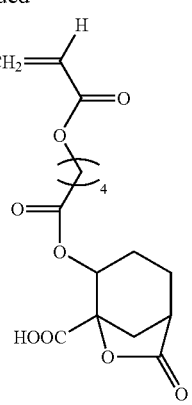

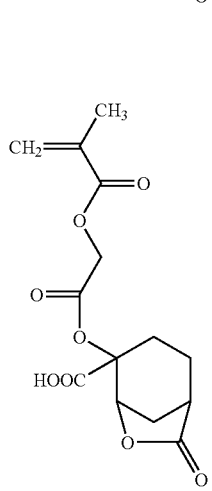 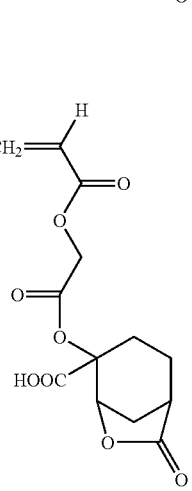

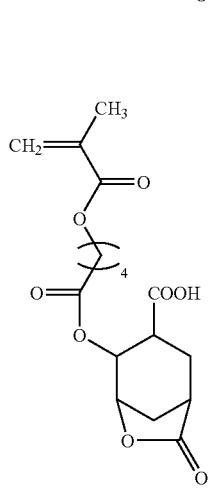 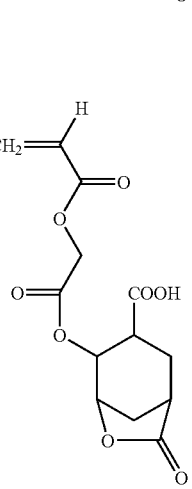

Among these monomers, the structural unit (Ia) wherein l is 0, the structural unit (Ib) wherein l' is 0 and the structural unit (Ic) wherein l" is 0 are preferable, and the structural units derived from the monomers represented by the following formulae are more preferable since the pattern having good profile can be obtained when the resin containing the following structural unit is used in the present resist composition.

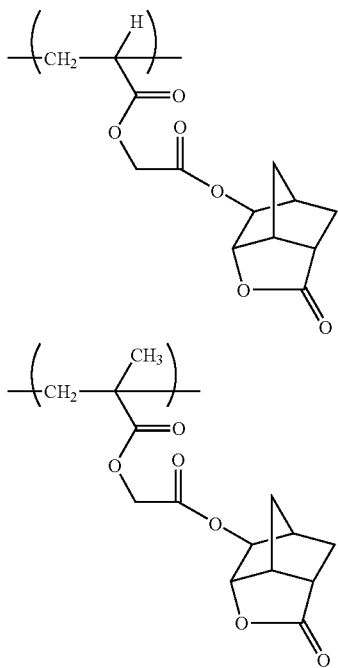

The above-mentioned monomers can be produced, for example, by reacting the corresponding halogenated compound having lactone structure with the corresponding acrylic acid compound or methacrylic acid compound, by reacting the corresponding compound having a hydroxyl group and a lactone structure with the corresponding acryloyl halide or methacrylic halide.

The resin (A) generally contains the structural unit having an acid-labile group in a ratio of 10 to 80 mol % and the structural unit (I) in a ratio of 20 to 90 mol % based on all structural units of the resin (A) although the ratio varies depending on the kind of radiation for patterning exposure, the kind of the acid-labile group and the like, and The resin (A) preferably contains the structural unit having an acid-labile group in a ratio of 15 to 70 mol % and the structural unit (I) in a ratio of 30 to 85 mol % based on all structural units of the resin (A) from the viewpoint of dry etching resistance.

The resin (A) may contain the structural unit represented by the formula (IV):

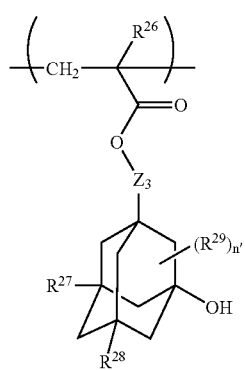

(IV)

wherein $R^{26}$ represents a hydrogen atom or a methyl group, $R^{27}$ and $R^{28}$ each independently represents a hydrogen atom, a methyl group or a hydroxyl group, $R^{29}$ represents a methyl group, n' represents an integer of 0 to 12, $Z^3$ represents a single bond or a —$(CH_2)_{q'}$—COO— group, and q' represents an integer of 1 to 4 (hereinafter, simply referred to as the structural unit (IV)) in addition to the structural unit having an acid-labile group and the structural unit (I).

The structural unit (IV) wherein $R^{27}$ and $R^{28}$ each independently represents a hydrogen atom or a hydroxyl group and n' is 0 is preferable.

The resin (A) may contain two or more kinds of the structural unit (IV).

The resin (A) preferably contains the structural unit (IV).

Specific examples of the monomer used to give the structural unit (IV) include the followings:

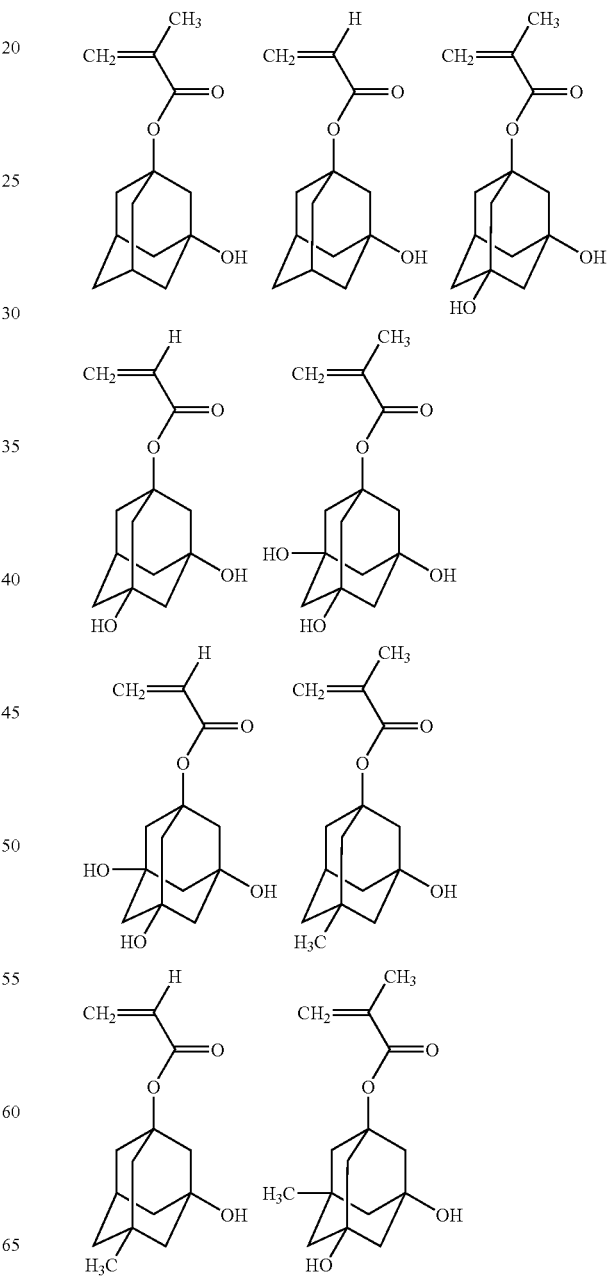

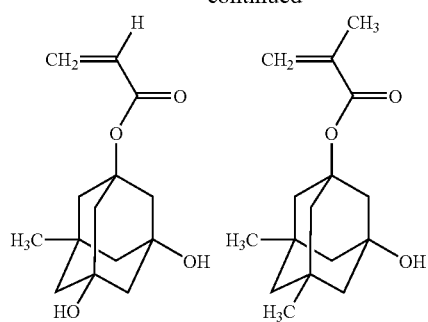
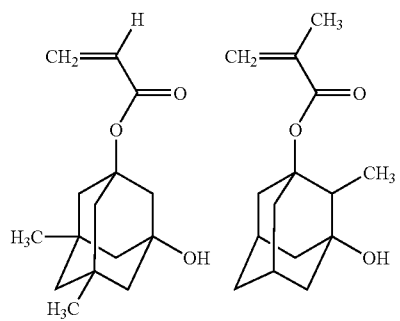
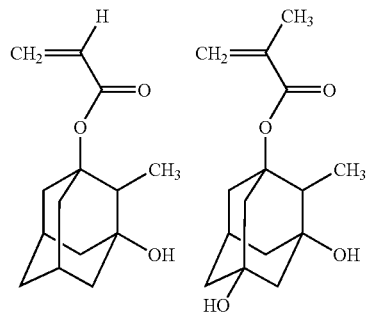
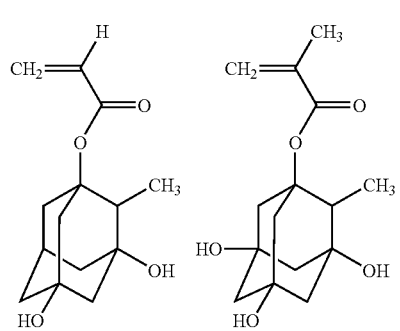
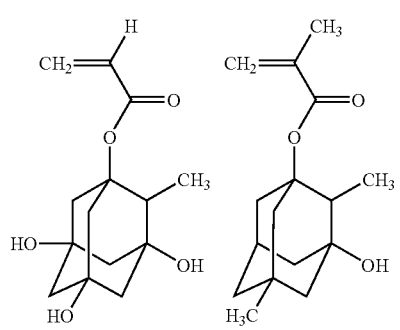
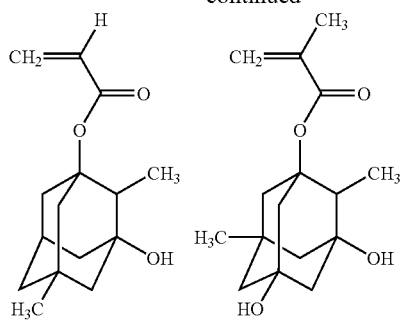
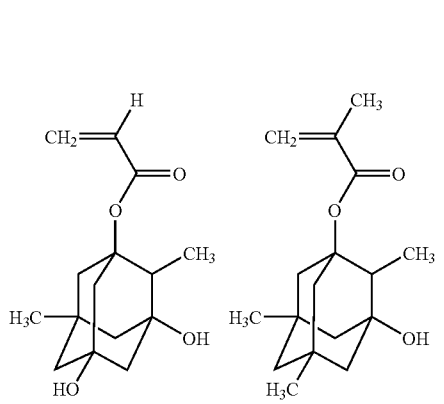
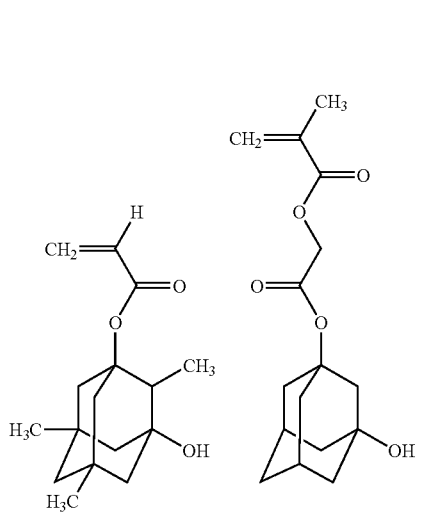
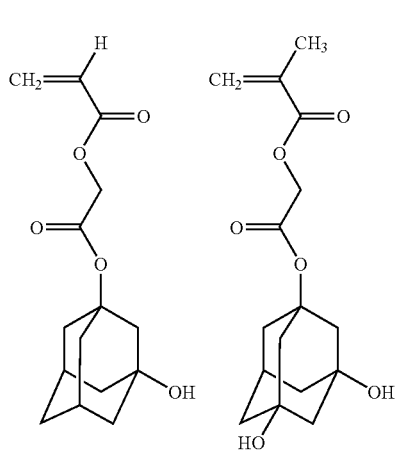

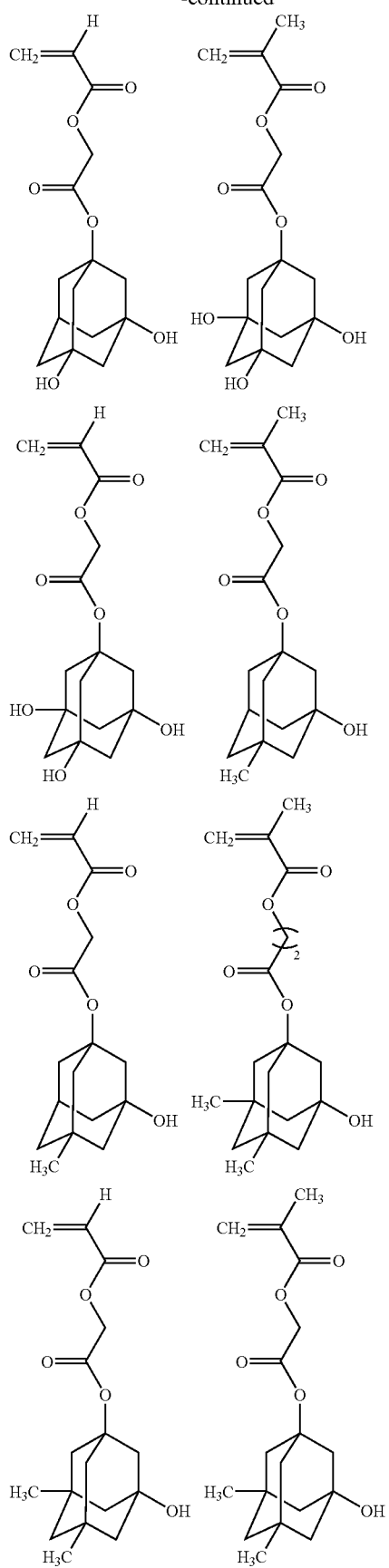

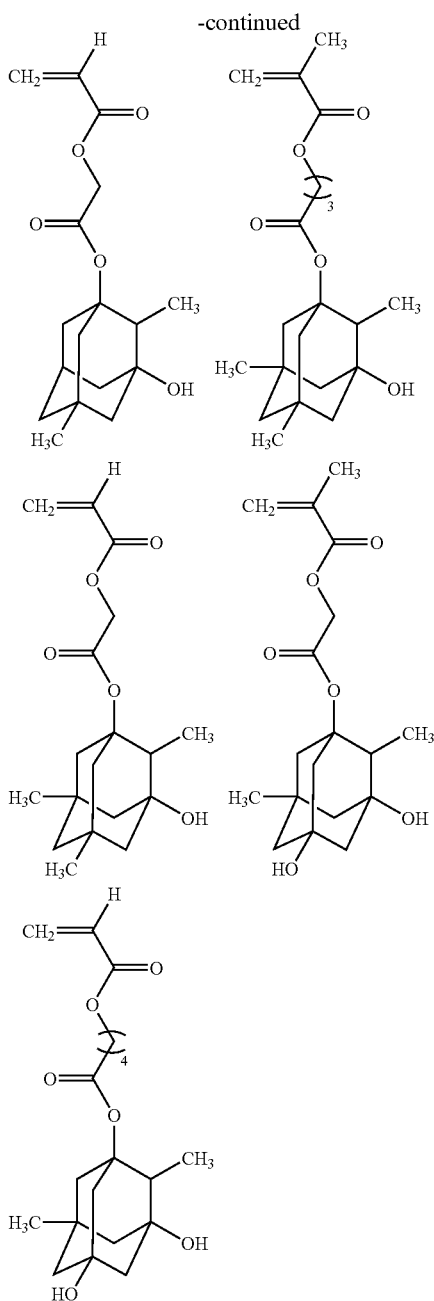

Among these monomers, 3-hydroxy-1-adamantyl acrylate, 3,5-dihydroxy-1-adamantyl acrylate, 3-hydroxy-1-adamantyl methacrylate, 3,5-dihydroxy-1-adamantyl methacrylate, 1-(3-hydroxy-1-adamantyloxycarbonyl)methyl methacrylate and 1-(3,5-dihydroxy-1-adamantyloxycarbonyl)methyl methacrylate are preferable since excellent resolution is obtained when the resin containing the structural unit derived from such monomer is used in the present resist composition.

3-Hydroxy-1-adamantyl acrylate, 3,5-dihydroxy-1-adamantyl acrylate, 3-hydroxy-1-adamantyl methacrylate and 3,5-dihydroxy-1-adamantyl methacrylate can be produced, for example, by reacting corresponding hydroxyl-substituted adamantane with acrylic acid, methacrylic acid, or its acid halide, and they are also commercially available.

The resin (A) usually contains the structural unit (IV) in a ratio of 0 to 40 mol % and preferably in a ratio of 5 to 35 mol % in all structural units of the resin (A) although the ratio varies depending on the kind of radiation for patterning exposure, the kind of the structural unit (IV) and the like.

The resin (A) may contain the structural unit represented by the formula (IX):

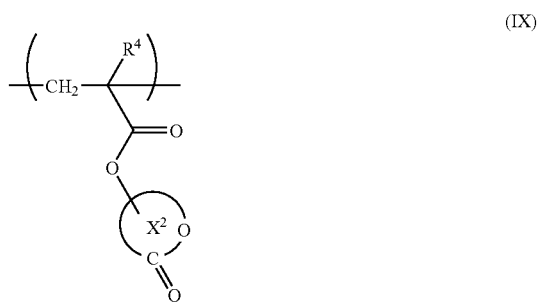

wherein $R^4$ represents a hydrogen atom or a methyl group, ring $X^2$ represents an unsubstituted or substituted C3-C30 cyclic hydrocarbon group having —COO— (hereinafter, simply referred to as the structural unit (IX)) in addition to the structural unit having an acid-labile group and the structural unit (I).

The resin (A) may contain two or more kinds of the structural unit (IX).

The resin (A) preferably contains the structural unit (IX).

The cyclic hydrocarbon group having —COO— may be a monocyclic hydrocarbon group and a polycyclic hydrocarbon group. Examples of the substituents of the cyclic hydrocarbon group include a C1-C4 hydrocarbon group, a carboxyl group and a cyano group.

Specific examples of the monomer used to give the structural unit (IX) include the followings:

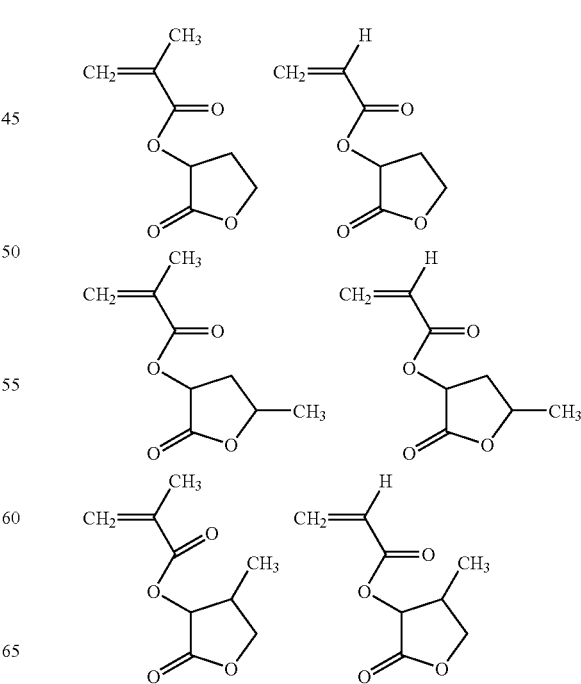

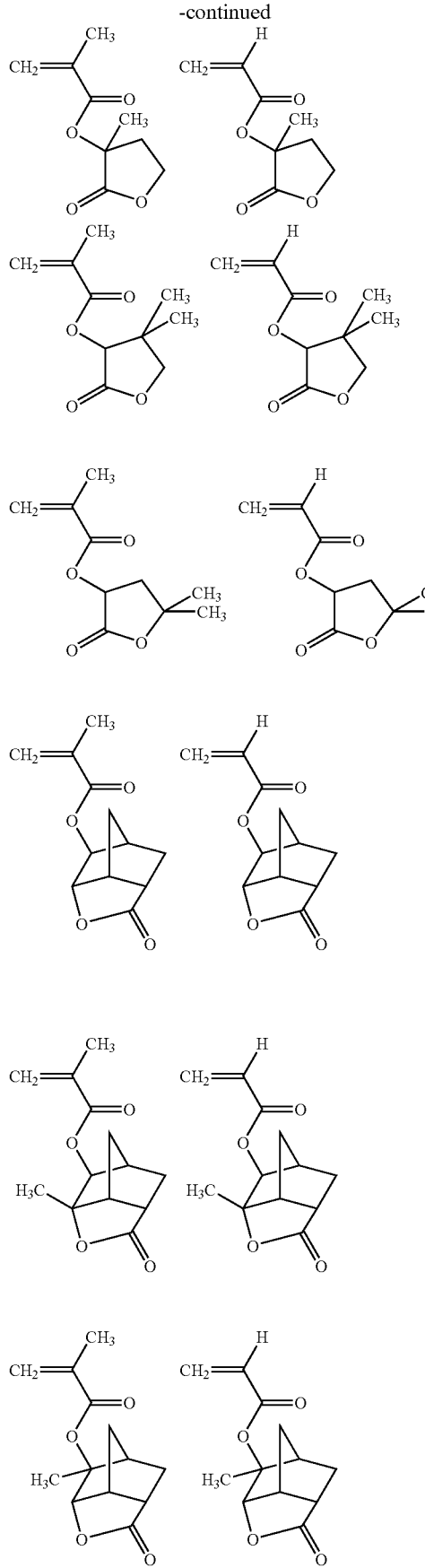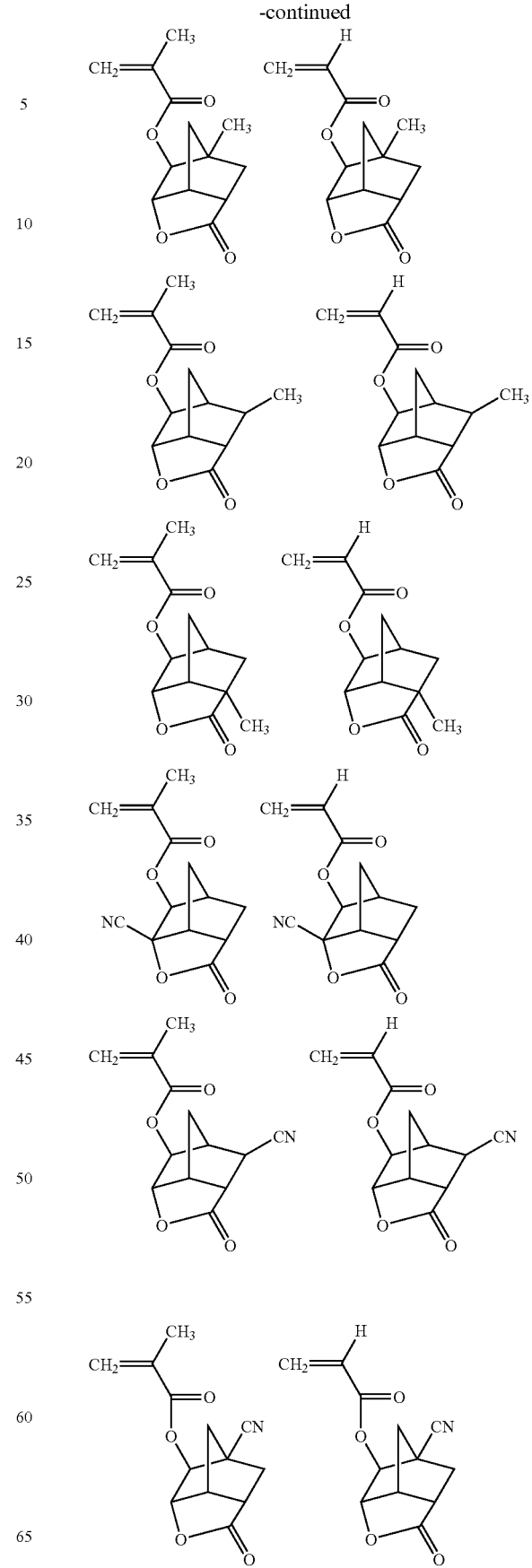

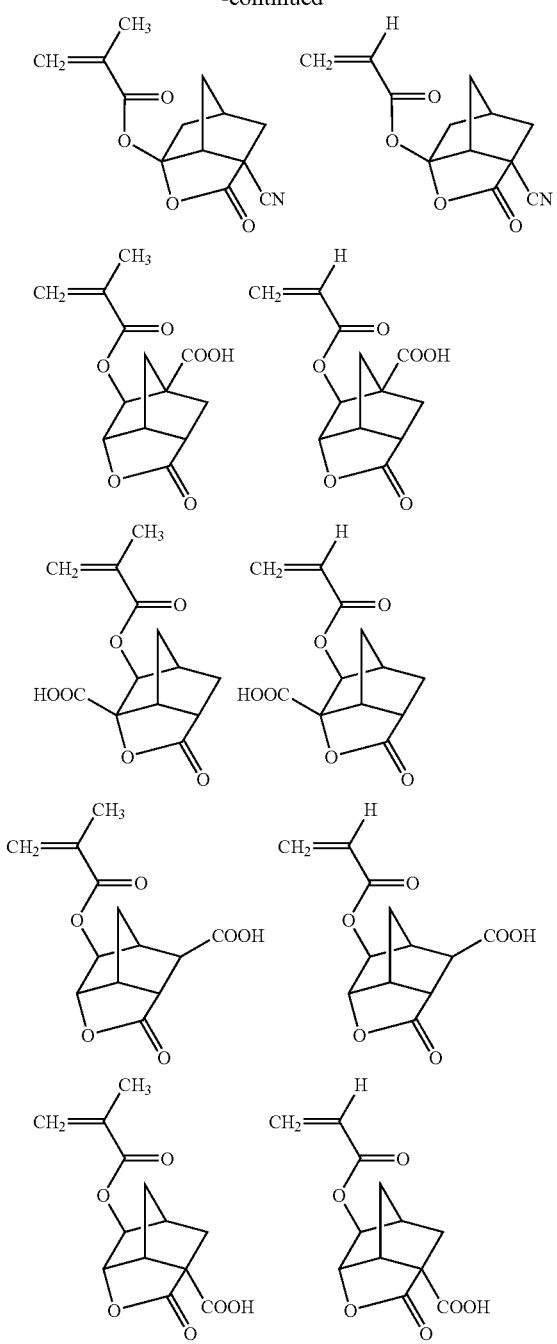

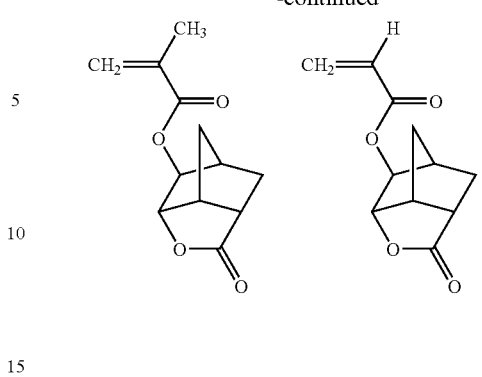

As the structural unit (IX), the structural units derived from the following monomers are preferable.

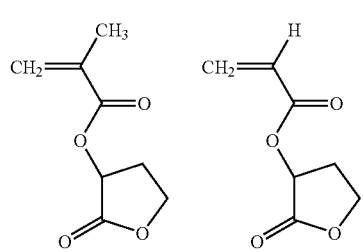

The resin (A) preferably contains the structural unit (IX) in a ratio of 0 to 40 mol % and more preferably 5 to 35 mol % based on all structural units of the resin (A) although the ratio varies depending on the kind of radiation for patterning exposure, the kind of the structural unit (IX) and the like.

The resin (A) may contain the other structural unit or units in addition to the above-mentioned structural units. The resin (A) containing the structural unit derived from 2-norbornene shows strong structure because an alicyclic group is directly present on its main chain and shows a property that dry etching resistance is excellent.

The structural unit derived from 2-norbornene can be introduced into the main chain by radical polymerization using, for example, aliphatic unsaturated dicarboxylic anhydrides such as maleic anhydride and itaconic anhydride together in addition to 2-norbornene. The structural unit derived from 2-norbornene is formed by opening of its double bond, and can be represented by the formula (d):

$$\text{(d)}$$

wherein, $R^{55}$ and $R^{56}$ each independently represents a hydrogen atom, a C1-C3 alkyl group, a carboxyl group, a cyano group or —COOU$^1$ group in which U$^1$ represents an alcohol residue, provided that the alcohol residue is not an acid-labile group, or $R^{55}$ and $R^{56}$ may be bonded together to form a carboxylic anhydride residue represented by —C(=O)OC(=O)—.

The structural unit derived from maleic anhydride and the structural unit derived from itaconic anhydride which are the structural unit derived from aliphatic unsaturated dicarboxylic anhydrides are formed by opening of their double bonds, and can be represented by the formula (e) and the formula (f), respectively.

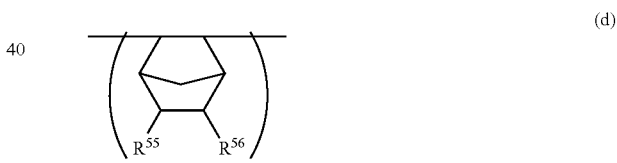

-continued

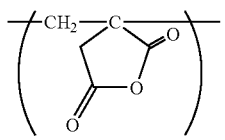
(f)

In $R^{55}$ and $R^{56}$, examples of the C1-C3 alkyl group include a methyl group, an ethyl group, an n-propyl group and an isopropyl group.

In $R^{55}$ and $R^{56}$, —COOU$^1$ group is an ester formed from a carboxyl group, and Examples of the alcohol residue corresponding to $U^1$ include optionally substituted primary or secondary alkyl groups having about 1 to 8 carbon atoms, a 2-oxooxolan-3-yl group and a 2-oxooxolan-4-yl group. Examples of the substituent on the alkyl group include a hydroxyl group and an alicyclic hydrocarbon residue.

Specific examples of the monomer used to give the structural unit represented by the formula (d) include 2-norbornene, 2-hydroxy-5-norbornene, 5-norbornene-2-carboxylic acid, methyl 5-norbornene-2-carboxylate, 2-hydroxyethyl 5-norbornene-2-carboxylate, 5-norbornene-2-methanol and 5-norbornene-2,3-dicarboxylic acid anhydride.

The structural unit represented by the formula (d) wherein any one of $R^{55}$ and $R^{56}$ represents —COOU$^2$ group in which $U^2$ represents an acid-labile group, and the other represents a hydrogen atom, a C1-C3 alkyl group, a carboxyl group, a cyano group or —COOU$^3$ group in which $U^3$ represents an alcohol residue, is a structural unit having acid-labile group even if it has a norbornene structure. Examples of monomers giving said structural unit include tert-butyl 5-norbornene-2-carboxylate, 1-cyclohexyl-1-methylethyl 5-norbornene-2-carboxylate, 1-methylcyclohexyl 5-norbornene-2-carboxylate, 2-methyl-2-adamantyl 5-norbornene-2-carboxylate, 2-ethyl-2-adamantyl 5-norbornene-2-carboxylate, 1-(4-methylcyclohexyl)-1-methylethyl 5-norbornene-2-carboxylate, 1-(4-hydroxycyclohexyl)-1-methylethyl 5-norbornene-2-carboxylate, 1-methyl-1-(4-oxocyclohexyl)ethyl 5-norbornene-2-carboxylate and 1-(1-adamantyl)-1-methylethyl 5-norbornene-2-carboxylate.

The resin (A) preferably contains no fluorine atom.

The resin (A) has usually polystyrene-equivalent weight-average molecular weight of about 1,000 to 500,000, and preferably of 4,000 to 50,000.

The present resist composition contains a resin (B) comprising a structural unit represented by the formula (II):

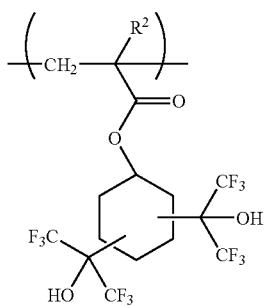
(II)

wherein $R^2$ represents a hydrogen atom, a methyl group or a trifluoromethyl group (hereinafter, simply referred to as the structural unit (II)) in addition to the resin (A).

The structural unit (II) has a bis(1,1,1,3,3,3-hexafluoro-2-hydroxy-2-propyl)cyclohexyl group, and the bonding positions of two 1,1,1,3,3,3-hexafluoro-2-hydroxy-2-propyl group are not limited.

Examples of the monomer used to give the structural unit (II) include the followings:

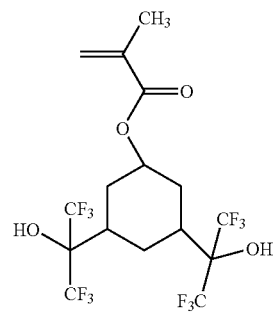

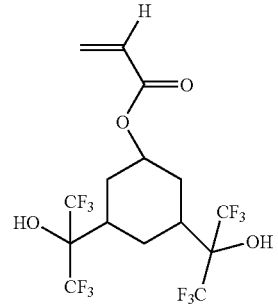

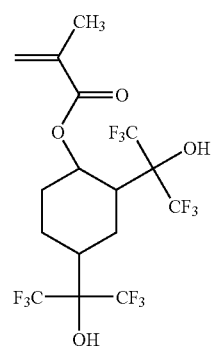

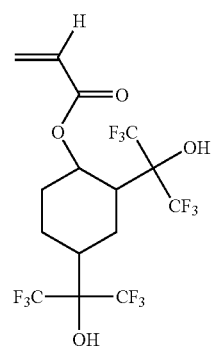

The resin (B) may consist of the structural unit (II), and may contain at least one structural unit selected from the group consisting of a structural unit represented by the formula (VII):

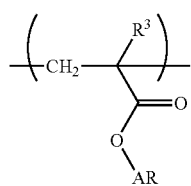

(VIII)

wherein $R^3$ represents a hydrogen atom, a methyl group or a trifluoromethyl group, and AR represents a fluorine-containing C1-C30 hydrocarbon group which may have one or more hydroxyl groups and one or more methylene group in the hydrocarbon group may be replaced by a heteroatom selected from the group consisting of a oxygen atom, a nitrogen atom and a sulfur atom, with the proviso that the above-mentioned structural unit represented by the formula (VIII) is not the same as the structural unit represented by the formula (II) (hereinafter, simply referred to as the structural unit (VIII)), the above-mentioned structural unit (IX) and the above-mentioned structural unit (I).

Examples of the fluorine-containing C1-C30 hydrocarbon group include a C1-C30 perfluoroalkyl group such as a trifluoromethyl group, a pentafluoroethyl group, a heptafluoropropyl group and a nonafluorobutyl group; a C1-C30 perfluoroalkoxyalkyl group such as a 1-trifluoromethoxyethyl group and a 1-pentafluoroethoxyethyl group; a C1-C30 perfluoroalkoxyperfuloroalkyl group such as a 1-trifluoromethoxydifluoroethyl group and a 1-pentafluoroethoxydifluoroethyl group; and the following:

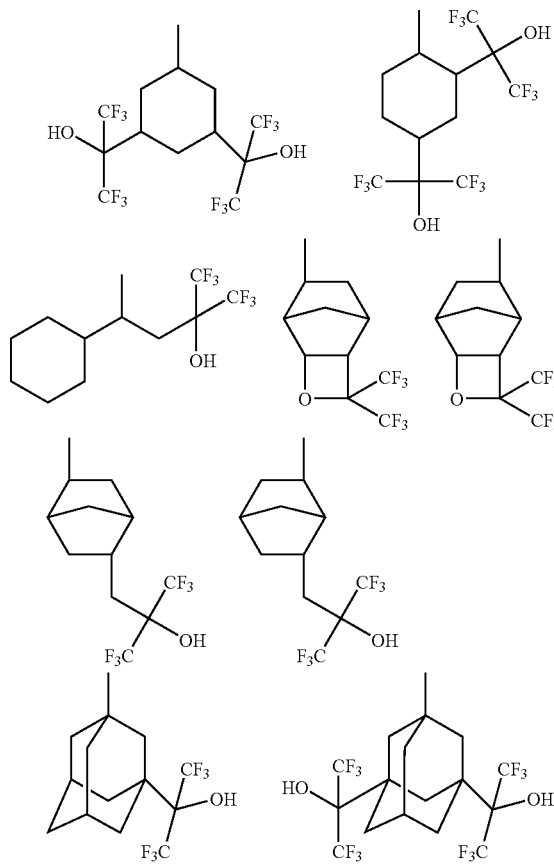

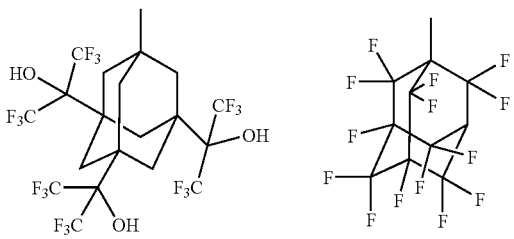

In the formulae above, straight line with an open end shows a bond extended from the adjacent oxygen group.

Examples of the monomer used to give the structural unit (II) include the followings:

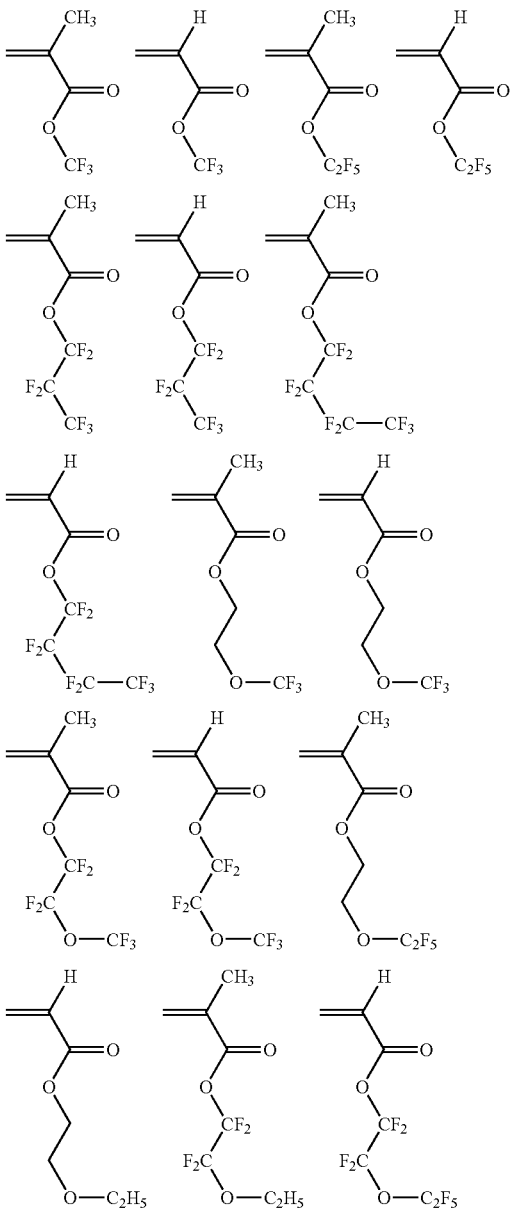

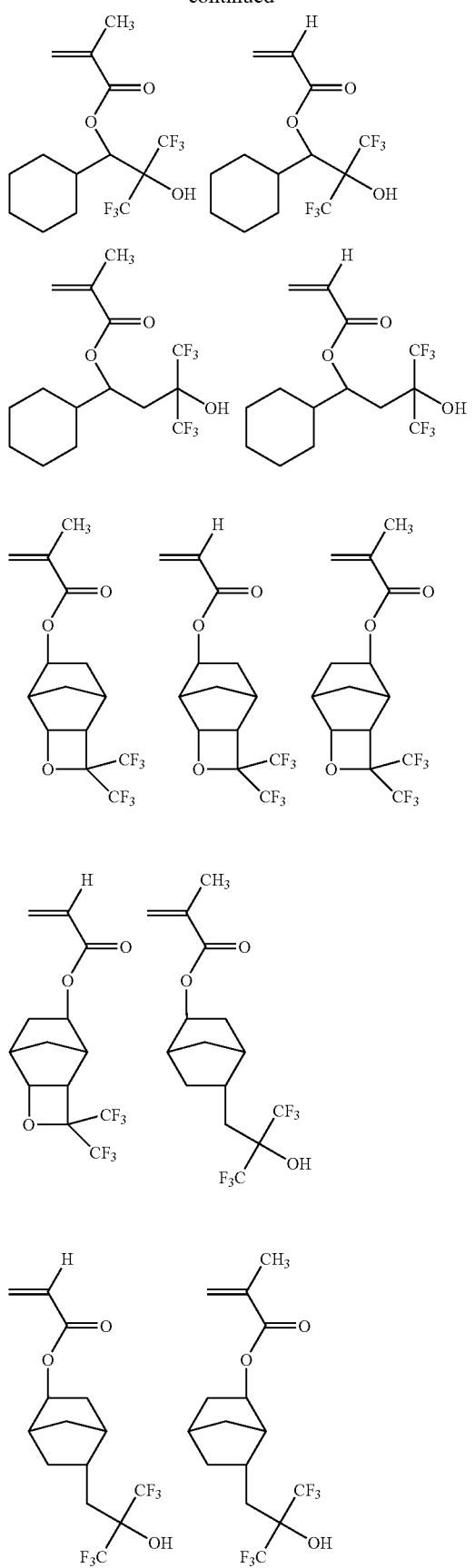
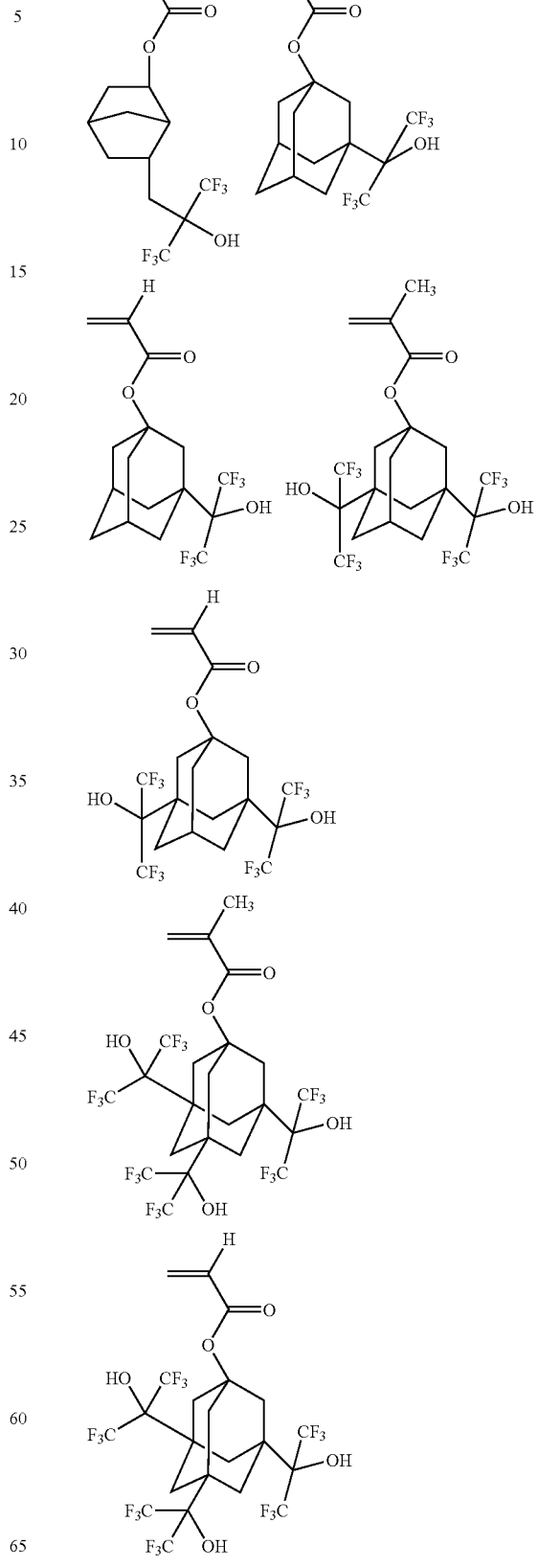

Among them, the structural units having a fluorine-containing monocyclic or polycyclic hydrocarbon group are preferable, and the structural units derived from the following monomers are more preferable since excellent resolution is obtained when the resin containing the structural unit derived from such monomer is used in the present resist composition.

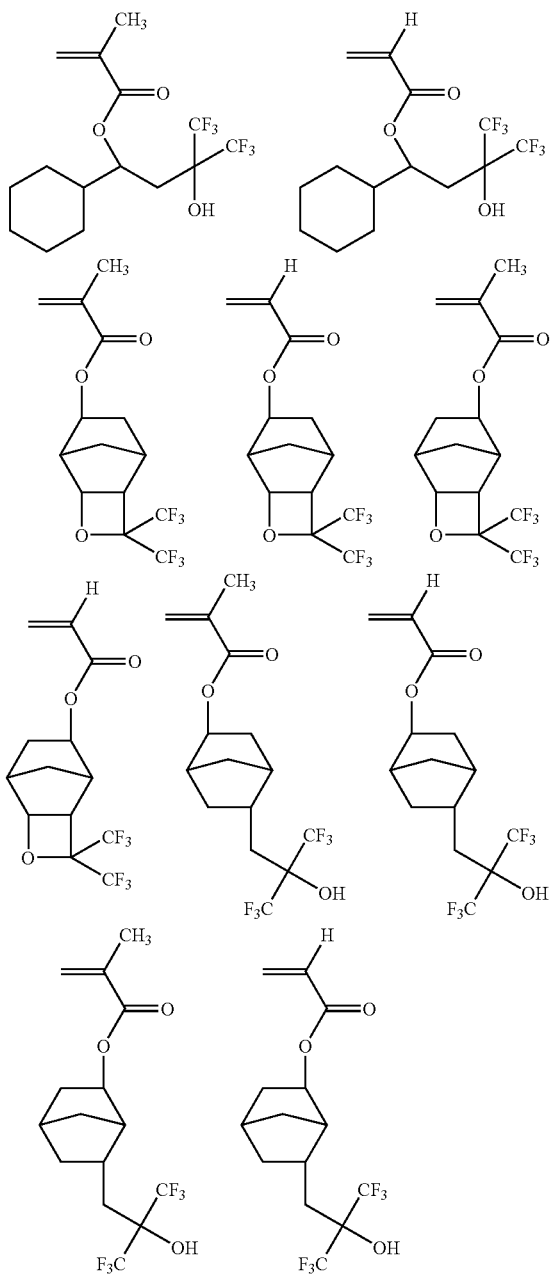

The resin (B) preferably contains the structural unit (II) in a ratio of 5 to 100 mol %, more preferably 80 to 100 mol % and especially preferably 90 to 100 mol % based on all structural units of the resin (B) although the ratio varies depending on the kind of radiation for patterning exposure, the kind of the structural unit other than the structural unit (II) and the like.

The resin (B) has usually polystyrene-equivalent weight-average molecular weight of about 1,000 to 500,000, and preferably of 4,000 to 50,000.

The resin (A) and the resin (B) can be produced, for example, by polymerizing the corresponding monomer or monomers. The resin (A) and the resin (B) can be also produced by conducting oligomerization of the corresponding monomer or monomers followed by polymerizing the oligomer obtained.

Although various polymerization reactions can be used for producing the resin (A) and the resin (B), the polymerization reaction is preferably carried out in the presence of a radical initiator.

The radical initiator is not limited and examples thereof include an azo compound such as 2,2'-azobisisobutyronitrile, 2,2'-azobis(2-methylbutyronitrile), 1,1'-azobis(cyclohexane-1-carbonitrile), 2,2'-azobis(2,4-dimethylvaleronitrile), 2,2'-azobis(2,4-dimethyl-4-methoxyvaleronitrile), dimethyl-2,2'-azobis(2-methylpropionate) and 2,2'-azobis(2-hydroxymethylpropionitrile); an organic hydroperoxide such as lauroyl peroxide, tert-butyl hydroperoxide, benzoyl peroxide, tert-butyl peroxybenzoate, cumene hydroperoxide, diisopropyl peroxydicarbonate, di-n-propyl peroxydicarbonate, tert-butyl peroxyneodecanoate, tert-butyl peroxypivalate and 3,5,5-trimethylhexanoyl peroxide; and an inorganic peroxide such as potassium peroxodisulfate, ammonium peroxodisulfate and hydrogen peroxide. Among them, the azo compound is preferable and 2,2'-azobisisobutyronitrile, 2,2'-azobis(2-methylbutyronitrile), 1,1'-azobis(cyclohexane-1-carbonitrile), 2,2'-azobis(2,4-dimethylvaleronitrile) and dimethyl-2,2'-azobis(2-methylpropionate) are more preferable, and 2,2'-azobisisobutyronitrile and 2,2'-azobis(2,4-dimethylvaleronitrile) are especially preferable.

These radical initiators may be used alone or in a form of a mixture of two or more kinds thereof. When the mixture of two or more kinds thereof is used, the mixed ratio is not particularly limited. When the mixture of two kinds of radical initiators is used, preferred examples of the combination include a combination of 2,2'-azobisisobutyronitrile and 2,2'-azobis(2,4-dimethylvaleronitrile), a combination of 2,2'-azobis(2,4-dimethylvaleronitrile) and 2,2'-azobis(2-methylbutyronitrile), a combination of 2,2'-azobis(2,4-dimethylvaleronitrile) and 1,1'-azobis(cyclohexane-1-carbonitrile), and a combination of 2,2'-azobis(2,4-dimethylvaleronitrile) and dimethyl-2,2'-azobis(2-methylpropionate).

The amount of the radical initiator is preferably 1 to 20% by mole based on all monomer or oligomer molar amount.

The polymerization temperature is usually 0 to 150° C., and preferably 40 to 100° C.

The polymerization reaction is usually carried out in the presence of a solvent and it is preferred to use a solvent which is sufficient to dissolve the monomer, the radical initiator and the resin obtained. Examples thereof include a hydrocarbon solvent such as toluene; an ether solvent such as 1,4-dioxane and tetrahydrofuran; a ketone solvent such as methyl isobtyl ketone; an alcohol solvent such as isopropyl alcohol; a cyclic ester solvent such as γ-butyrolactone; a glycol ether ester ester solvent such as propyleneglycol monomethyl ether acetate; and an acyclic ester solvent such as ethyl lactate. These solvents may be used alone and a mixture thereof may be used.

The amount of the solvent is not limited, and practically, it is preferably 1 to 5 parts by weight relative to 1 part of all monomers or oligomers.

After completion of the polymerization reaction, the resin produced can be isolated, for example, by adding a solvent in which the present resin is insoluble or poorly soluble to the reaction mixture obtained and filtering the precipitated resin. If necessary, the isolated resin may be purified, for example, by washing with a suitable solvent.

In the present chemically amplified positive resist composition, the amount of the resin (B) is usually 0.1 to 20 parts by weight and preferably 1 to 10 parts by weight relative to 100 parts by weight of the resin (A).

The present chemically amplified positive resist composition contains an acid generator. The acid generated by irradiation to the composition catalytically acts against acid-labile groups in the resin (A), cleaves the acid-labile-group, and the resin (A) becomes soluble in an alkali aqueous solution.

The present resist composition usually includes 80 to 99.9% by weight of sum of the resins (A) and (B) and 0.1 to 20% by weight of the acid generator based on the total solid content of the present composition.

Examples of the acid generator include onium salts, organic halide compounds, sulfone compounds and sulfonate compounds, and onium salts are preferable. Specific examples of the acid generator include those described in JP 2003-5374 A1.

Examples of the preferable acid generator include a salt represented by the formula (V):

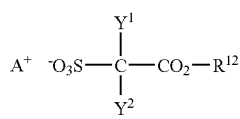

(hereinafter, simply referred to as the salt (V)).

In the salt (V), $Y^1$ and $Y^2$ each independently represents a fluorine atom or a C1-C6 perfluoroalkyl group. Examples of the C1-C6 perfluoroalkyl group include a trifluoromethyl group, a pentafluoroethyl group, a heptafluoropropyl group, a nonafluorobutyl group, a perfluorohexyl group. $Y^1$ and $Y^2$ each independently is a fluorine atom or a trifluoromethyl group. $Y^1$ and $Y^2$ are preferably the same groups.

In the salt (V), $R^{12}$ represents a C1-C30 hydrocarbon group which may be substituted with at least one group consisting of a C1-C6 alkoxy group, a C1-C4 perfluoroalkyl group, a C1-C6 hydroxyalkyl group, a hydroxyl group and a cyano group, and at least one methylene group may be replaced by —CO— or —O—.

Examples of the C1-C30 hydrocarbon group include a C1-C6 linear or branched chain hydrocarbon group such as a methyl group, an ethyl group, a propyl group, an isopropyl group, an n-butyl group, an isobutyl group, a sec-butyl group, a tert-butyl group, an n-pentyl group and an n-hexyl group; and a C3-C30 monocyclic or bicyclic hydrocarbon group optionally having a hydroxyl group or a carbonyl group such as a C4-C8 cycloalkyl group optionally having a hydroxyl group or a carbonyl group, an adamantyl group optionally having a hydroxyl group or a carbonyl group and a norbornyl group optionally having a hydroxyl group or a carbonyl group.

Specific examples of the C3-C30 monocyclic or bicyclic hydrocarbon group optionally having a hydroxyl group or a carbonyl group include 2-oxocyclopentyl group, 2-oxocyclohexyl group, 3-oxocyclopentyl group, 3-oxocyclohexyl group, 4-oxocyclohexyl group, 2-hydroxycyclopentyl group, 2-hydroxycyclohexyl group, 3-hydroxycyclopentyl group, 3-hydroxycyclohexyl group, 4-hydroxycyclohexyl group, 4-oxo-2-adamantyl group, 3-hydroxy-1-adamantyl group, 4-hydroxy-1-adamantyl group, 5-oxonorbornan-2-yl group, 1,7,7-trimethyl-2-oxonorbornan-2-yl group, 3,6,6-trimethyl-2-oxobicyclo[3.1.1]hept-3-yl group, 2-hydroxynorbornan-3-yl group, 1,7,7-trimethyl-2-hydroxynorbornan-3-yl group, 3,6,6-trimethyl-2-hydroxybicyclo[3.1.1]hept-3-yl group, and the followings:

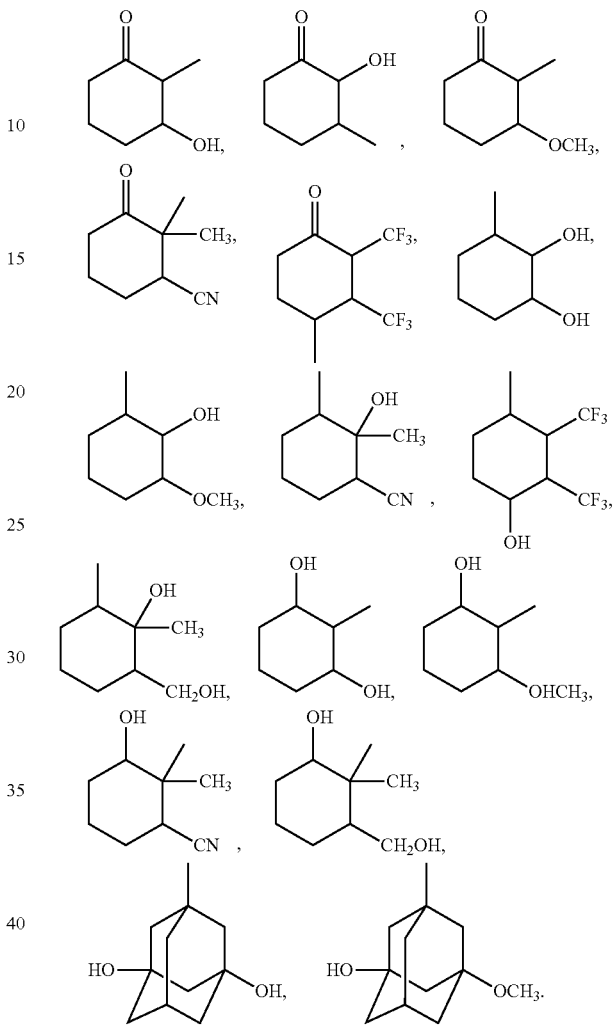

In the formulae above, straight line with an open end shows a bond which is extended from an adjacent group.

Other examples of C1-C30 hydrocarbon group include an alkyl group which is substituted with the above-mentioned C3-C30 monocyclic or bicyclic hydrocarbon group optionally having a hydroxyl group or a carbonyl group and in which at least one methylene group may be replaced by —CO— or —O—.

Examples of the C1-C6 alkoxy group include a methoxy group, an ethoxy group, an n-propoxy group, an isopropoxy group, an n-butoxy group, an isobutoxy group, a sec-butoxy group, a tert-butoxy group, an n-pentyloxy group and an n-hexyloxy group.

Examples of the C1-C4 perfluoroalkyl group include a trifluoromethyl group, a pentafluoroethyl group, a heptafluoropropyl group and a nonafluorobutyl group. Examples of the C1-C6 hydroxyalkyl group include a hydroxymethyl group, a 2-hydroxyethyl group, a 3-hydroxypropyl group and a 4-hydroxybutyl group. Examples of the ester group include a methoxycarbonyl group, an ethoxycarbonyl group and a 2-oxotetrahydrofuran-3-yl group. Examples of the C1-C6 perfluoroalkyl group include a trifluoromethyl group, a pentafluoroethyl group, a heptafluoropropyl group, a nonafluorobutyl group, an undecafluoropentyl group and a tridecafluorohexyl group.
Specific examples of the anion part of the salt (V) include the followings:
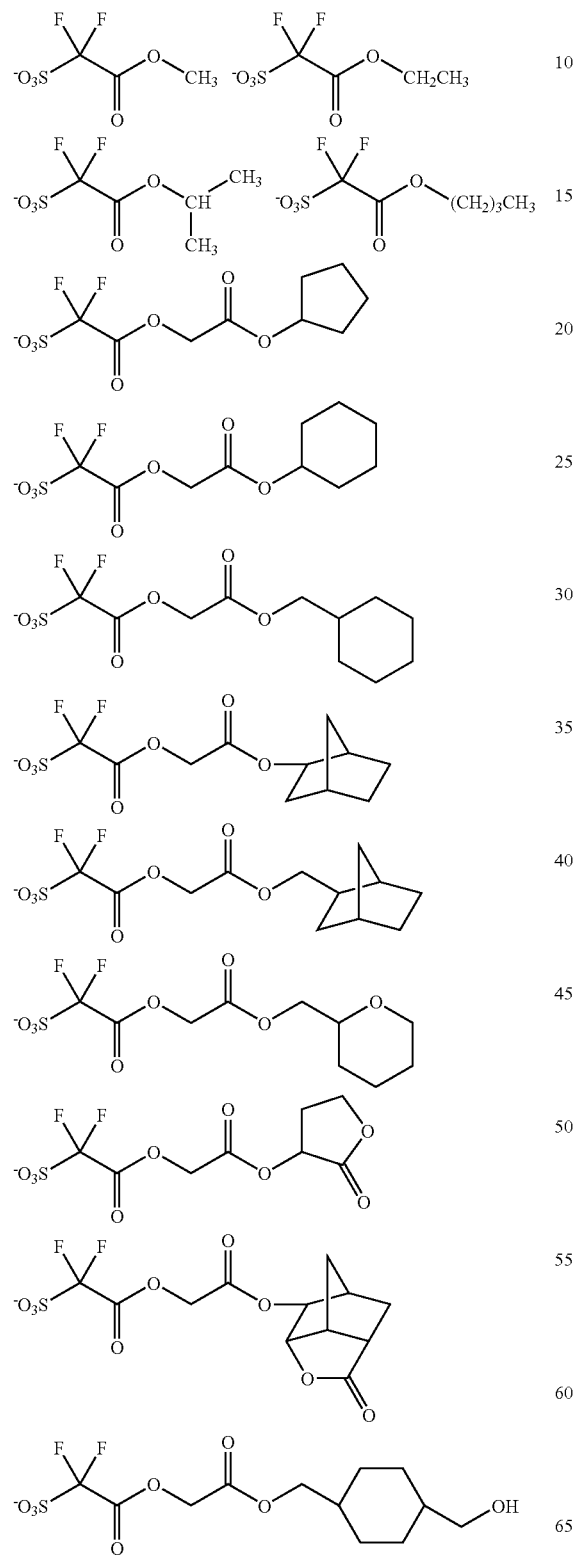
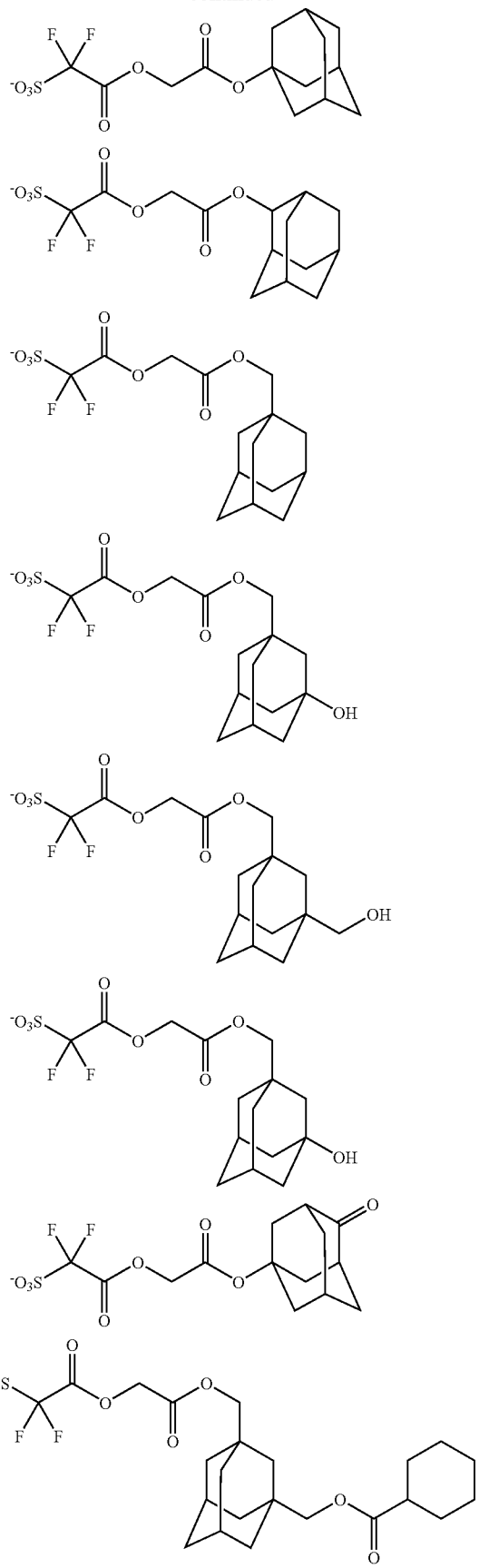

73
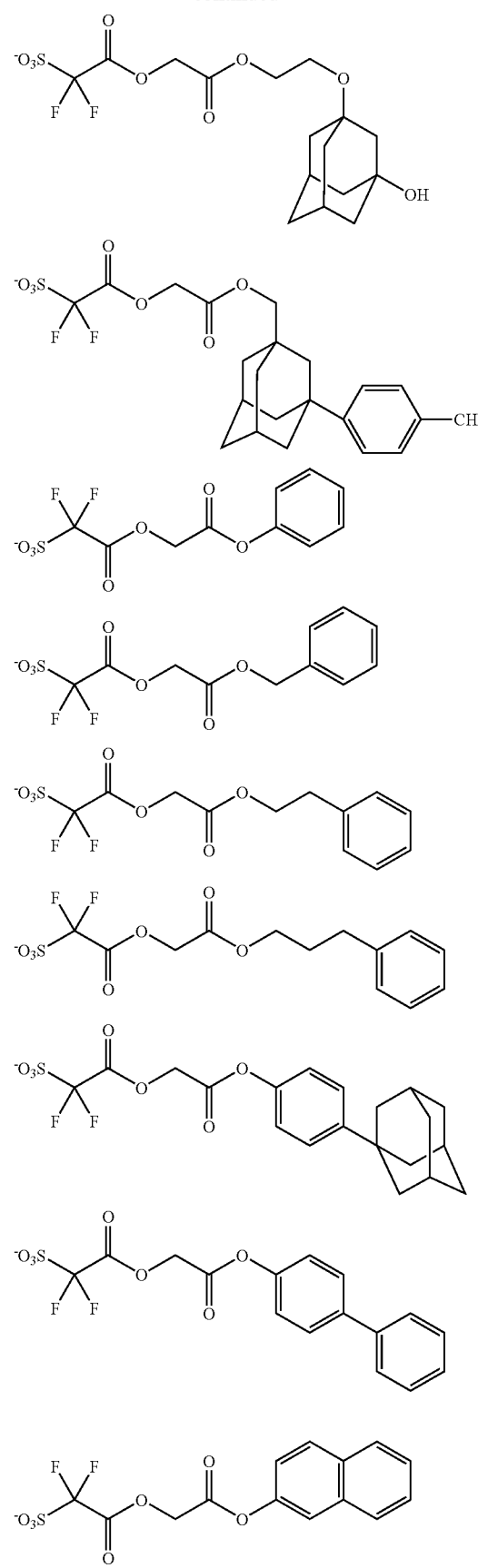
74
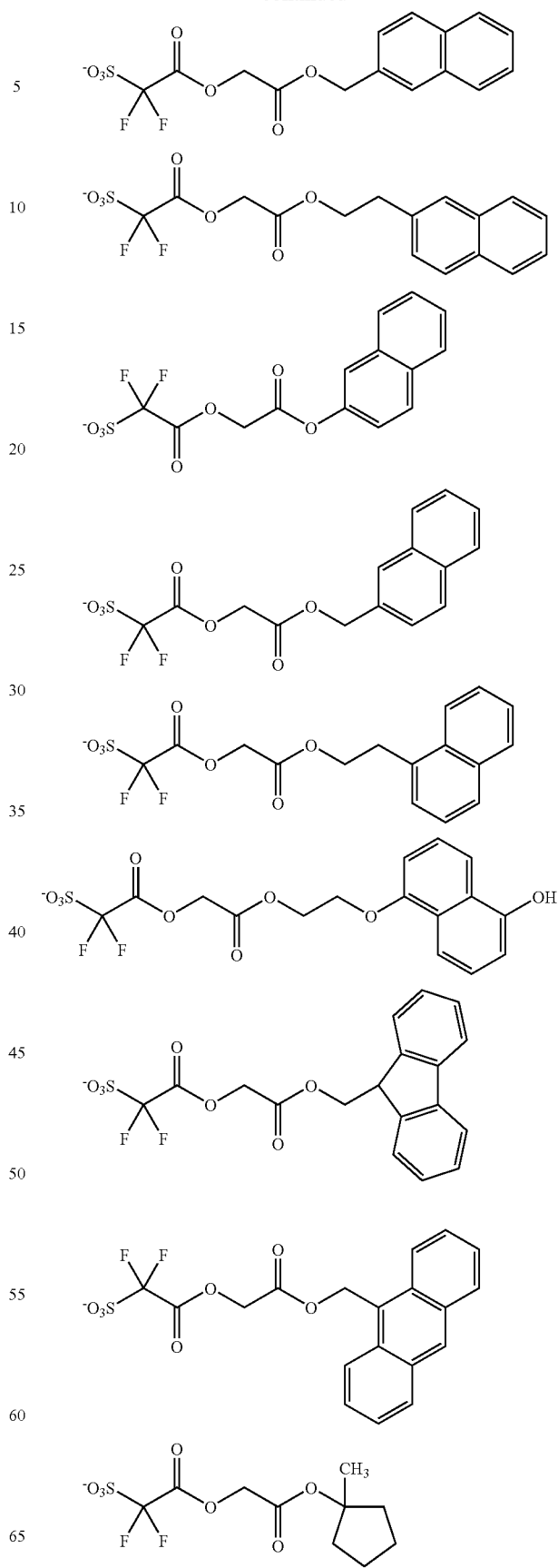

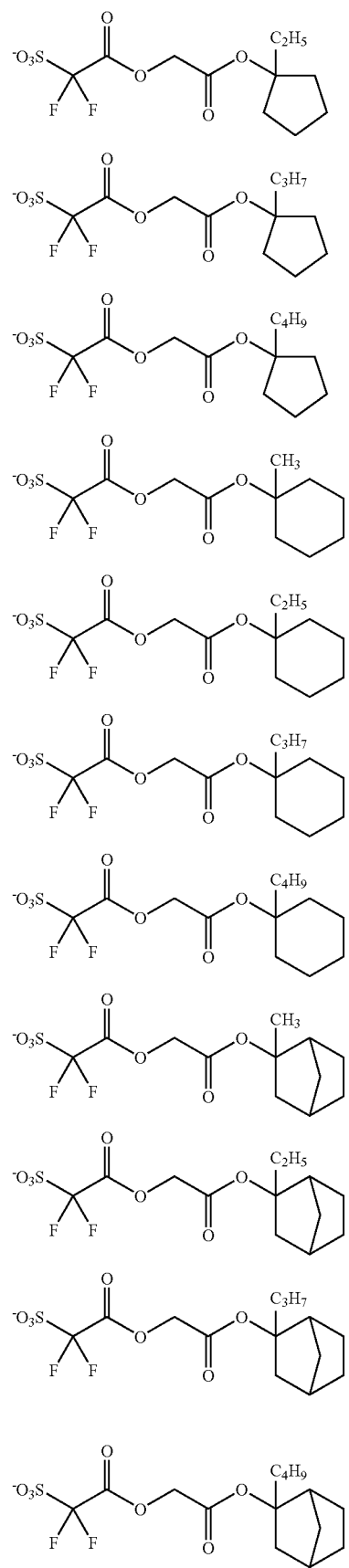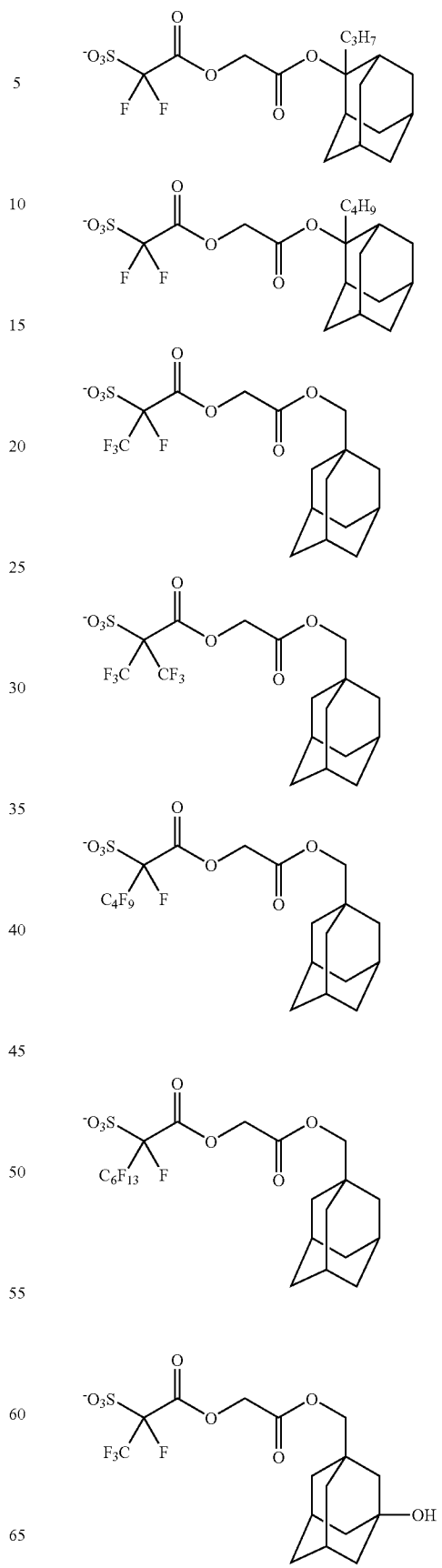

-continued
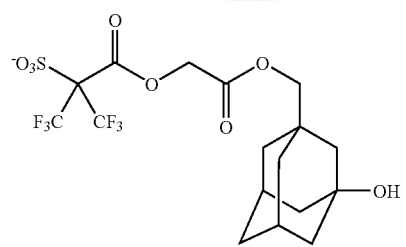
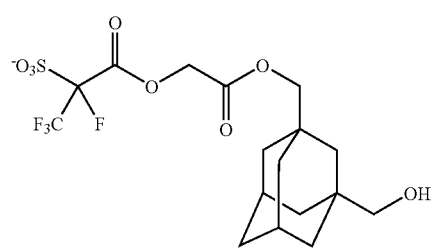
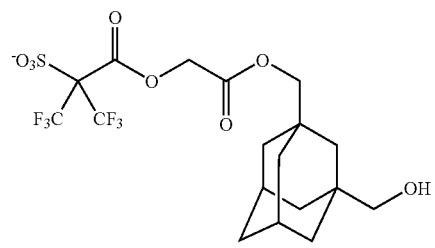
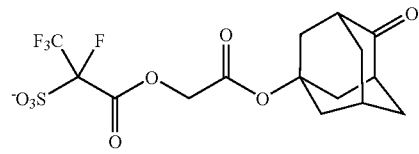
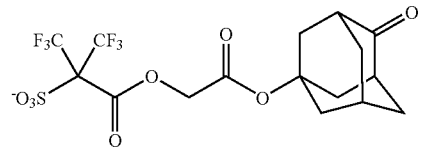
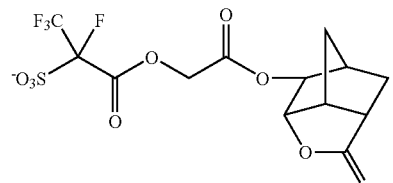
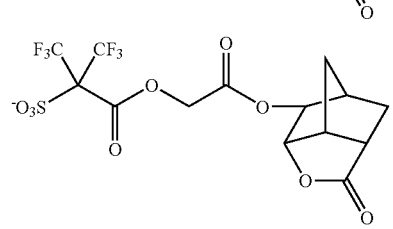
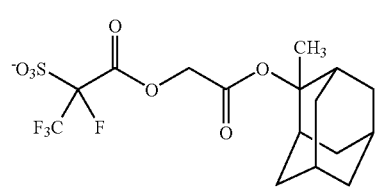
-continued
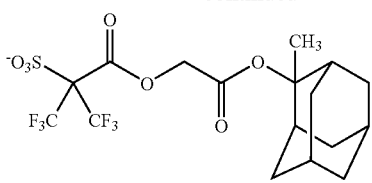
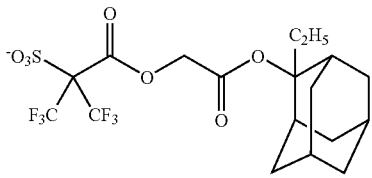
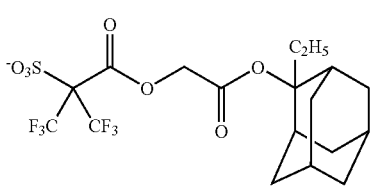
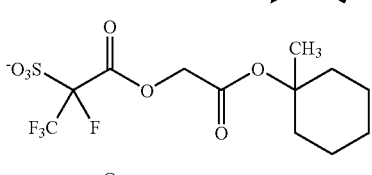
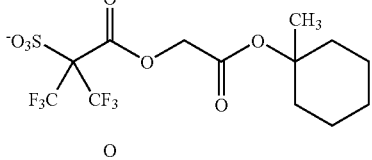
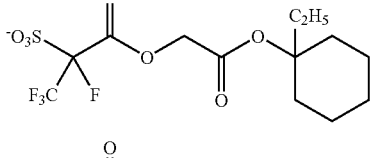
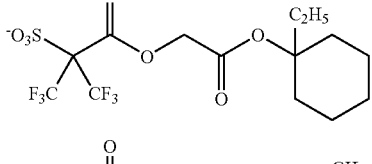
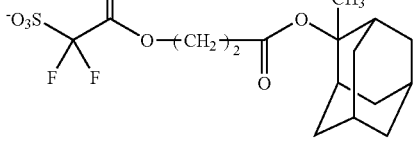
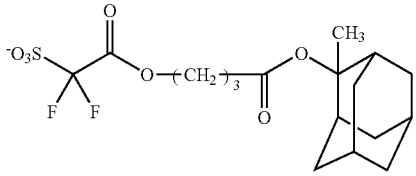
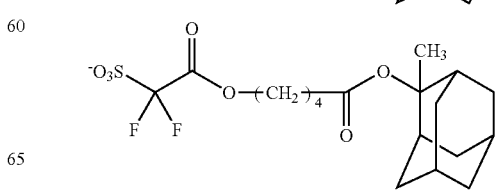

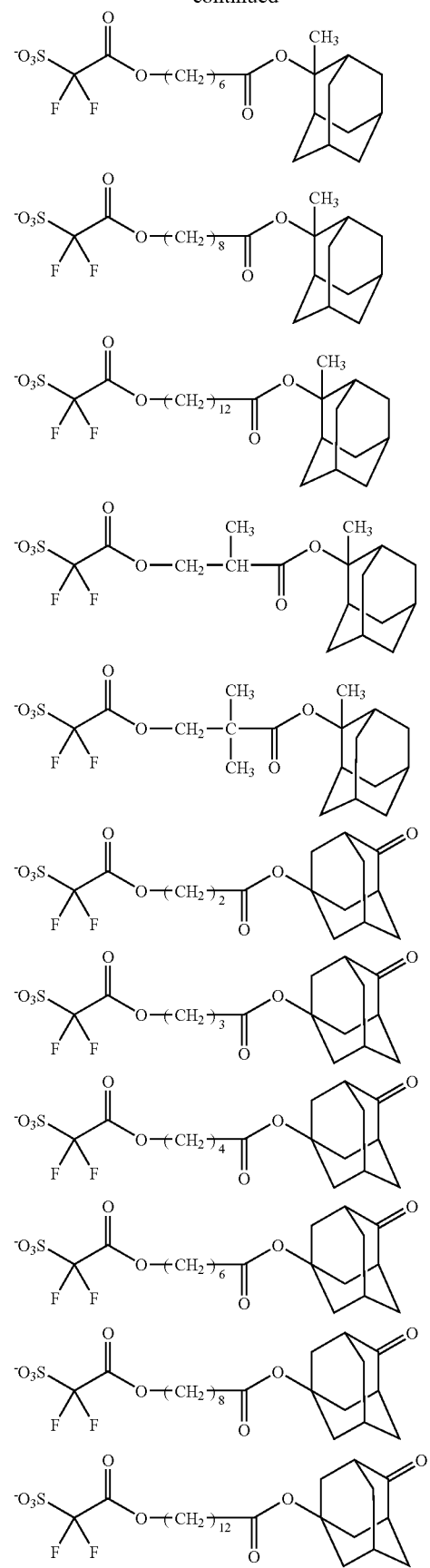
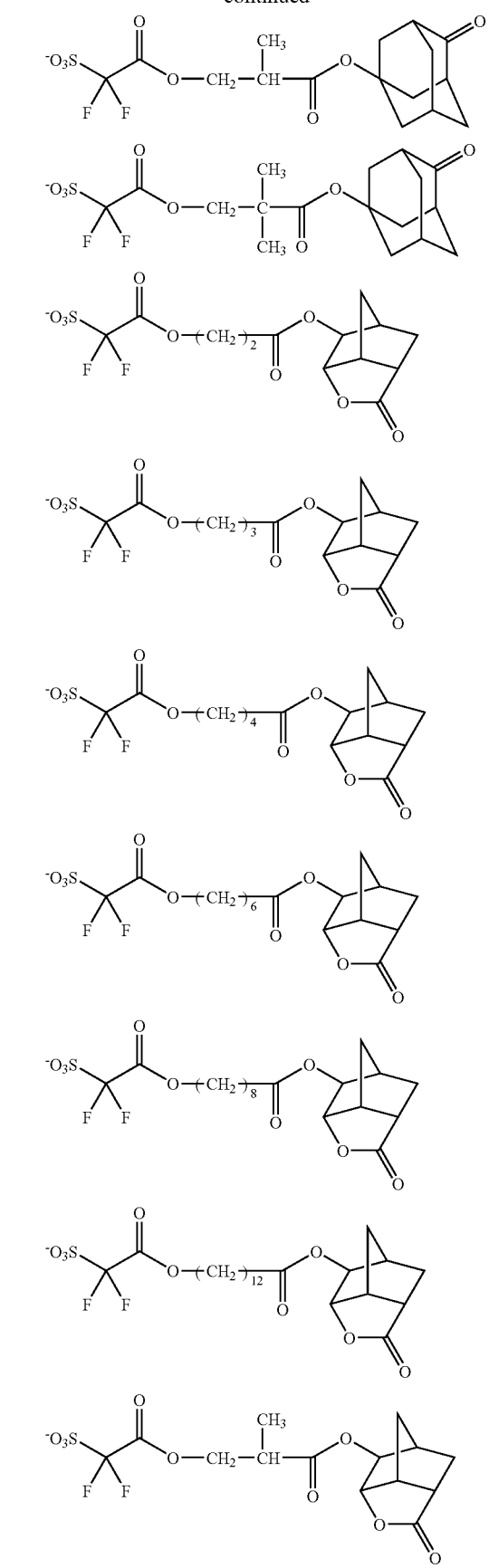

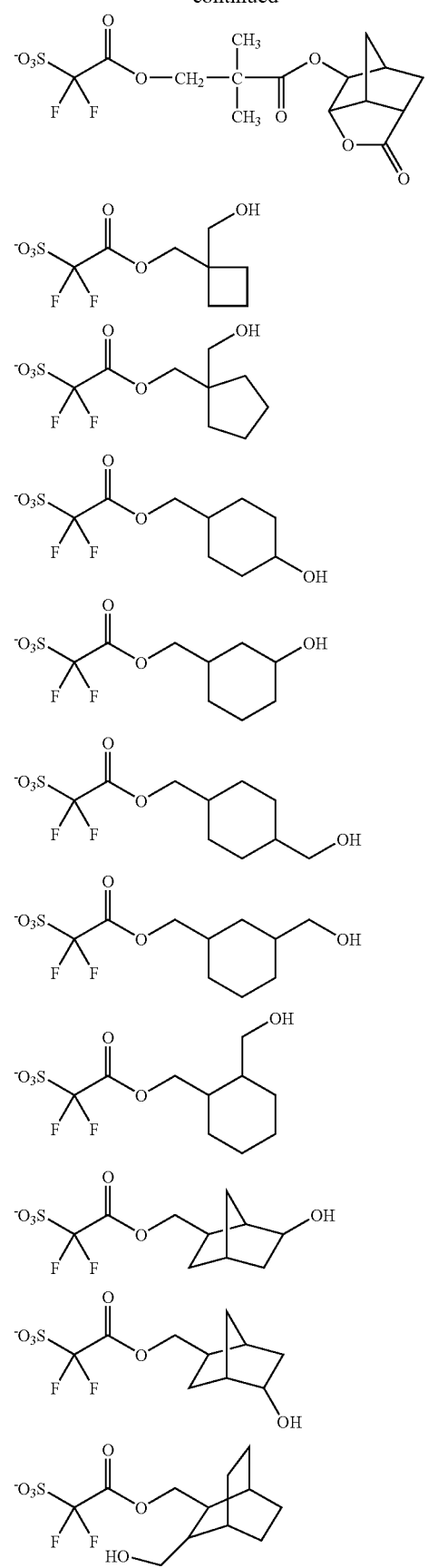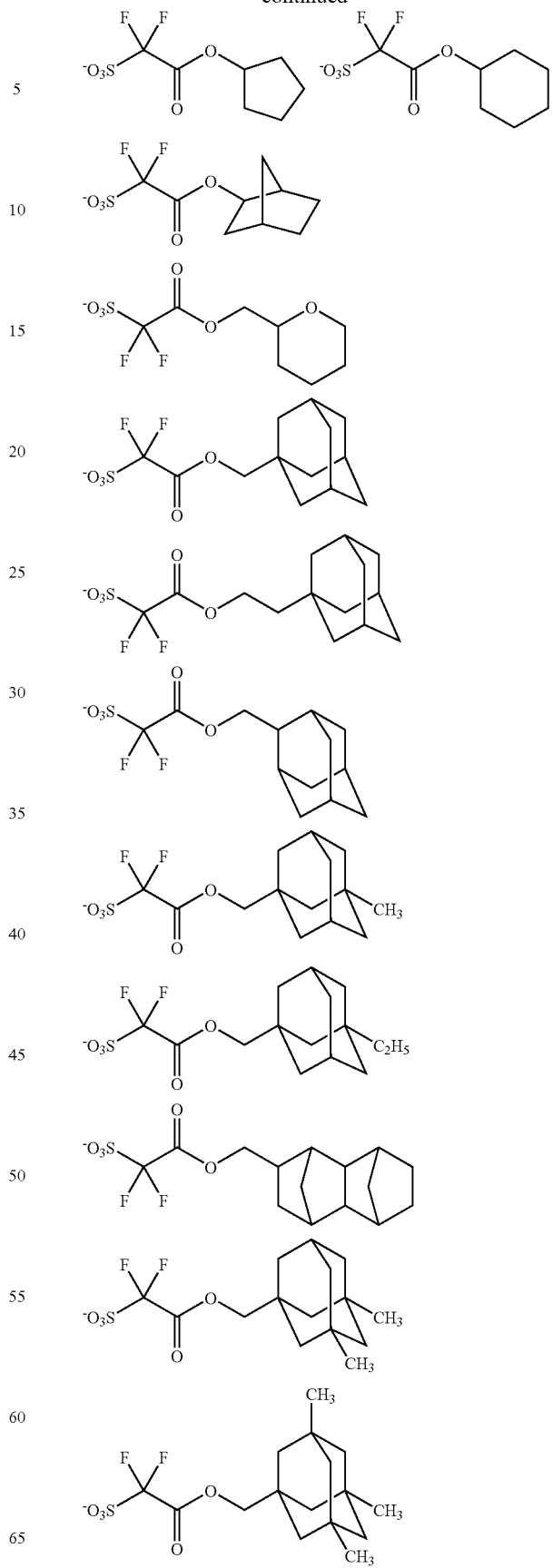

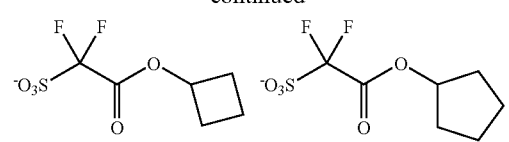
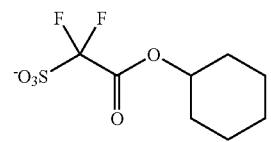
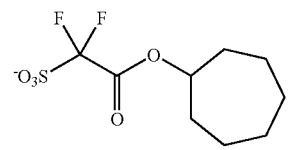
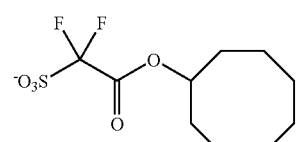
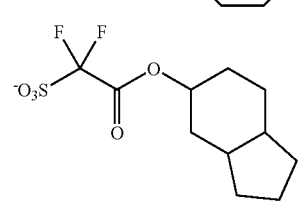
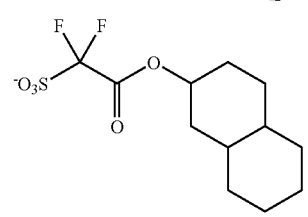
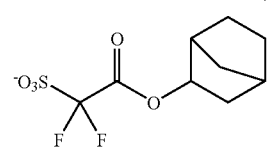
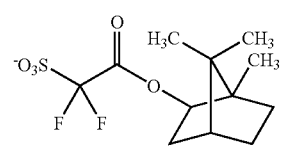
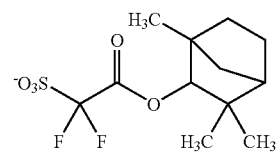
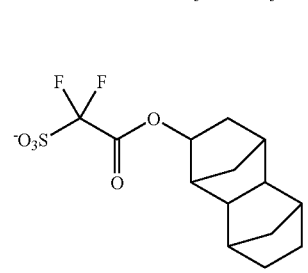
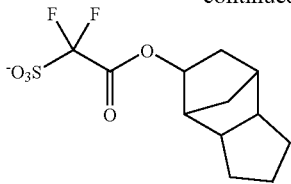
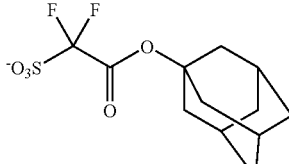
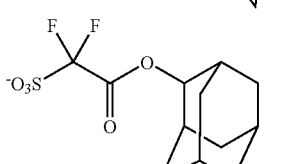
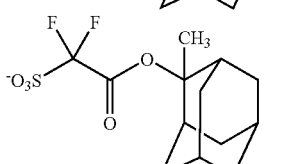
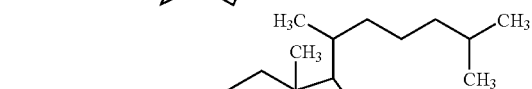
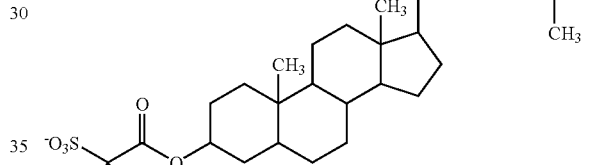
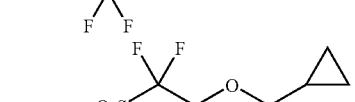
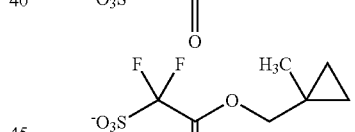
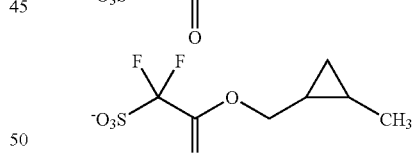
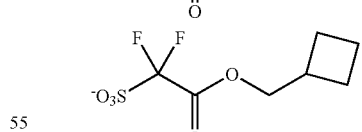
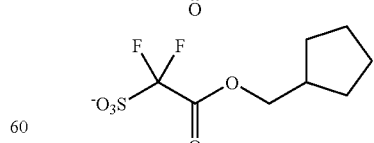
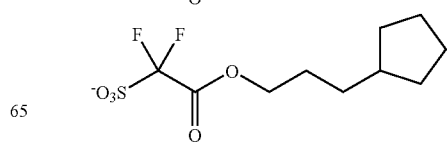

85
-continued
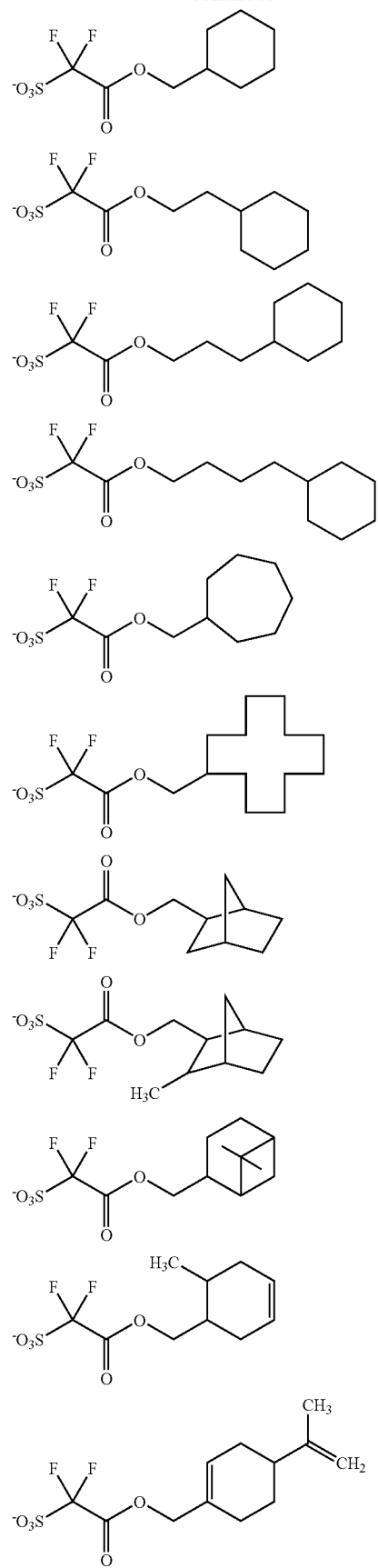
86
-continued
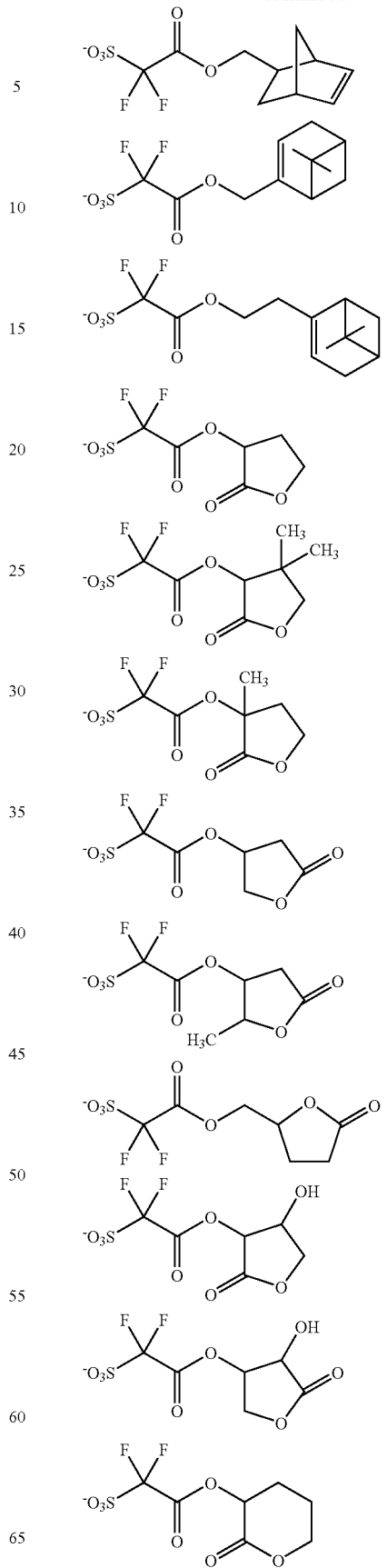

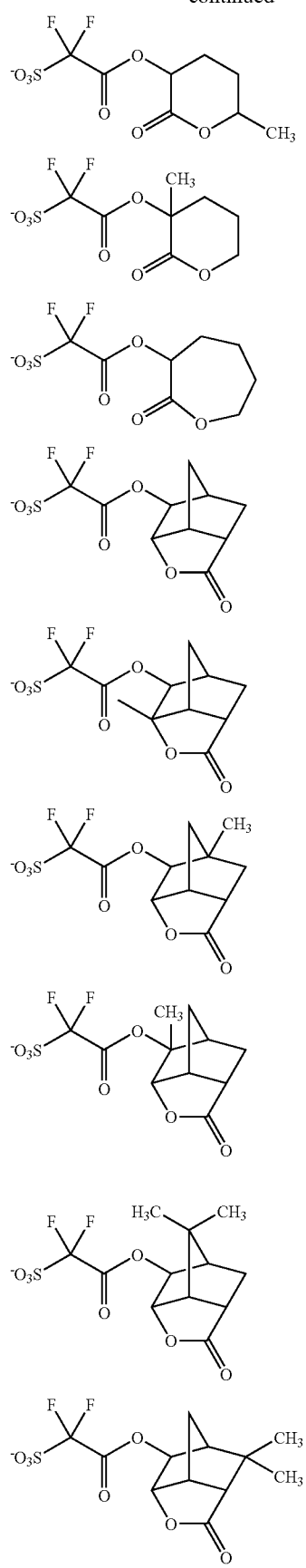
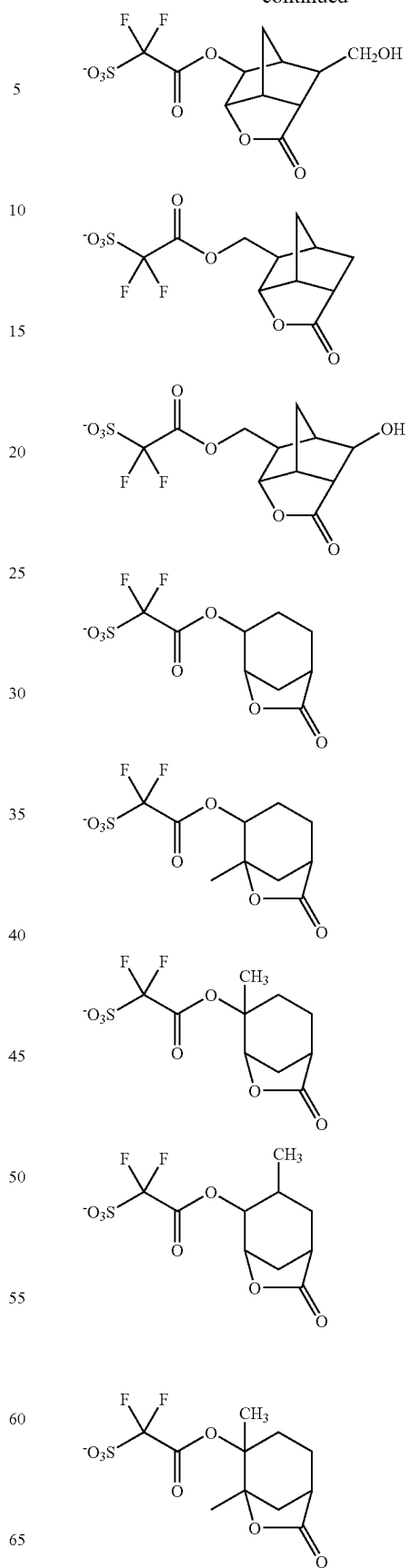

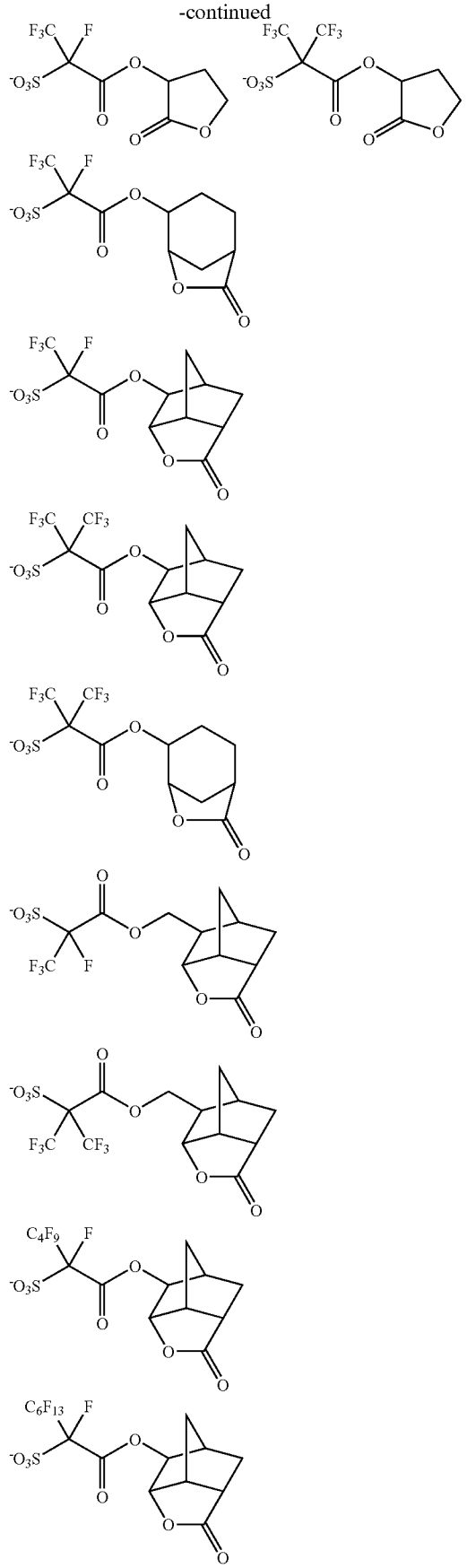
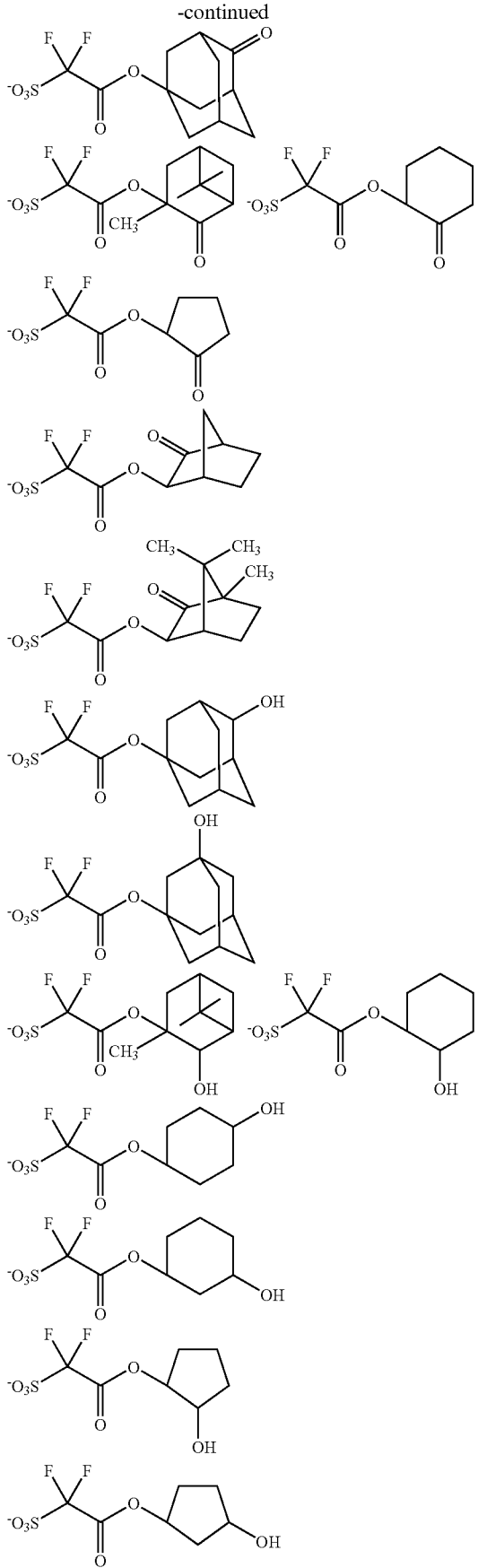

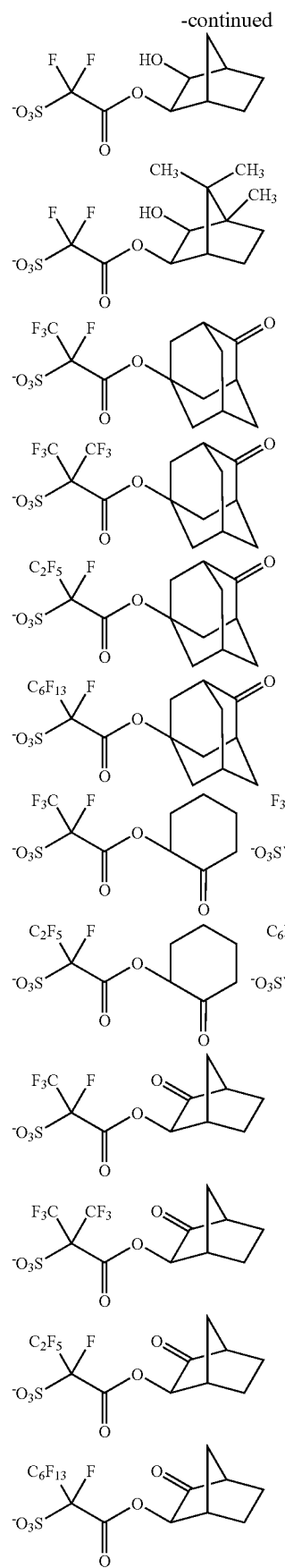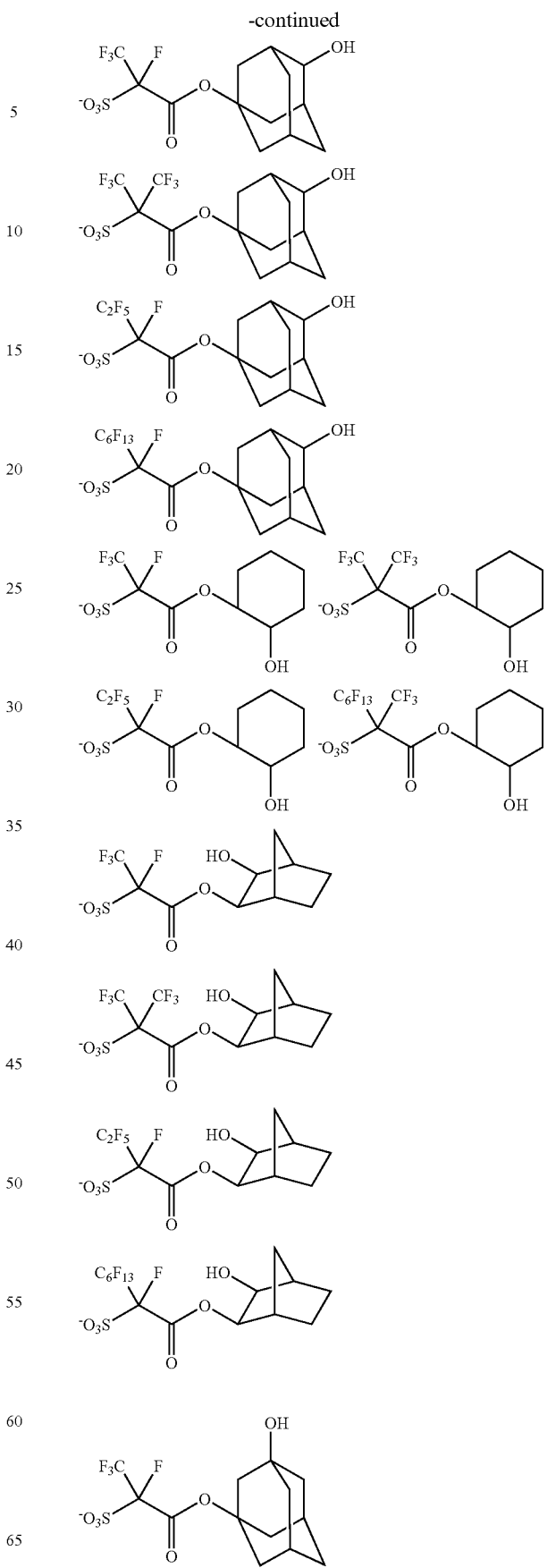

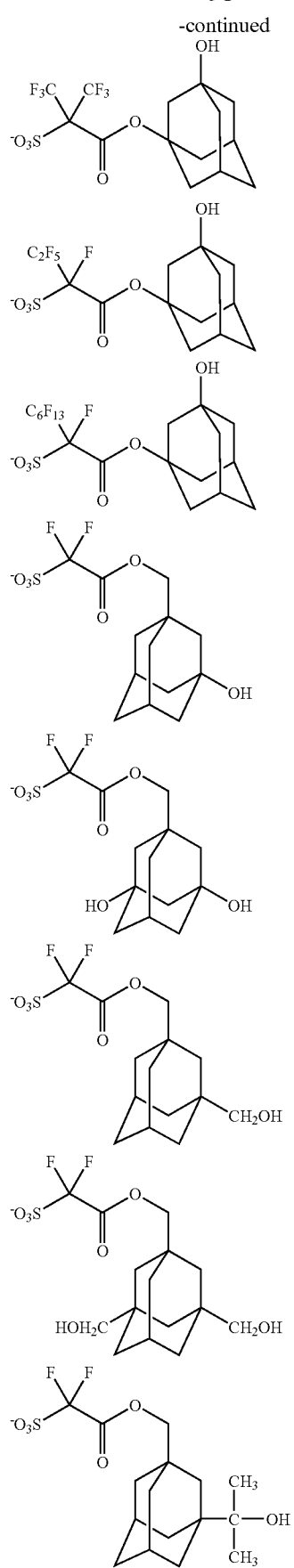
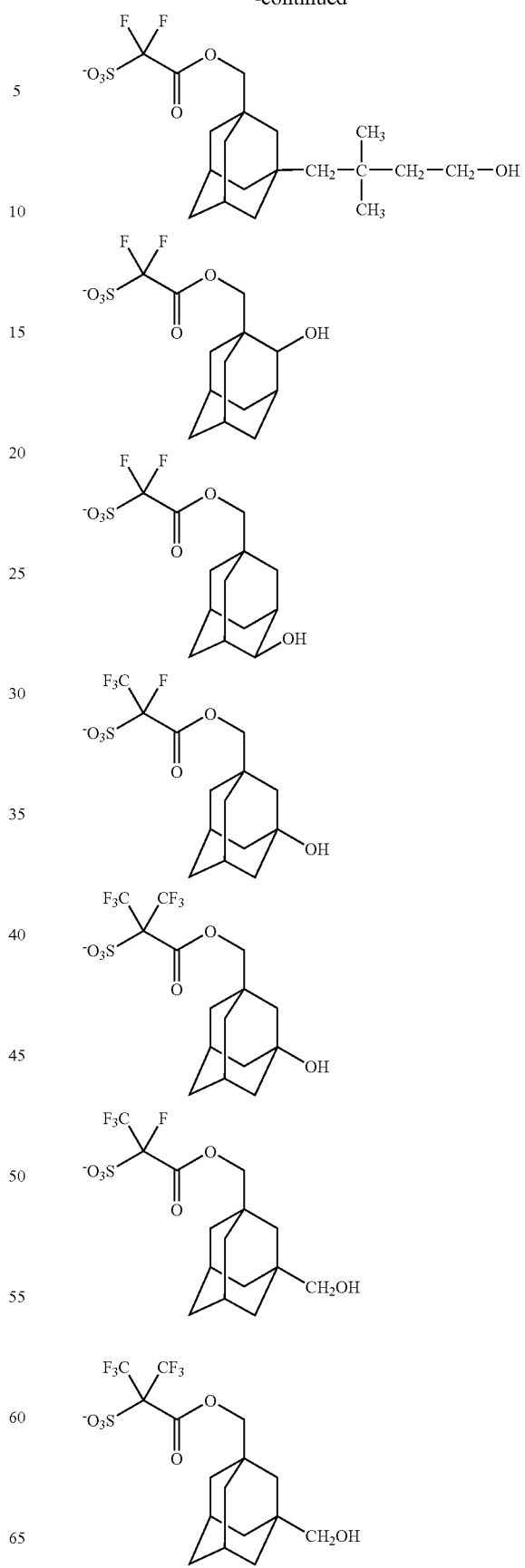

95
-continued
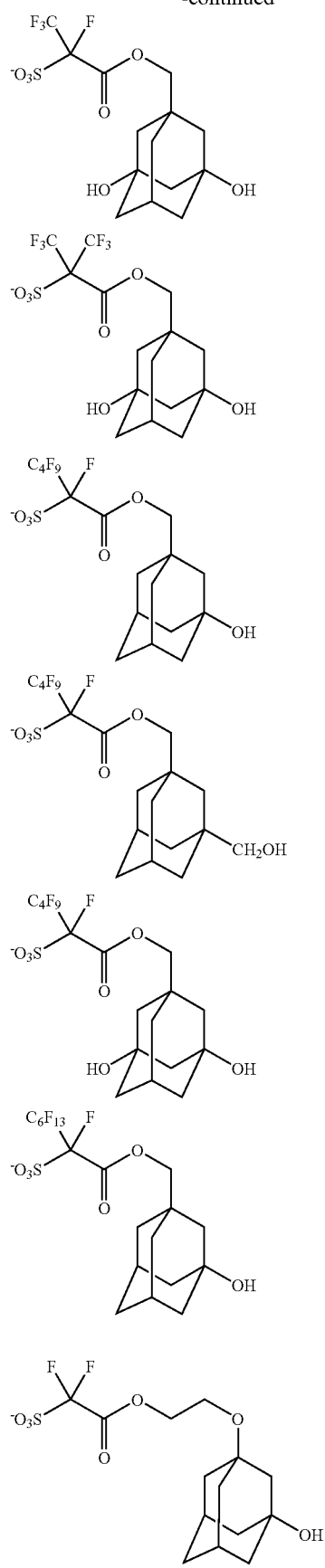
96
-continued
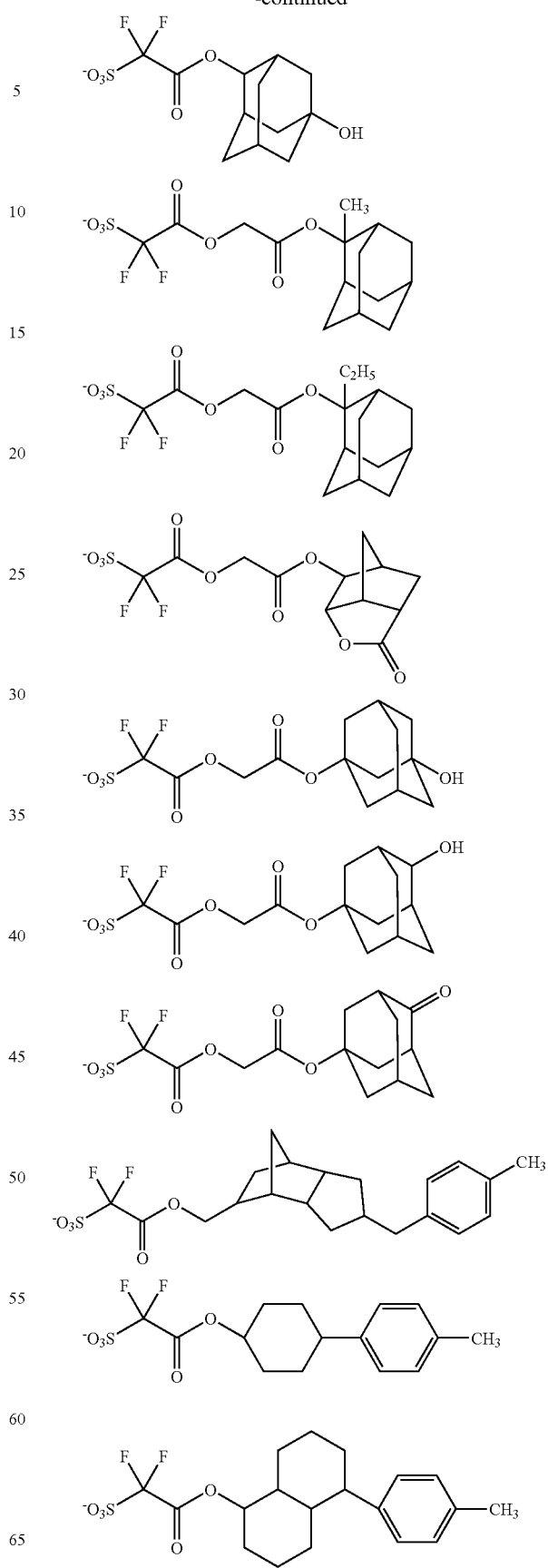

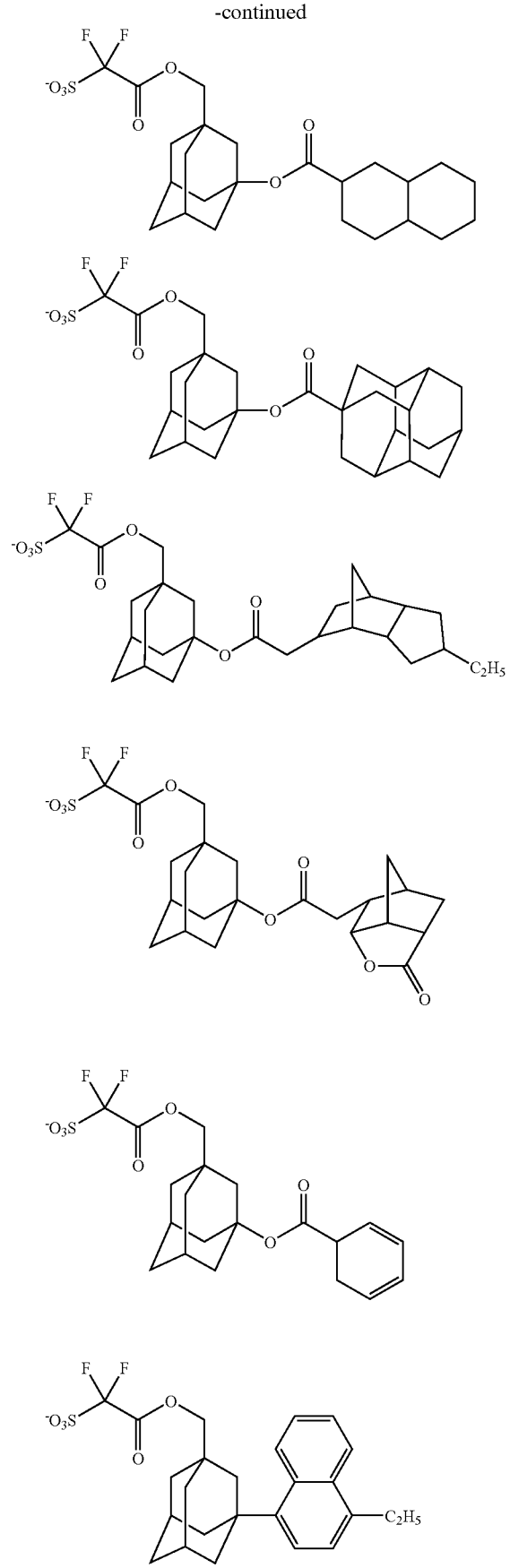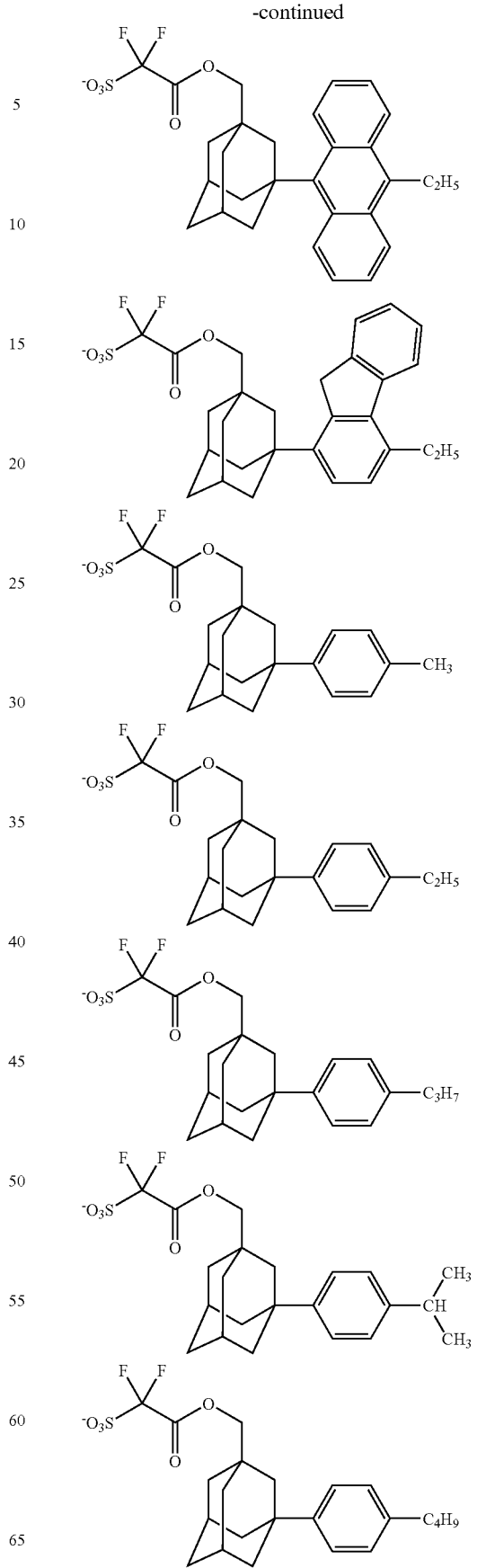

-continued
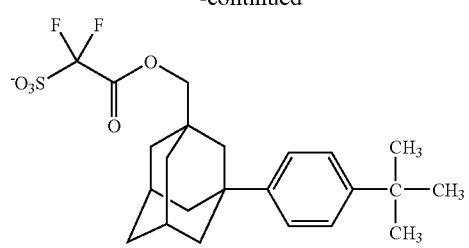
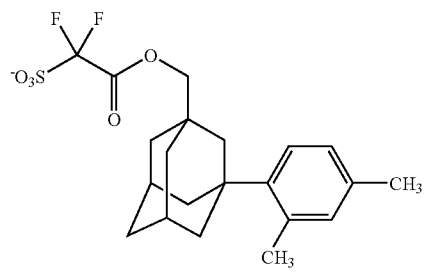
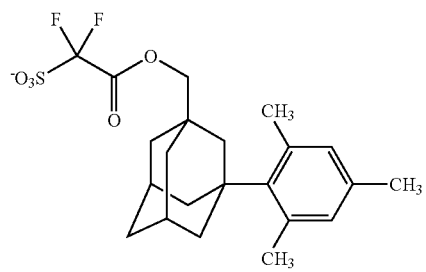
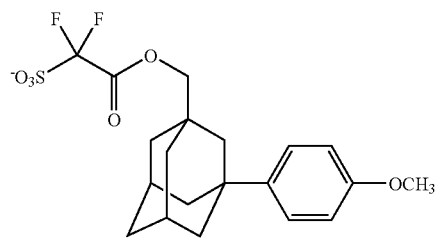
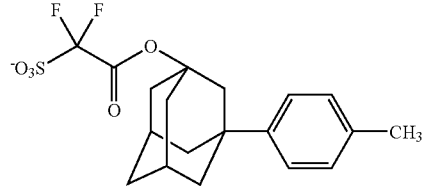
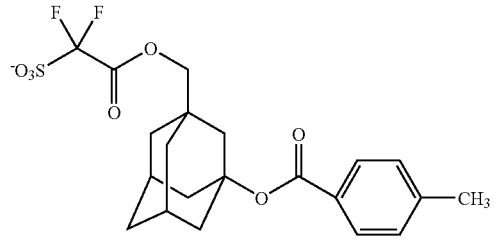
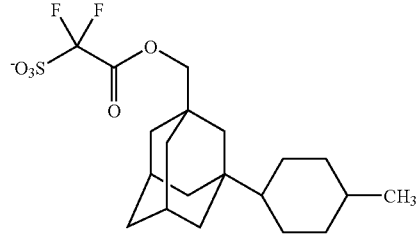
-continued
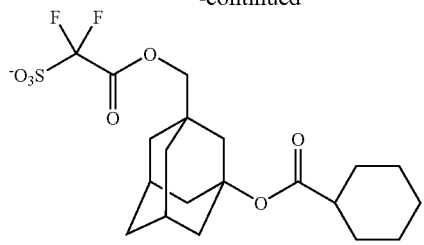
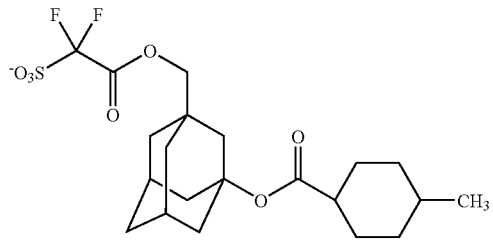
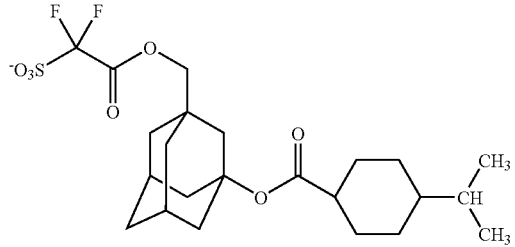
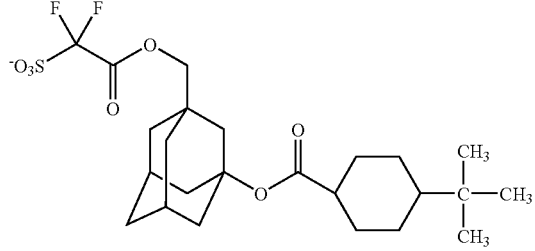
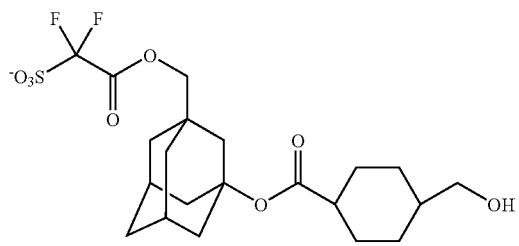
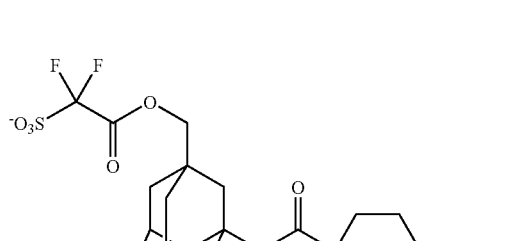
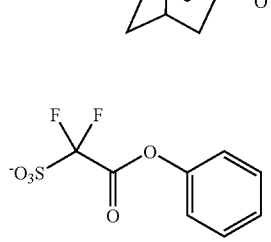

101
-continued
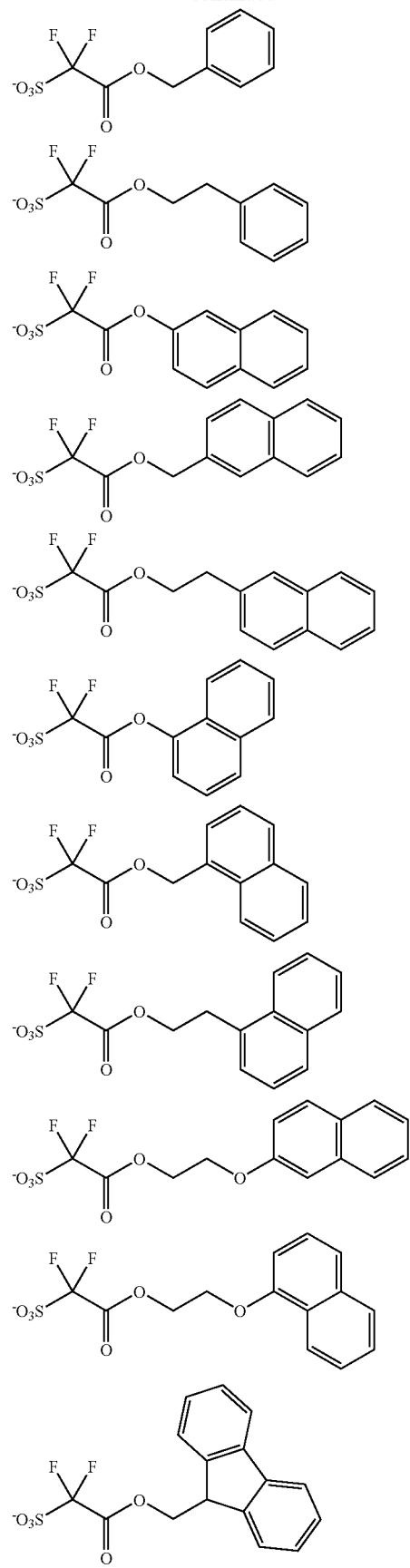
102
-continued
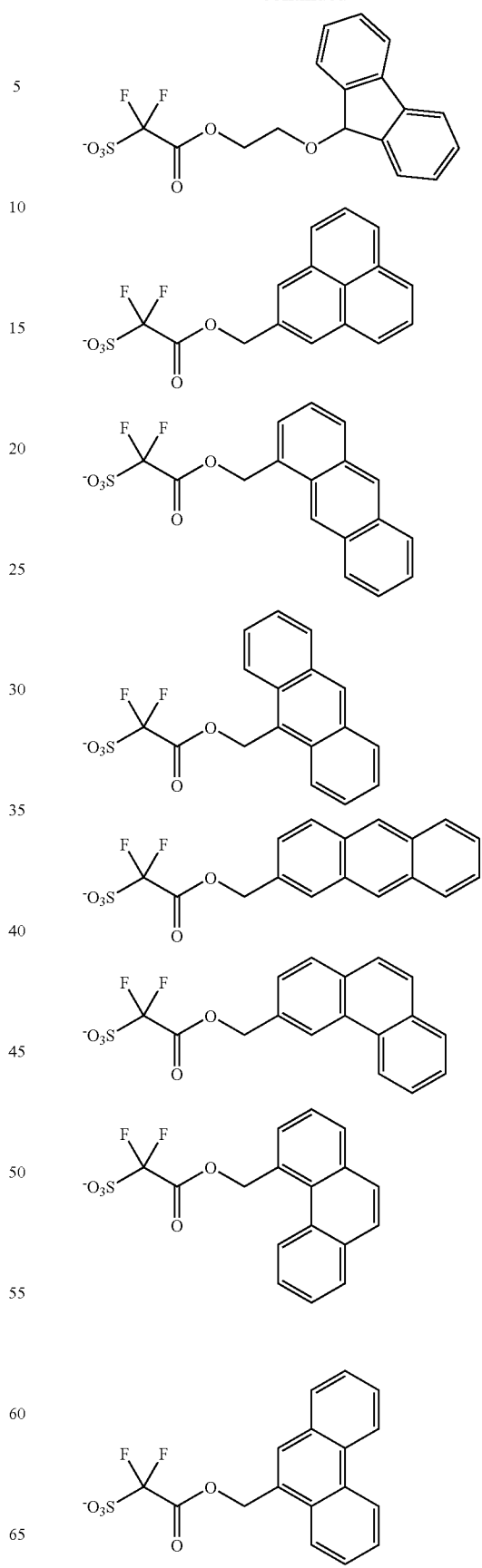

-continued

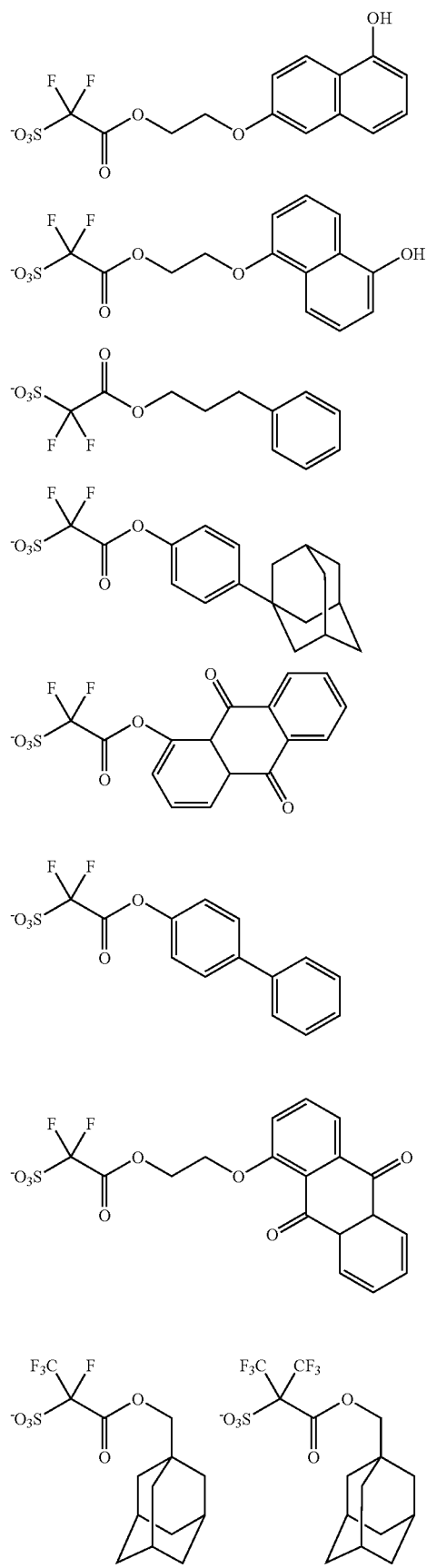

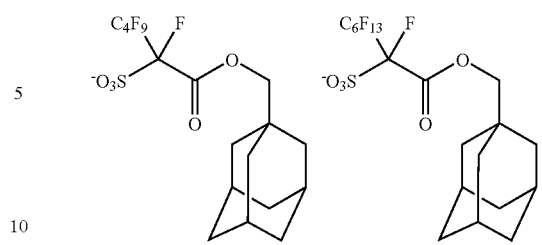

The anion part wherein $R^{12}$ is $-Z^{10}-X^3$ wherein $X^3$ represents a C3-C30 monocyclic or polycyclic hydrocarbon group optionally having a hydroxyl group or a carbonyl group, and at least one hydrogen atom in the monocyclic or polycyclic hydrocarbon group may be replaced with a C1-C6 alkyl group, a C1-C6 alkoxy group, a C1-C4 perfluoroalkyl group, a C1-C6 hydroxyalkyl group, a hydroxyl group or a cyano group and $Z^{10}$ represents a single bond or a C1-C4 alkylene group, is preferable.

Examples of the C3-C30 monocyclic or polycyclic hydrocarbon group optionally having a hydroxyl group or a carbonyl group include the same groups as described above. Examples of the C1-C6 alkyl group, the C1-C6 alkoxy group and the C1-C4 perfluoroalkyl group include the same groups as described above, respectively. Examples of the C1-C6 hydroxyalkyl group include a hydroxymethyl group, a 2-hydroxyethyl group, a 3-hydroxypropyl group, a 4-hydroxybutyl group and a 6-hydroxyhexyl group.

Examples of the C1-C4 alkylene group include a methylene group, an ethylene group, a trimethylene group and a tetramethylene group. $Z^{10}$ is preferably a single bond, a methylene group or an ethylene group, and is more preferably a single bond or a methylene group.

Preferable examples of the anion part include the followings:

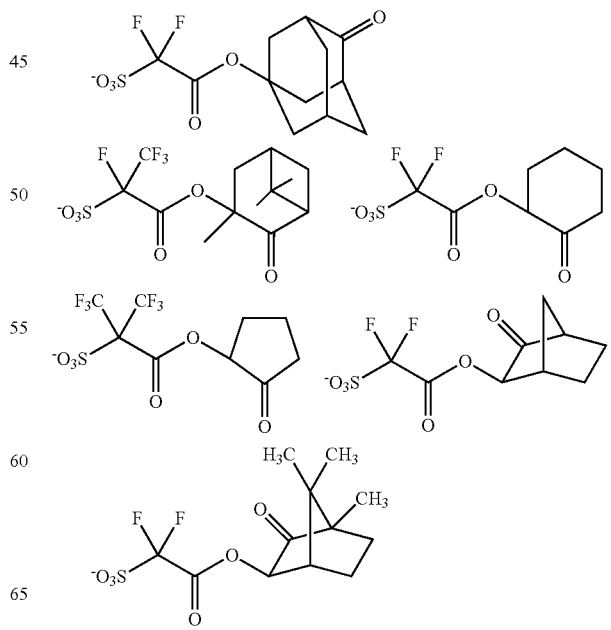

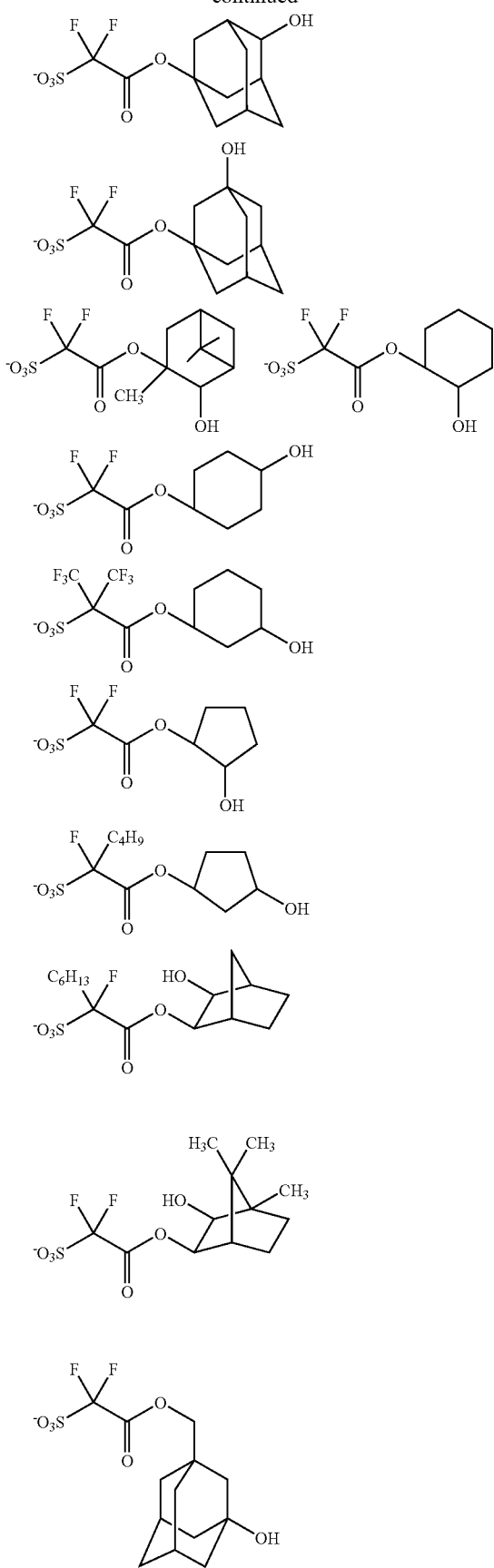

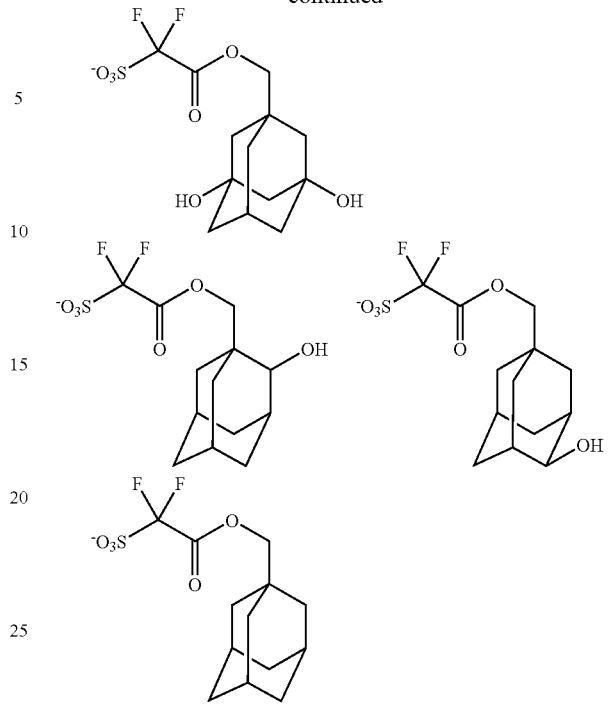

Other examples of the acid generator include a salt represented by the formula (Va):

$$A^+ \, ^-O_3S-R^{30} \quad \text{(Va)}$$

wherein $A^+$ is the same meaning as defined above and $R^{30}$ represents a C1-C6 linear or branched chain perfluoroalkyl group (hereinafter, simply referred to as the salt (Va)).

Specific examples of the anion part of the salt (Va) include a trifluoromethanesulfonate anion, a pentafluoroethanesulfonate anion, a heputafluoropropanesulfonate anion and a nonafluorobutanesulfonate anion.

$A^+$ represents an organic counter ion. Examples of the organic counter ion include a cation represented by the formula (IXz):

(IXz)

a cation represented by the formula (Ixb):

(IXb)

a cation represented by the formula (IXc):

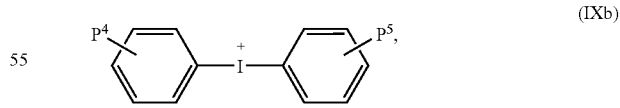

(IXc)

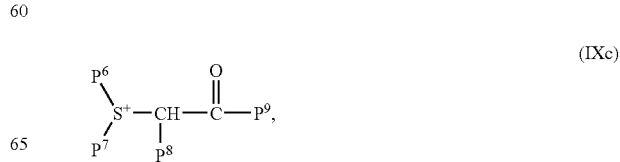

and a cation represented by the formula (IXd):

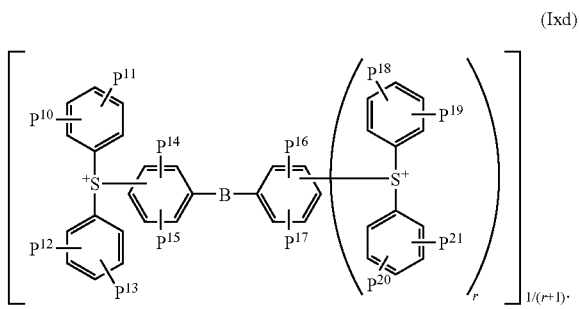

In the cation represented by the formula (IXz), $P^a$, $P^b$ and $P^c$ each independently represents a C1-C30 alkyl group which may be substituted with at least one selected from the group consisting of a hydroxyl group and a C1-C12 alkoxy group, or a C3-C30 cyclic hydrocarbon group which may be substituted with at least one selected from the group consisting of a hydroxyl group and a C1-C12 alkoxy group.

Examples of the C1-C30 alkyl group in the formula (IXz) include a methyl group, an ethyl group, an n-propyl group, an isopropyl group, an n-butyl group, an isobutyl group, a sec-butyl group, a tert-butyl group, an n-pentyl group, an n-hexyl group, an n-octyl group and a 2-ethylhexyl group. Examples of the C1-C12 alkoxy group in the formula (IXz) include a methoxy group, an ethoxy group, an n-propoxy group, an isopropoxy group, an n-butoxy group, an isobutoxy group, a sec-butoxy group, a tert-butoxy group, an n-pentyloxy group, an n-hexyloxy group, an n-octyloxy group and a 2-ethylhexyloxy group. Examples of the C3-C30 cyclic hydrocarbon group include a cyclopentyl group, a cyclohexyl group, a 1-adamantyl group, a 2-adamantyl group, a bicyclohexyl group, a phenyl group, a 2-methylphenyl group, a 4-methylphenyl group, a 4-ethylphenyl group, a 4-isopropylphenyl group, a 4-tert-butylphenyl group, a 2,4-dimethylphenyl group, a 2,4,6-trimethylphenyl group, a 4-n-hexylphenyl group, a 4-n-octylphenyl group, a 1-naphthyl group, a 2-naphthyl group, a fluorenyl group and a biphenyl group.

In the formula (IXb), $P^4$ and $P^5$ each independently represents a hydrogen atom, a hydroxyl group, a C1-C12 alkyl group or a C1-C12 alkoxy group. Examples of the C1-C12 alkyl group in the formula (IXb) include a methyl group, an ethyl group, an n-propyl group, an isopropyl group, an n-butyl group, an isobutyl group, a sec-butyl group, a tert-butyl group, an n-pentyl group, an n-hexyl group, an n-octyl group and a 2-ethylhexyl group, and examples of the C1-C12 alkoxy group in the formula (IXb) include the same groups as mentioned in the above formula (IXz).

In the formula (IXc), $P^6$ and $P^7$ each independently represents a C1-C12 alkyl group or a C3-C12 cycloalkyl group, or $P^6$ and $P^7$ bond to form a C3-C12 divalent hydrocarbon group which forms a ring together with the adjacent $S^+$, and at least one —$CH_2$— in the divalent hydrocarbon group may be replaced with —CO—, —O— or —S—, $P^8$ represents a hydrogen atom, $P^9$ represents a C1-C12 alkyl group, a C3-C12 cycloalkyl group or an aromatic group optionally substituted, or $P^8$ and $P^9$ bond to form a divalent hydrocarbon group which forms a 2-oxocycloalkyl group together with the adjacent —CHCO—, and at least one —$CH_2$— in the divalent hydrocarbon group may be replaced with —CO—, —O— or —S—.

Examples of the C1-C12 alkyl group in the formula (IXc) include the same groups as mentioned in the above formula (IXb) and examples of the C3-C12 cycloalkyl group in the formula (IXc) include a cyclopropyl group, a cyclobutyl group, a cyclopentyl group, a cyclohexyl group, a cycloheptyl group, a cyclooctyl group and a cyclodecyl group. Examples of the C3-C12 divalent hydrocarbon group formed by bonding $P^6$ and $P^7$ include a trimethylene group, a tetramethylene group, a pentamethylene group and examples of the ring group together with the adjacent $S^+$ and the divalent hydrocarbon group include a tetramethylenesulfonio group, a pentamethylenesulfonio group and an oxybisethylenesulfonio group.

Examples of the aromatic group in the formula (IXc) include a phenyl group, a tolyl group, a xylyl group and a naphthyl group. Examples of the divalent hydrocarbon group formed by bonding $P^8$ and $P^9$ include a methylene group, an ethylene group, a trimethylene group, a tetramethylene group and a pentamethylene group and examples of the 2-oxocycloalkyl group formed by bonding $P^8$ and $P^9$ together with the adjacent —CHCO— include a 2-oxocyclopentyl group and a 2-oxocyclohexyl group.

In the formula (IXd), $P^{10}$ $P^{11}$ $P^{12}$ $P^{13}$ $P^{14}$ $P^{15}$ $P^{16}$ $P^{17}$ $P^{18}$ $P^{19}$ $P^{20}$ and $P^{21}$ each independently represents a hydrogen atom, a hydroxyl group, a C1-C12 alkyl group or a C1-C12 alkoxy group, B represents a sulfur or oxygen atom and r represents 0 or 1.

Examples of the C1-C12 alkyl group in the formula (IXd) include the same groups as mentioned in the above formula (IXb) and examples of the C1-C12 alkoxy groups in the formula (IXd) include the same groups as mentioned in the above formula (IXz).

Examples of the cation represented by the formula (IXz) include the followings:

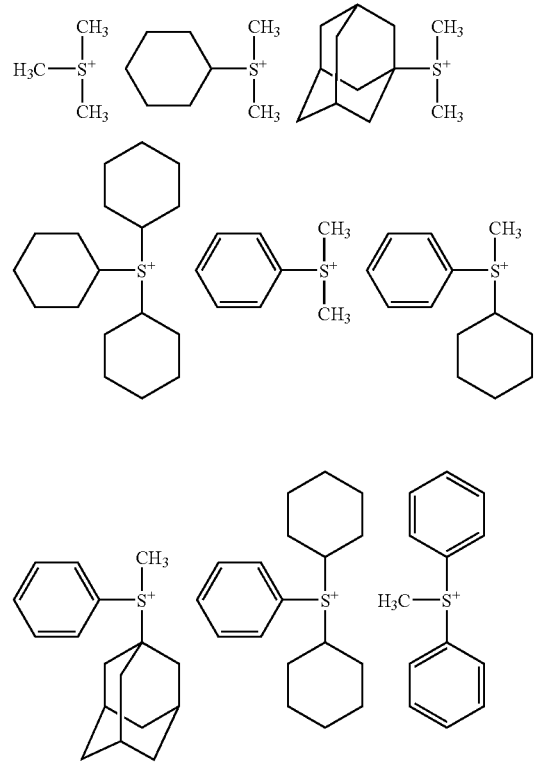

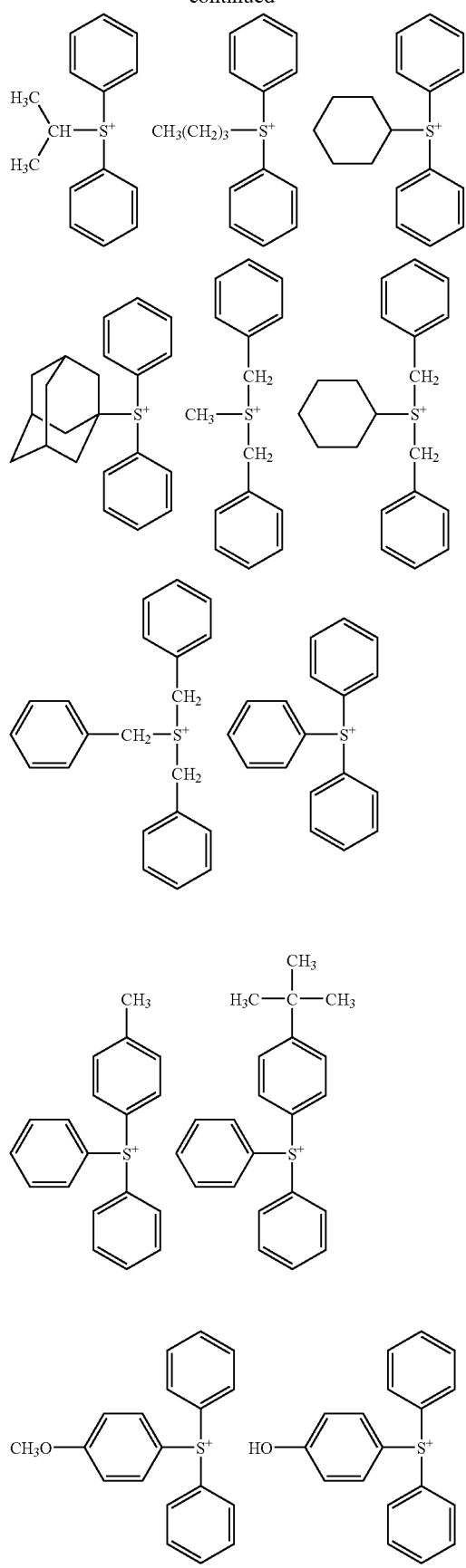
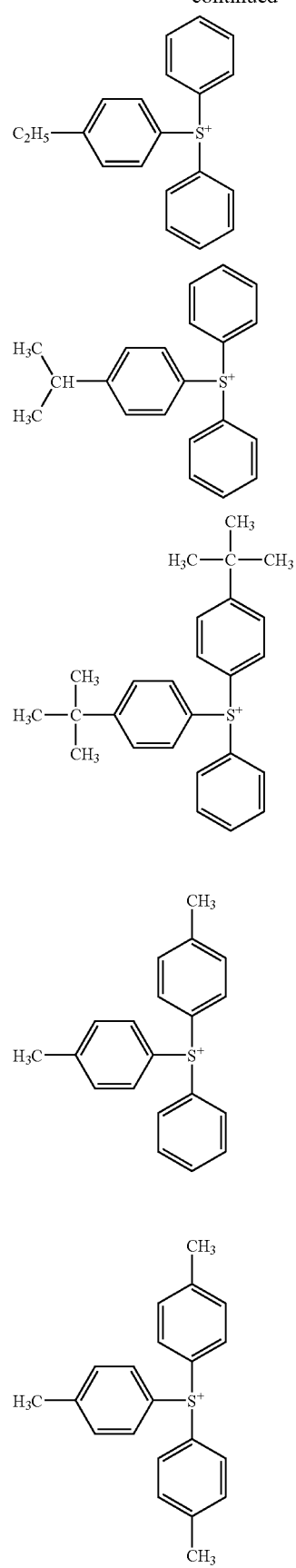

111
-continued

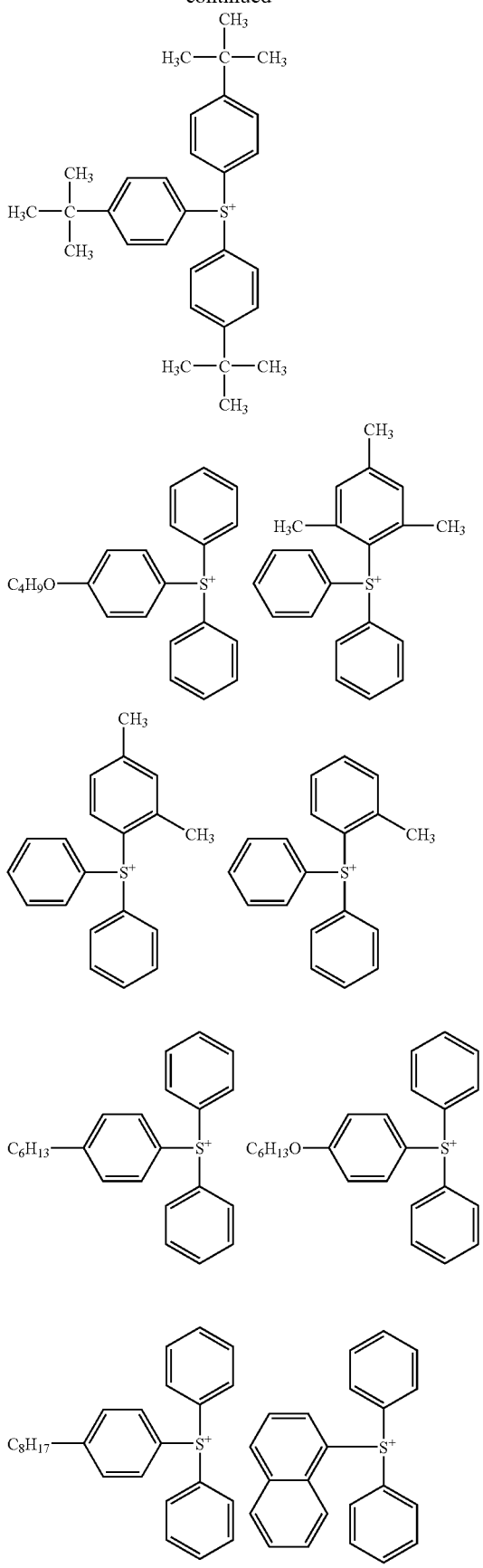

112
-continued

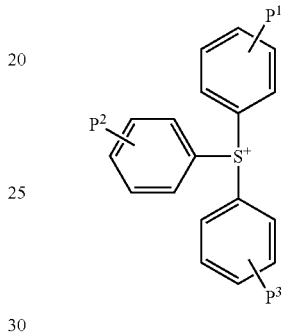

In the organic cation represented by the formula (IXz), a cation represented by the formula (IXa):

(IXa)

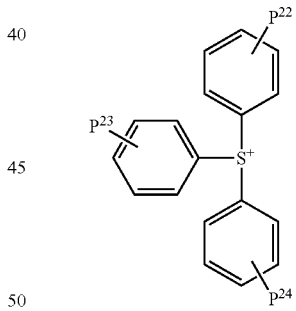

wherein $P^1$, $P^2$ and $P^3$ each independently represents a hydrogen atom, a hydroxyl group, a C1-C12 alkyl group or a C1-C12 alkoxy group, is preferable.

In the cation represented by the formula (IXa), a cation of the formula (IXe):

(IXe)

wherein $P^{22}$, $P^{23}$ and $P^{24}$ each independently represents a hydrogen atom or a C1-C4 alkyl group, is preferable.

In the formula (IXa), $P^1$, $P^2$ and $P^3$ each independently represent a hydrogen atom, a hydroxyl group, a C1-C12 alkyl group or a C1-C12 alkoxy group, and examples of the C1-C12 alkyl group include the same groups as mentioned in the above formula (IXb) and examples of the C1-C12 alkoxy group include the same groups as mentioned in the above formula (IXz).

In the formula (IXe), $P^{22}$, $P^{23}$ and $P^{24}$ each independently represents a hydrogen atom or a C1-C4 alkyl group, and examples of the C1-C4 alkyl group include a methyl group, an ethyl group, an n-propyl group, an isopropyl group, an n-butyl group, an isobutyl group, a sec-butyl group and a tert-butyl group.

Examples of the cation represented by the formula (IXb) include the followings:
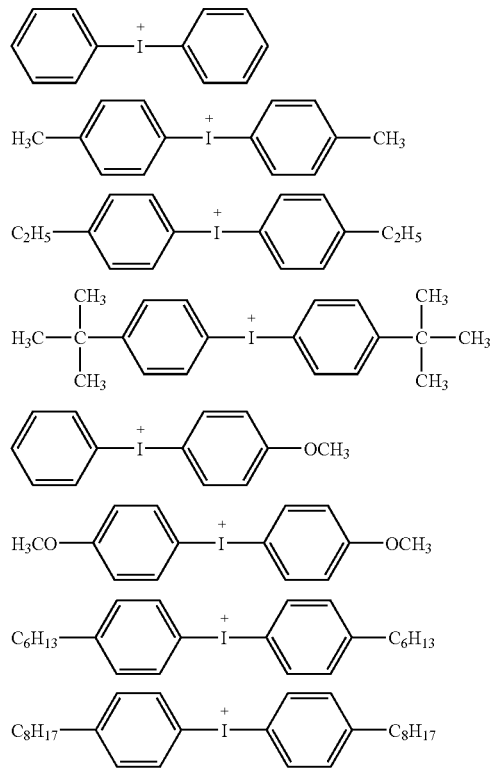
Examples of the cation represented by the formula (IXc) include the followings:
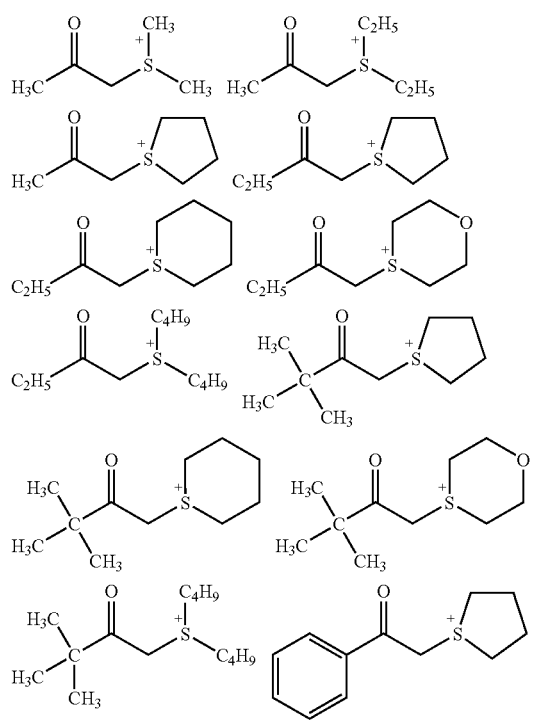
-continued
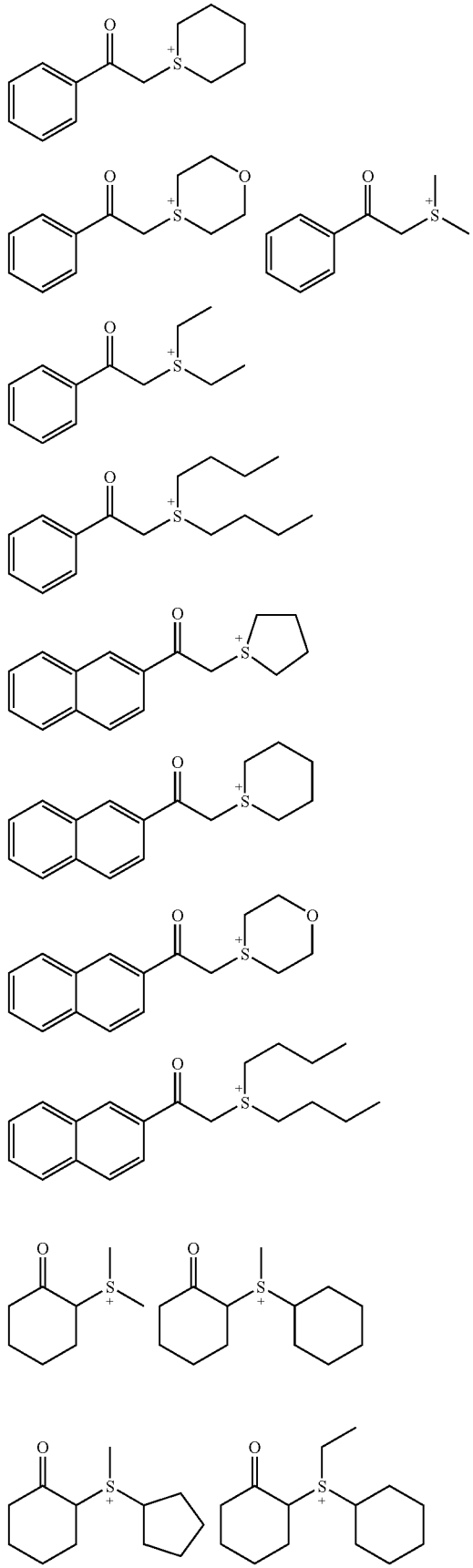

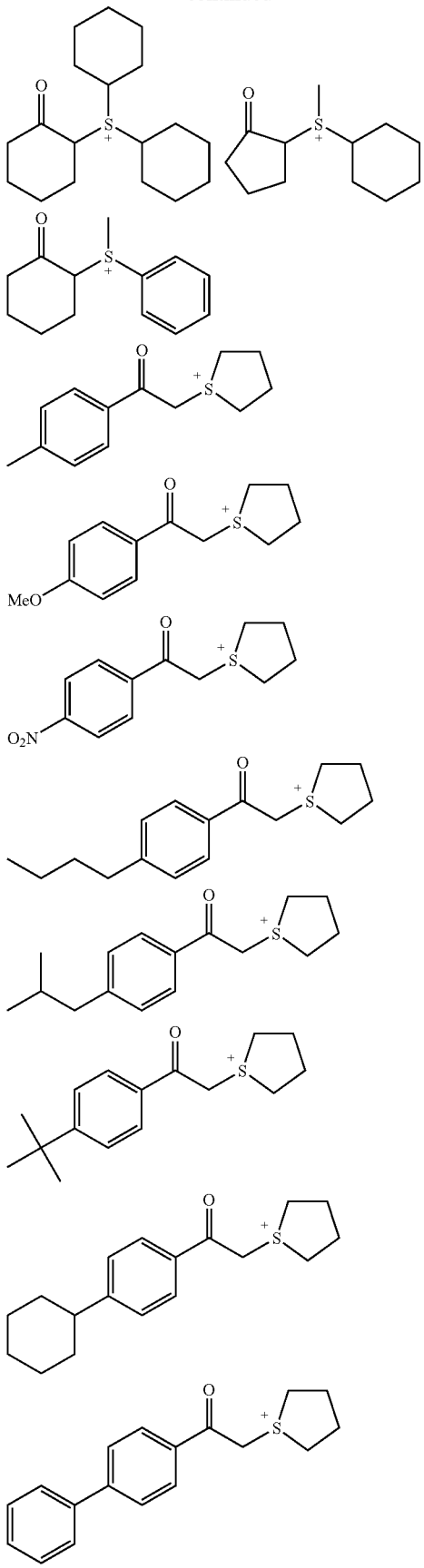
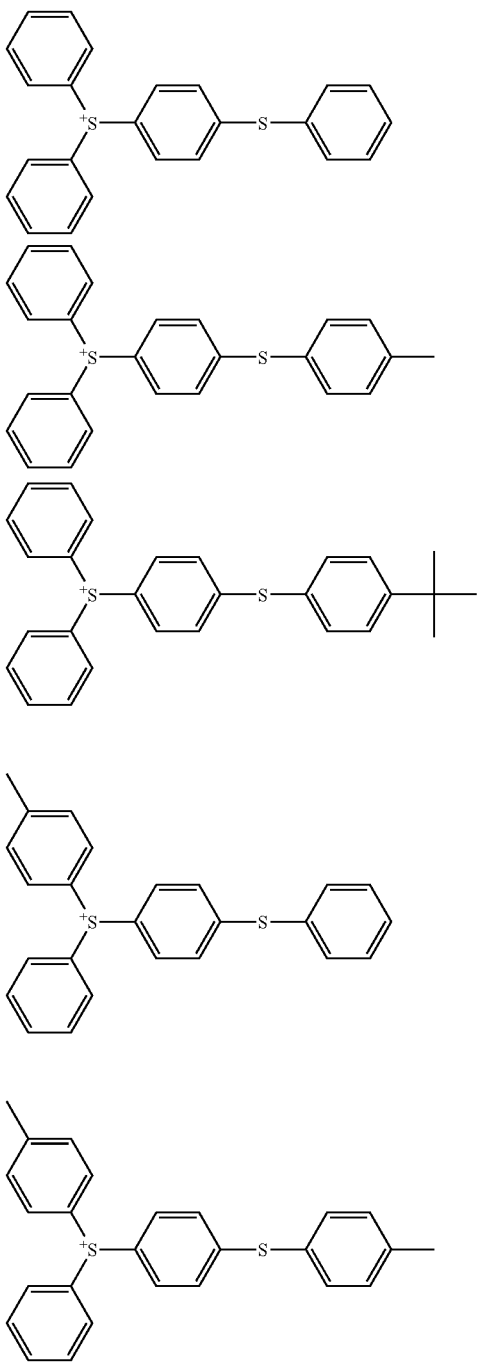
Examples of the cation represented by the formula (IXd) include the followings:

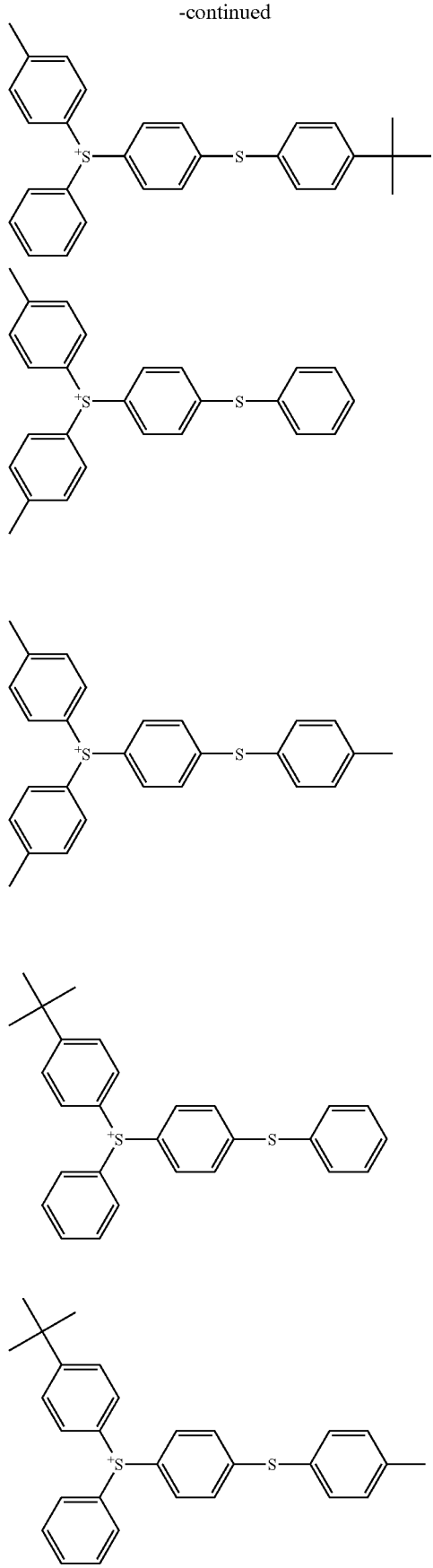
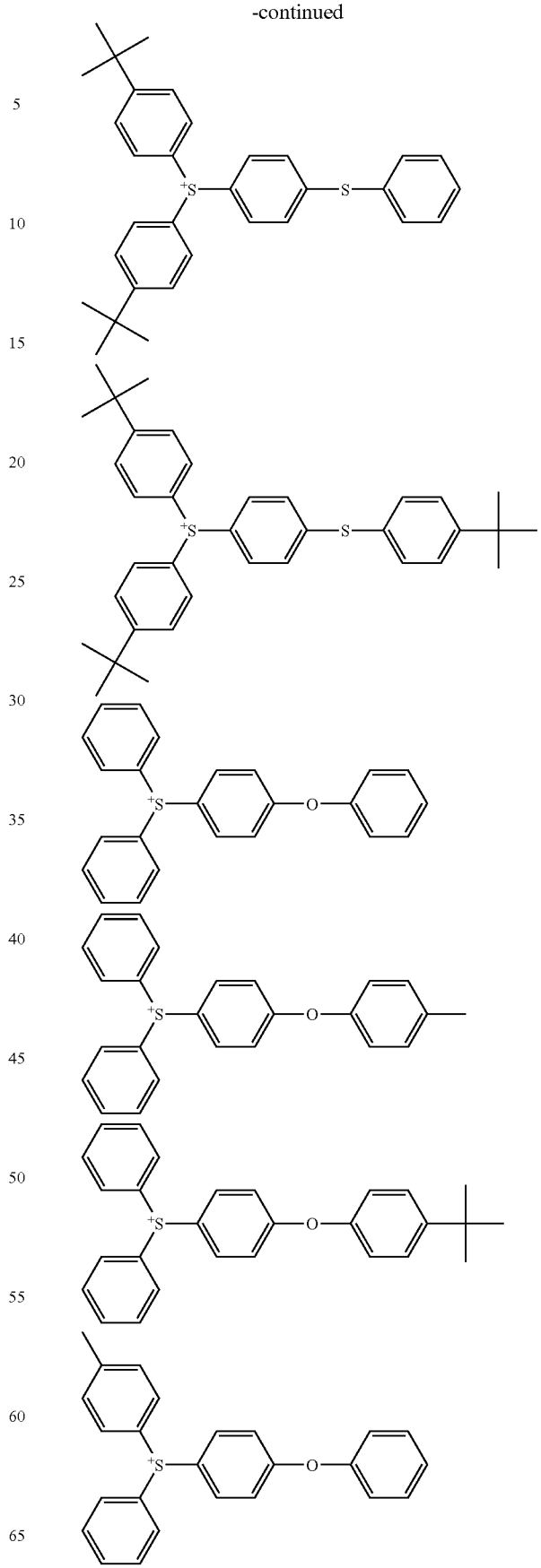

119
-continued
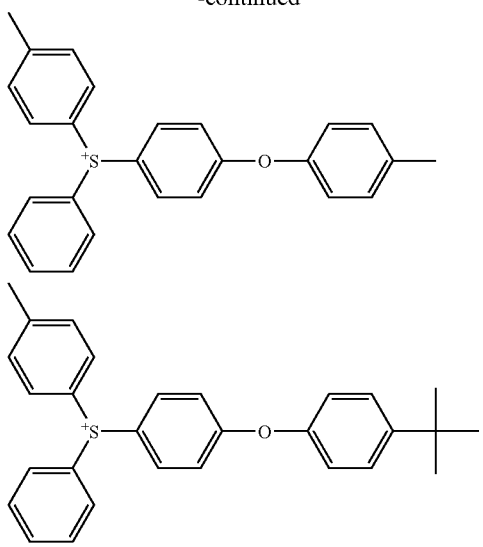
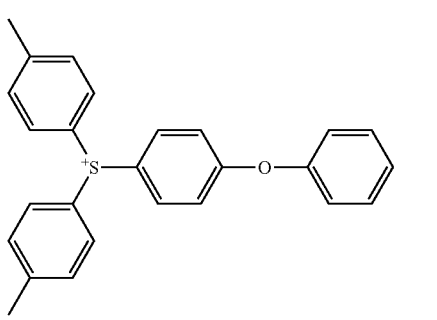
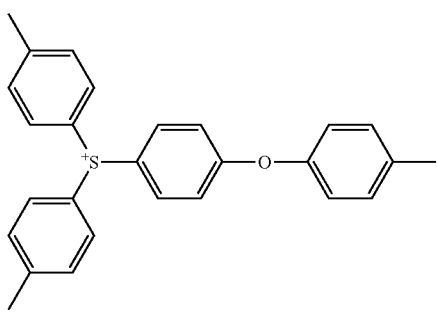
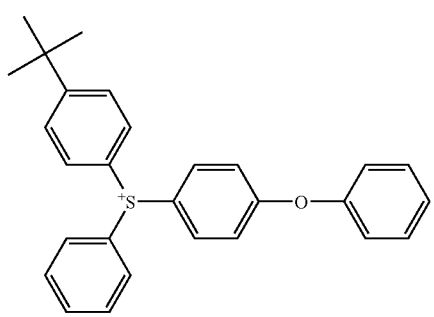
120
-continued
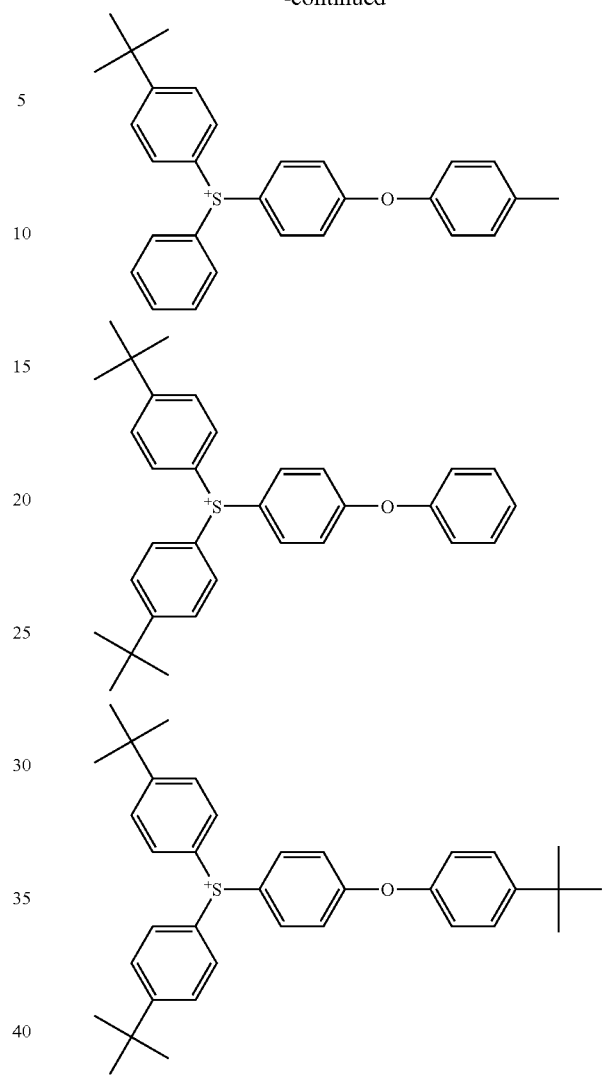
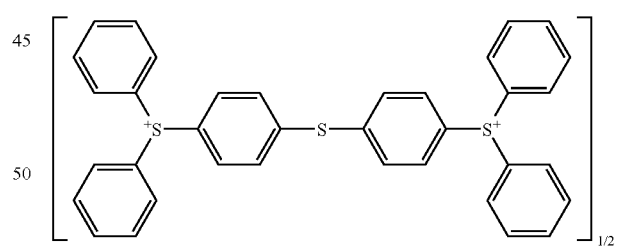
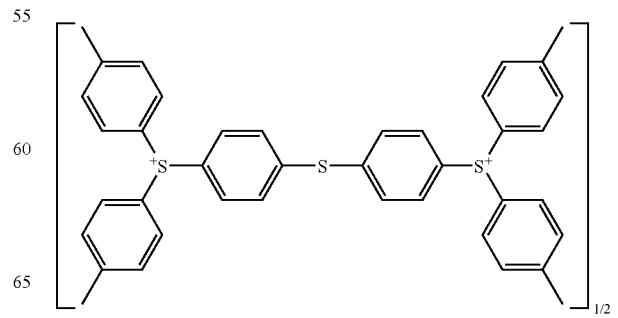

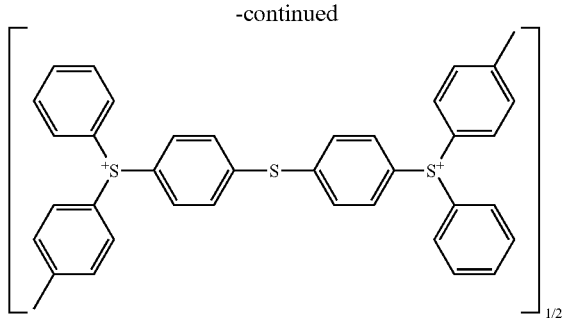
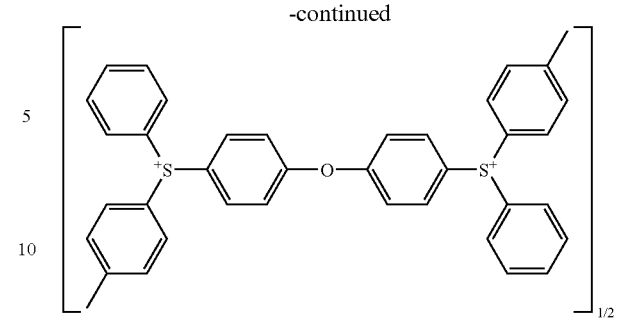
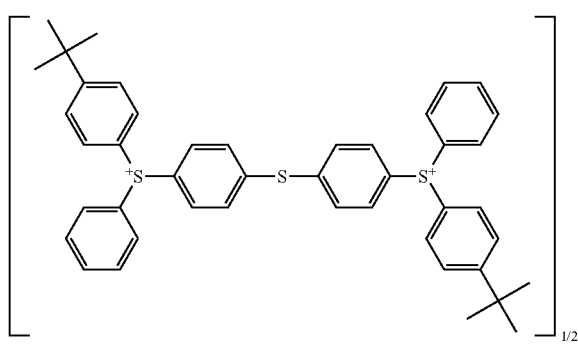
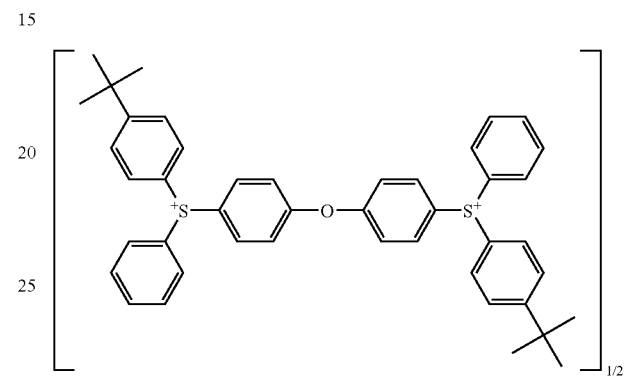
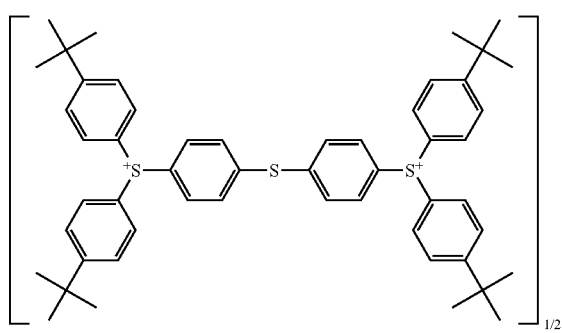
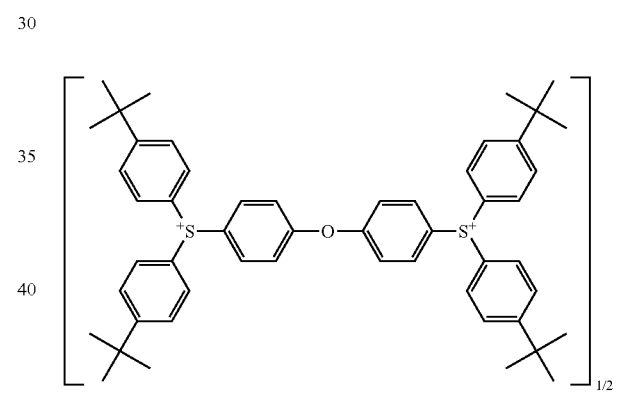
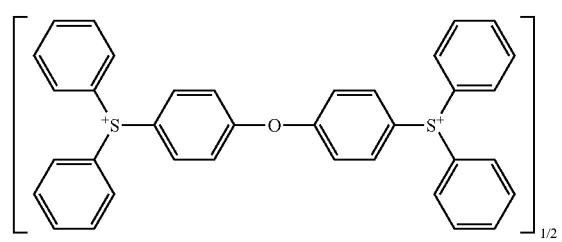
As the organic counter ion, the cation represented by the formula (IXe) is preferable.
The salt may be used alone or a mixture of two or more thereof may be used.
As the acid generator, a salt represented by the formula (Xa), (Xb) or (Xc) is preferred for the excellent resolution and pattern profile.
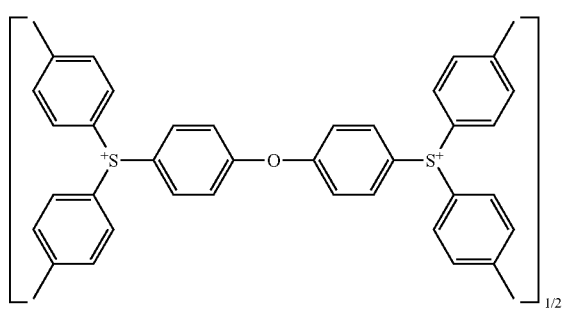
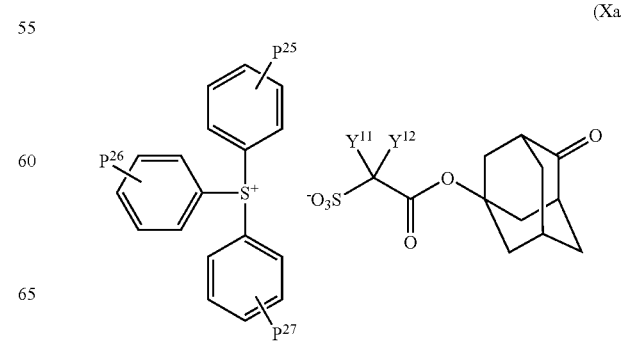
(Xa)

(Xb)

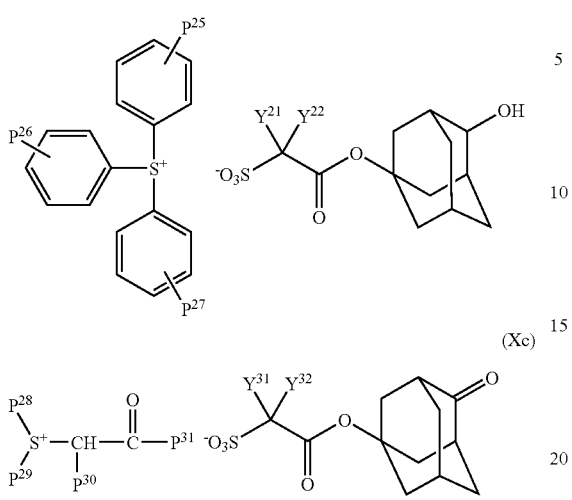

(Xc)

wherein P$^{25}$, P$^{26}$ and P$^{27}$ each independently represents a hydrogen atom or a C1-C4 alkyl group, P$^{28}$ and P$^{29}$ each independently represents a C1-C12 alkyl group or a C3-C12 cycloalkyl group, or P$^{28}$ and P$^{29}$ are bonded to form a C3-C12 divalent hydrocarbon group which forms a ring together with the adjacent S$^+$, P$^{30}$ represents a hydrogen atom, P$^{31}$ represents a C1-C12 alkyl group, a C3-C12 cycloalkyl group or an aromatic group optionally substituted, or P$^{30}$ and P$^{31}$ are bonded to form a C3-C12 divalent hydrocarbon group which forms a 2-oxocycloalkyl group together with the adjacent —CHCO—, and at least one —CH$_2$— in the C3-C12 divalent hydrocarbon group may be replaced with —CO—, —O— or —S—, Y$^{21}$, Y$^{22}$, Y$^{31}$ and Y$^{32}$ each independently represents a fluorine atom or a C1-C6 perfluoroalkyl group.

The acid generator can be produced according to known methods such as JP 2007-249192 A.

In the present resist composition, performance deterioration caused by inactivation of acid which occurs due to post exposure delay can be diminished by adding an organic base compound, particularly a nitrogen-containing organic base compound as a quencher.

Specific examples of the nitrogen-containing organic base compound include an amine compound represented by the following formulae:

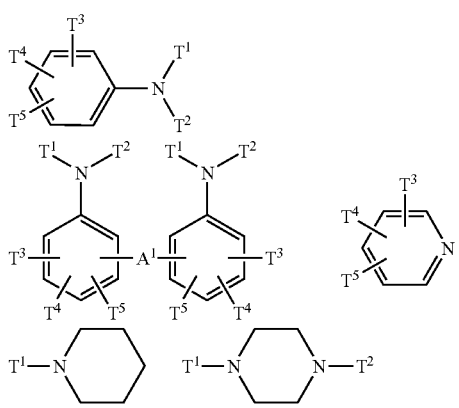

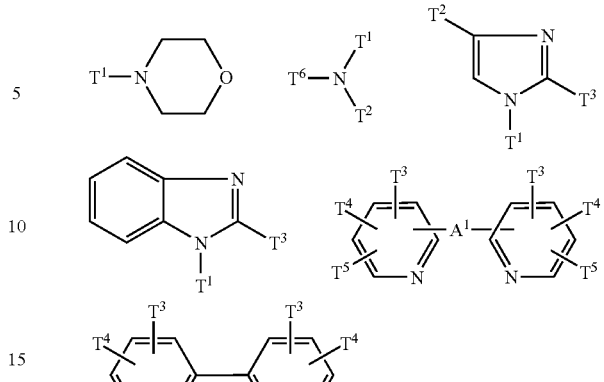

wherein T$^1$ and T$^2$ independently represent a hydrogen atom, an alkyl group, a cycloalkyl group or an aryl group, and the alkyl, cycloalkyl and aryl groups are optionally substituted with at least one group selected from the group consisting of a hydroxyl group, an amino group which is optionally substituted with a C1-C4 alkyl group and a C1-C6 alkoxy group which is optionally substituted with a C1-C6 alkoxy group, T$^3$ and T$^4$ independently represent a hydrogen atom, an alkyl group, a cycloalkyl group, an aryl group or an alkoxy group, and the alkyl, cycloalkyl, aryl and alkoxy groups are optionally substituted with at least one group selected from the group consisting of a hydroxyl group, an amino group which is optionally substituted with a C1-C4 alkyl group and a C1-C6 alkoxy group, or T$^3$ and T$^4$ bond together with the carbon atoms to which they bond to form an aromatic ring, T$^5$ represent a hydrogen atom, an alkyl group, a cycloalkyl group, an aryl group, an alkoxy group or a nitro group, and the alkyl, cycloalkyl, aryl and alkoxy groups are optionally substituted with at least one group selected from the group consisting of a hydroxyl group, an amino group which is optionally substituted with a C1-C4 alkyl group and a C1-C6 alkoxy group, T$^6$ represents an alkyl or cycloalkyl group, and the alkyl and cycloalkyl groups are optionally substituted with at least one group selected from the group consisting of a hydroxyl group, an amino group which is optionally substituted with a C1-C4 alkyl group and a C1-C6 alkoxy group, and A$^1$ represents —CO—, —NH—, —S—, —S—S—, an alkylene group of which at least one methylene group is optionally replaced with —O—, or an alkenylene group of which at least one methylene group is optionally replaced with —O—, and a quaternary ammonium hydroxide represented by the following formula:

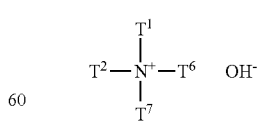

wherein T$^1$, T$^2$ and T$^6$ are the same as defined above, and T$^7$ represents a hydrogen atom, an alkyl group, a cycloalkyl group or an aryl group, and the alkyl and cycloalkyl groups are optionally substituted with at least one group selected from the group consisting of a hydroxyl group, an amino group which is optionally substituted with a C1-C4 alkyl group and a C1-C6 alkoxy group, and the aryl group is optionally substituted with at least one group selected from the group consisting of a hydroxyl group, an amino group which is optionally substituted with a C1-C4 alkyl group, a C1-C6 alkoxy group and a C1-C4 perfluoroalkyl group.

The alkyl group in $T^1$, $T^2$, $T^3$, $T^4$, $T^5$, $T^6$ and $T^7$ preferably has about 1 to 10 carbon atoms, and more preferably has about 1 to 6 carbon atoms.

Examples of the amino group which is optionally substituted with the C1-C4 alkyl group include an amino group, a methylamino group, an ethylamino group, an n-butylamino group, a dimethylamino group and a diethylamino group. Examples of the C1-C6 alkoxy group which is optionally substituted with the C1-C6 alkoxy group include a methoxy group, an ethoxy group, an n-propoxy group, an isopropoxy group, an n-butoxy group, a tert-butoxy group, an n-pentyloxy group, an n-hexyloxy group and a 2-methoxyethoxy group.

Specific examples of the alkyl group which is optionally substituted with at least one group selected from the group consisting of a hydroxyl group, an amino group which is optionally substituted with a C1-C4 alkyl group, and a C1-C6 alkoxy group which is optionally substituted with a C1-C6 alkoxy group include a methyl group, an ethyl group, an n-propyl group, an isopropyl group, an n-butyl group, a tert-butyl group, an n-pentyl group, an n-hexyl group, an n-octyl group, an n-nonyl group, an n-decyl group, a 2-(2-methoxyethoxy)ethyl group, a 2-hydroxyethyl group, a 2-hydroxypropyl group, a 2-aminoethyl group, a 4-aminobutyl group and a 6-aminohexyl group.

The cycloalkyl group in $T^1$, $T^2$, $T^3$, $T^4$, $T^5$, $T^6$ and $T^7$ preferably has about 5 to 10 carbon atoms. Specific examples of the cycloalkyl group which is optionally substituted with at least one group selected from the group consisting of a hydroxyl group, an amino group which is optionally substituted with a C1-C4 alkyl group and a C1-C6 alkoxy group include a cyclopentyl group, a cyclohexyl group, a cycloheptyl group and a cyclooctyl group.

The aryl group in $T^1$, $T^2$, $T^3$, $T^4$ and $T^5$ preferably has about 6 to 10 carbon atoms. Specific examples of the aryl group which is optionally substituted with at least one group selected from the group consisting of a hydroxyl group, an amino group which is optionally substituted with a C1-C4 alkyl group and a C1-C6 alkoxy group include a phenyl group and a naphthyl group.

The aryl group in $T^7$ preferably has about 6 to 10 carbon atoms. Specific examples of the aryl group which is optionally substituted with at least one group selected from the group consisting of a hydroxyl group, an amino group which is optionally substituted with a C1-C4 alkyl group, a C1-C6 alkoxy group and a C1-C4 perfluoroalkyl group include a phenyl group, a naphthyl group and a 3-trifluoromethylphenyl group.

The alkoxy group in $T^3$, $T^4$ and $T^5$ preferably has about 1 to 6 carbon atoms and specific examples thereof include a methoxy group, an ethoxy group, an n-propoxy group, an isopropoxy group, an n-butoxy group, a tert-butoxy group, an n-pentyloxy group, an n-hexyloxy group.

The alkylene and alkenylene groups in $A^1$ preferably have 2 to 6 carbon atoms. Specific examples of the alkylene group include an ethylene group, a trimethylene group, a tetramethylene group, a methylenedioxy group and an ethylene-1,2-dioxy group, and specific examples of the alkenylene group include an ethene-1,2-diyl group, a 1-propene-1,3-diyl group and a 2-butene-1,4-diyl group.

Specific examples of the amine compound include n-hexylamine, n-heptylamine, n-octylamine, n-nonylamine, n-decylamine, aniline, 2-methylaniline, 3-methylaniline, 4-methylaniline, 4-nitroaniline, 1-naphthylamine, 2-naphthylamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-dimethyldiphenylmethane, dibutylamine, dipentylamine, dihexylamine, diheptylamine, dioctylamine, dinonylamine, didecylamine, N-methylaniline, piperidine, diphenylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecyamine, dicyclohexylmethylamine, tris[2-(2-methoxyethoxy)ethyl]amine, triisopuropanolamine, N,N-dimethylaniline, 2,6-diisopropylaniline, imidazole, benzimidazole, pyridine, 4-methylpyridine, 4-methylimidazole, bipyridine, 2,2'-dipyridylamine, di-2-pyridyl ketone, 1,2-di(2-pyridyl)ethane, 1,2-di(4-pyridyl)ethane, 1,3-di(4-pyridyl)propane, 1,2-bis(2-pyridyl)ethylene, 1,2-bis(4-pyridyl)ethylene, 1,2-bis(4-pyridyloxy)ethane, 4,4'-dipyridyl sulfide, 4,4'-dipyridyl disulfide, 1,2-bis(4-pyridyl)ethylene, 2,2'-dipicolylamine and 3,3'-dipicolylamine.

Examples of the quaternary ammonium hydroxide include tetramethylammonium hydroxide, tetrabutylammonium hydroxide, tetrahexylammonium hydroxide, tetraoctylammonium hydroxide, phenyltrimethylammonium hydroxide, (3-trifluoromethylphenyl)trimethylammonium hydroxide and (2-hydroxyethyl)trimethylammonium hydroxide (so-called "choline").

A hindered amine compound having a piperidine skelton as disclosed in JP 11-52575 A1 can be also used as the quencher.

In the point of forming patterns having higher resolution, the quaternary ammonium hydroxide is preferably used as the quencher.

The present resist composition preferably includes 0.01 to 1% by weight of the quencher based on the total solid content of the present composition. In the present invention, the total solid content means total content exclusive of solvents.

The present resist composition can contain, if necessary, a small amount of various additives such as a sensitizer, a solution suppressing agent, other polymers, a surfactant, a stabilizer and a dye as long as the effect of the present invention is not prevented.

The present resist composition is usually in the form of a resist liquid composition in which the above-mentioned ingredients are dissolved in a solvent and the resist liquid composition is applied onto a substrate such as a silicon wafer by a conventional process such as spin coating. The solvent used is sufficient to dissolve the above-mentioned ingredients, have an adequate drying rate, and give a uniform and smooth coat after evaporation of the solvent. Solvents generally used in the art can be used.

Examples of the solvent include a glycol ether ester such as ethyl cellosolve acetate, methyl cellosolve acetate and propylene glycol monomethyl ether acetate; an acyclic ester such as ethyl lactate, butyl acetate, amyl acetate and ethyl pyruvate; a ketone such as acetone, methyl isobutyl ketone, 2-heptanone and cyclohexanone; and a cyclic ester such as γ-butyrolactone. These solvents may be used alone and two or more thereof may be mixed to use.

A resist film applied onto the substrate and then dried is subjected to exposure for patterning, then heat-treated to facilitate a deblocking reaction, and thereafter developed with an alkali developer. The alkali developer used may be any one of various alkaline aqueous solution used in the art. Generally, an aqueous solution of tetramethylammonium hydroxide or (2-hydroxyethyl)trimethylammonium hydroxide (commonly known as "choline") is often used.

It should be construed that embodiments disclosed here are examples in all aspects and not restrictive. It is intended that the scope of the present invention is determined not by the above descriptions but by appended Claims, and includes all variations of the equivalent meanings and ranges to the Claims.

The present invention will be described more specifically by Examples, which are not construed to limit the scope of the present invention. The "%" and "part(s)" used to represent the content of any component and the amount of any material to be used in the following Examples are on a weight basis unless otherwise specifically noted. The weight-average molecular weight of any material in the following Examples is a value found by gel permeation chromatography [Column (three columns+guard column): TSKgel Multipore $H_{XL}$-M manufactured by TOSOH CORPORATION, and Solvent: tetrahydrofuran, Flow rate: 1.0 mm/min., Detector: RI Detector, Column Temperature: 40° C., Injection volume: 100 µl] using polystyrene manufactured by TOSOH CORPORATION as a standard reference material.

Monomers used in Examples are following monomers A to G:

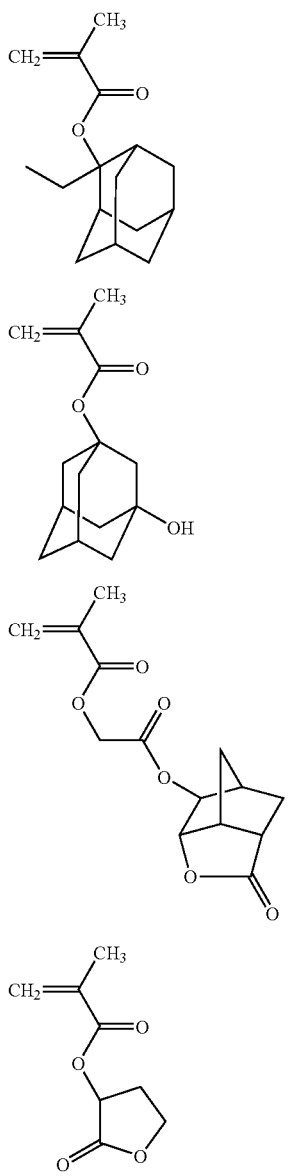

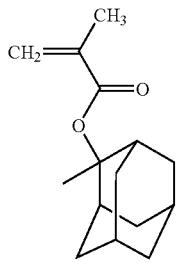

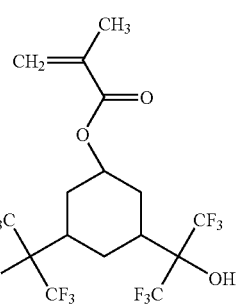

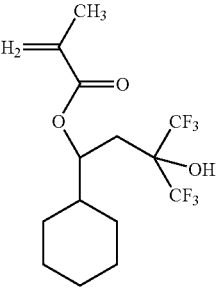

Resin Synthesis Example 1

Synthesis of Resin A1

Fifteen parts of monomer A, 4.89 parts of monomer B, 11.12 parts of monomer C, 8.81 parts of monomer D and 1.5 times amount of 1,4-dioxane as much as the amount of all monomers (monomer ratio; monomer A: monomer B: monomer C: monomer D=35:12:23:30) were mixed to prepare a solution. To the obtained solution, 2,2'-azobisisobutyronitrile was added as an initiator in a ratio of 1 mol % based on all monomer molar amount and 2,2'-azobis(2,4-dimethylvaleronitrile) was added as an initiator in a ratio of 3 mol % based on all monomer molar amount, and the resultant mixture was heated at 77° C. for about 5 hours. The reaction mixture was cooled and poured into a mixed solution of excess amount of methanol and water. The precipitated resin was isolated by filtration. The obtained resin was added into a mixed solution of excess amount of methanol and water, and then the resin was isolated by filtration. This operation was repeated to obtain a resin having a weight-average molecular weight (Mw) of about 8,100 in a yield of 78%.

This resin had the following structural units. This is called as resin A1.

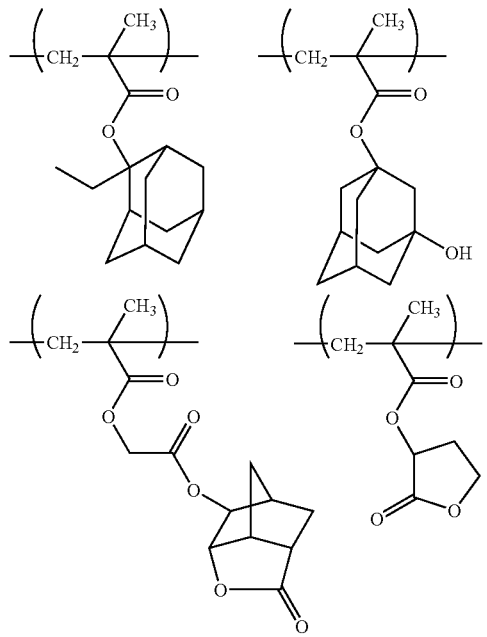

Resin Synthesis Example 2

Synthesis of Resin A2

Five point two parts of monomer E, 2.62 parts of monomer B, 10.37 parts of monomer C and 2.6 times amount of 1,4-dioxane as much as the amount of all monomers (monomer ratio; monomer E: monomer B: monomer C=50:25:25) were mixed to prepare a solution. To the obtained solution, 2,2'-azobisisobutyronitrile was added as an initiator in a ratio of 3 mol % based on all monomer molar amount, and the resultant mixture was heated at 87° C. for about 5 hours. The reaction mixture was cooled and poured into a mixed solution of excess amount of methanol and water. The precipitated resin was isolated by filtration. The obtained resin was added into a mixed solution of excess amount of methanol and water, and then the resin was isolated by filtration. This operation was repeated to obtain a resin having a weight-average molecular weight (Mw) of about 10,600 in a yield of 81%.

This resin had the following structural units. This is called as resin A2.

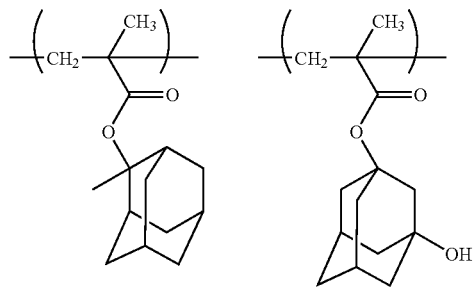

-continued

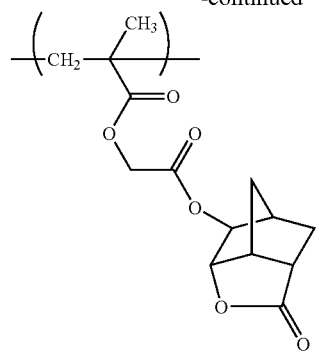

Resin Synthesis Example 3

Synthesis of Resin B1

Fifty parts of monomer F and 2 times amount of 1,4-dioxane as much as the amount of monomer F were mixed to prepare a solution. To the obtained solution, 2,2'-azobisisobutyronitrile was added as an initiator in a ratio of 3 mol % based on all monomer molar amount and 2,2'-azobis(2,4-dimethylvaleronitrile) was added as an initiator in a ratio of 9 mol % based on all monomer molar amount. The resultant mixture was heated at 75° C. for about 5 hours. The reaction mixture was cooled and poured into a large amount of hexane. The precipitated resin was isolated by filtration. The obtained resin was added into a large amount of hexane, and then the resin was isolated by filtration. This operation was repeated to obtain a resin having a weight-average molecular weight (Mw) of about 8,300 in a yield of 86%.

This resin had the following structural unit. This is called as resin B1.

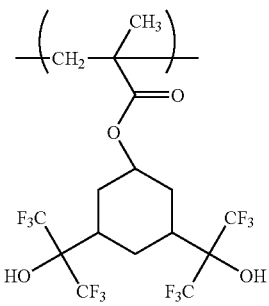

Resin Synthesis Example 4

Synthesis of Resin B2

Twenty parts of monomer F, 9.66 parts of monomer G and 2 times amount of 1,4-dioxane as much as the amount of all monomers (monomer ratio; monomer F: monomer G=60:40) were mixed to prepare a solution. To the obtained solution, 2,2'-azobisisobutyronitrile was added as an initiator in a ratio of 1 mol % based on all monomer molar amount and 2,2'-azobis(2,4-dimethylvaleronitrile) was added as an initiator in a ratio of 3 mol % based on all monomer molar amount. The resultant mixture was heated at 73° C. for about 5 hours. The reaction mixture was cooled and poured into a large amount of hexane. The precipitated resin was isolated by filtration. The obtained resin was added into a large amount of hexane, and then the resin was isolated by filtration. This operation was repeated to obtain a resin having a weight-average molecular weight (Mw) of about 15,400 in a yield of 87%.

This resin had the following structural unit. This is called as resin B2.

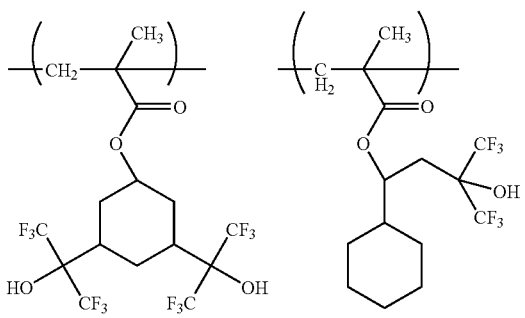

Resin Synthesis Example 5

Synthesis of Resin B3

Five point six parts of monomer C, 35.0 parts of monomer F, 3.62 parts of monomer G and 1.5 times amount of 1,4-dioxane as much as the amount of all monomers (monomer ratio; monomer C: monomer F: monomer G=20:70:10) were mixed to prepare a solution. To the obtained solution, 2,2'-azobisisobutyronitrile was added as an initiator in a ratio of 0.85 mol % based on all monomer molar amount and 2,2'-azobis(2,4-dimethylvaleronitrile) was added as an initiator in a ratio of 2.55 mol % based on all monomer molar amount. The resultant mixture was heated at 73° C. for about 5 hours. The reaction mixture was cooled and poured into a large amount of hexane. The precipitated resin was isolated by filtration. The obtained resin was added into a large amount of hexane, and then the resin was isolated by filtration. This operation was repeated to obtain a resin having a weight-average molecular weight (Mw) of about 31,200 in a yield of 84%.

This resin had the following structural unit. This is called as resin B3.

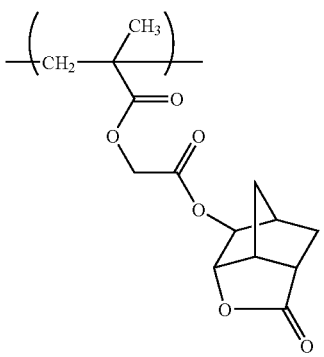

-continued

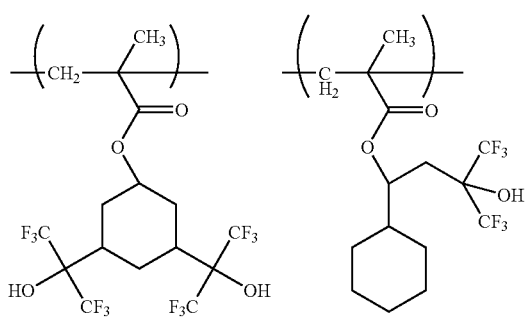

<Resin>

A1, A2, B1, B2, B3

<Acid Generator>

Acid Generator C1:

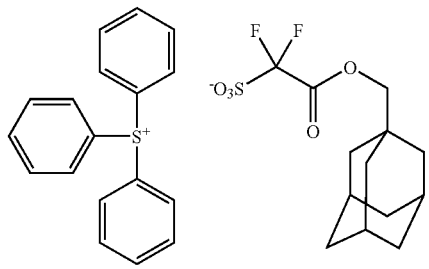

Acid Generator C2:

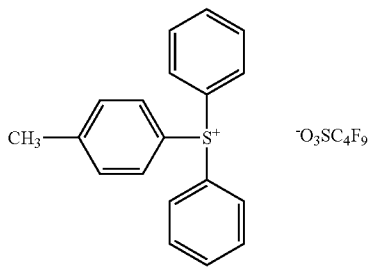

<Solvent>

| Solvent S1: | propylene glycol monomethyl ether acetate | 140 parts |
| --- | --- | --- |
| | propylene glycol monomethyl ether | 20 parts |
| | 2-heptanone | 35 parts |
| | γ-butyrolactone | 3 parts |

Examples 1 to 6

The following components were mixed to give a solution, and the solution was further filtrated through a fluorine resin filter having a pore diameter of 0.2 μm, to prepare resist liquid.

Resins (kind and amount are described in Table 1)
Acid generator (kind and amount are described in Table 1)
Quencher (kind and amount are described in Table 1)
Solvent (kind are described in Table 1)

TABLE 1

| Ex. No. | Resin A (kind/amount (part)) | Resin B (kind/amount (part)) | Acid generator (kind/amount (part)) | Solvent |
|---|---|---|---|---|
| Ex. 1 | A1/10 | B1/1 | C1/0.3 | S1 |
| Ex. 2 | A1/10 | B1/0.1 | C1/0.3 | S1 |
| Ex. 3 | A1/10 | B2/1 | C1/0.3 | S1 |
| Ex. 4 | A1/10 | B3/1 | C1/0.3 | S1 |
| Ex. 5 | A2/10 | B1/0.1 | C1/0.3 | S1 |
| Ex. 6 | A1/10 | B1/1 | C2/0.3 | S1 |

Each of the resist liquids prepared in Examples 1 to 6 was spin-coated over the silicon wafer to give a film thickness after drying of 0.15 μm. After application of each of the resist liquids, the silicon wafers thus coated with the respective resist liquids were each prebaked on a direct hotplate at 100° C. for 60 seconds. After completion of prebaking, film thickness of the resist film on the wafer ($D_1$) was measured with film thickness meter (VM-3100, manufactured by Dainippon Screen MFG. CO., LTD.). After completion of measurement, each wafer was subjected to post-exposure baking on a hotplate at 105° C. for 60 seconds and then to paddle development with an aqueous solution of 2.38% by weight tetramethylammonium hydroxide. After completion of development, film thickness of the resist film on the wafer ($D_2$) was measured with film thickness meter (VM-3100, manufactured by Dainippon Screen MFG. CO., LTD.).

Rate of change of film thickness was calculated according to the following:

Rate of change of film thickness(%)=$D_2/D_1$×100

The results are shown in Table 2.

TABLE 2

| Ex. No. | Rate of change of film thickness |
|---|---|
| Ex. 1 | 97.3 |
| Ex. 2 | 99.2 |
| Ex. 3 | 98.1 |
| Ex. 4 | 98.2 |
| Ex. 5 | 99.3 |
| Ex. 6 | 96.8 |

Example 7

The resist liquids are prepared by adding 2,6-diisopropylaniline as quencher to each of resist liquids prepared in Examples 1 to 6.

Silicon wafers are each coated with an organic anti-reflective coating composition and then baked to form an organic anti-reflective coating. Each of the resist liquids prepared above is spin-coated over the anti-reflective coating. The silicon wafers thus coated with the respective resist liquids are each prebaked on a direct hotplate. Using an ArF excimer stepper, each wafer thus formed with the respective resist film is subjected to line and space pattern exposure with mask having 1:1 line and space pattern.

After the exposure, each wafer is subjected to post-exposure baking on a hotplate and then to paddle development with an aqueous solution of 2.38 wt % tetramethylammonium hydroxide.

Thus, a resist pattern developed on the organic anti-reflective coating substrate after the development is obtained.

The present resist composition provides a resist film having good homogeneous film surface since the rate of change of film thickness is close to 100%, and therefore, the suppression of formation of defect can be expected by using the present resist composition. The present composition is especially suitable for ArF excimer laser lithography process, KrF excimer laser lithography process and ArF immersion lithography process.

What is claimed is:

1. A chemically amplified positive resist composition comprising: a resin (A) which itself is insoluble in an aqueous alkali solution but becomes soluble in an aqueous alkali solution by the action of an acid and which comprises a structural unit having an acid-labile group in a side chain and a structural unit represented by the formula (I):

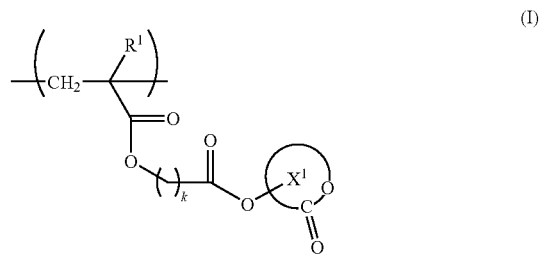

(I)

wherein $R^1$ represents a hydrogen atom or a methyl group, ring $X^1$ represents an unsubstituted or substituted C3-C30 cyclic hydrocarbon group having —COO— and k represents an integer of 1 to 4, a resin (B) which consists of a structural unit represented by the formula (II):

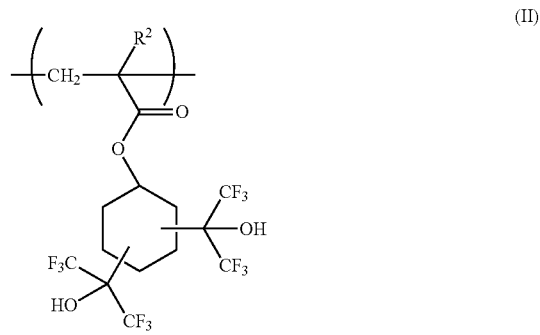

(II)

wherein $R^2$ represents a hydrogen atom, a methyl group or a trifluoromethyl group, and an acid generator.

2. The chemically amplified positive resist composition according to claim 1, wherein the amount of the resin (B) is 0.1 to 20 parts by weight relative to 100 parts by weight of the resin (A).

3. The chemically amplified positive resist composition according to claim 1, wherein the acid generator is a salt represented by the formula (V):

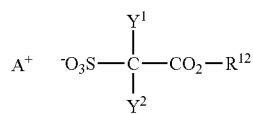 (V)

wherein $R^{12}$ represents a C1-C30 hydrocarbon group which is unsubstituted or substituted with at least one group consisting of a C1-C6 alkoxy group, a C1-C4 perfluoroalkyl group, a C1-C6 hydroxyalkyl group, a hydroxyl group and a cyano group, and at least one methylene group is not replaced or is replaced by —CO— or —O—, $A^+$ represents an organic counter ion, and $Y^1$ and $Y^2$ each independently represents a fluorine atom or a C1-C6 perfluoroalkyl group.

* * * * *